United States Patent
Sakui et al.

(10) Patent No.: US 7,333,369 B2
(45) Date of Patent: Feb. 19, 2008

(54) NONVOLATILE SEMICONDUCTOR MEMORY

(75) Inventors: Koji Sakui, Tokyo (JP); Junichi Miyamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/671,196

(22) Filed: Feb. 5, 2007

(65) Prior Publication Data

US 2007/0133283 A1 Jun. 14, 2007

Related U.S. Application Data

(60) Division of application No. 10/929,014, filed on Aug. 30, 2004, now Pat. No. 7,173,850, which is a continuation of application No. 10/638,406, filed on Aug. 12, 2003, now Pat. No. 6,801,458, which is a division of application No. 10/202,886, filed on Jul. 26, 2002, now Pat. No. 6,657,892, which is a continuation of application No. 09/921,570, filed on Aug. 6, 2001, now Pat. No. 6,512,703, which is a division of application No. 09/393,201, filed on Sep. 9, 1999, now Pat. No. 6,307,807.

(30) Foreign Application Priority Data

Sep. 10, 1998 (JP) .................................. 10-256738
Jan. 19, 1999 (JP) .................................. 11-010676

(51) Int. Cl.
*G11C 11/34* (2006.01)
(52) U.S. Cl. .............................. 365/185.28; 365/185.14
(58) Field of Classification Search ........... 365/185.28, 365/185.14, 185.18, 185.24
See application file for complete search history.

(56) References Cited

U.S. PATENT DOCUMENTS 4,636,984 A    1/1987    Neukomm
(Continued)

FOREIGN PATENT DOCUMENTS

| EP | 0440265 A | 8/1991 |
|----|-----------|--------|
| EP | 0704852 A2 | 4/1996 |
| EP | 0797212 A2 | 9/1997 |
| JP | 1-098194 | 4/1989 |
| JP | 2-232898 A | 9/1990 |
| JP | 4-103095 | 4/1992 |
| JP | 7-230695 | 8/1995 |
| JP | 10-500801 T | 1/1998 |
| JP | 10-079197 | 3/1998 |
| JP | 10-177797 A | 6/1998 |
| JP | 10-188580 | 7/1998 |
| JP | 10-209406 | 8/1998 |
| JP | 11-195718 | 7/1999 |
| WO | 96-029704 | 9/1996 |

OTHER PUBLICATIONS

"Session XII: ROMs, PROMs and EROMs THPM 12.6:A 16Kb Electrically Erasable Nonvolatile Memory", William S. Johnson, et al. ISSCC 80/1980, IEEE International Solid-State Circuits Conference, CH 1490-2/80/0000/0152, pp. 152-153, Feb. 14, 1980.

(Continued)

*Primary Examiner*—Anh Phung
(74) *Attorney, Agent, or Firm*—Banner & Witcoff, Ltd.

(57) ABSTRACT

A memory cell array has a unit formed from one memory cell and two select transistors sandwiching the memory cell. One block has one control gate line. Memory cells connected to one control gate line form one page. A sense amplifier having a latch function is connected to a bit line. In a data change operation, data of memory cells of one page are read to the sense amplifiers. After data are superscribed on data in the sense amplifiers, and a page erase is performed, data in the sense amplifiers are programmed in the memory cells of one page. Superscription of data in the sense amplifiers allows a data change operation for byte data or page data.

4 Claims, 56 Drawing Sheets

U.S. PATENT DOCUMENTS

| | | | |
|---|---|---|---|
| 4,996,669 | A | 2/1991 | Endoh et al. |
| 5,043,942 | A | 8/1991 | Iwata et al. |
| 5,379,254 | A | 1/1995 | Chang |
| 5,412,603 | A * | 5/1995 | Schreck et al. ........ 365/189.01 |
| 5,515,327 | A | 5/1996 | Matsukawa et al. |
| 5,523,980 | A | 6/1996 | Sakui et al. |
| 5,541,879 | A | 7/1996 | Suh et al. |
| 5,557,124 | A | 9/1996 | Roy et al. |
| 5,559,735 | A | 9/1996 | Ono et al. |
| 5,568,420 | A | 10/1996 | Lim et al. |
| 5,592,001 | A | 1/1997 | Asano |
| 5,592,415 | A | 1/1997 | Kato et al. |
| 5,606,527 | A | 2/1997 | Kwack et al. |
| 5,615,152 | A | 3/1997 | Bergamont |
| 5,615,163 | A | 3/1997 | Sakui et al. |
| 5,680,346 | A | 10/1997 | Pathak et al. |
| 5,732,018 | A | 3/1998 | Choi et al. |
| 5,740,107 | A | 4/1998 | Lee |
| 5,754,469 | A | 5/1998 | Hung et al. |
| 5,777,925 | A | 7/1998 | Tokushige |
| 5,841,721 | A | 11/1998 | Kwon et al. |
| 5,963,476 | A | 10/1999 | Hung et al. |
| 5,966,601 | A | 10/1999 | Ling et al. |
| 6,014,328 | A | 1/2000 | Onakado et al. |
| 6,044,017 | A | 3/2000 | Lee et al. |
| 6,055,188 | A | 4/2000 | Takeuchi et al. |
| 6,061,270 | A * | 5/2000 | Choi ..................... 365/185.02 |
| 6,172,905 | B1 | 1/2001 | White et al. |
| 6,175,522 | B1 | 1/2001 | Fang |
| 7,035,143 | B2 | 4/2006 | Lee |
| 7,227,782 | B2 | 6/2007 | Lee et al. |
| 2006/0239069 | A1* | 10/2006 | Kamigaichi et al. ... 365/185.01 |
| 2006/0274579 | A1* | 12/2006 | Ha et al. ............... 365/185.18 |

OTHER PUBLICATIONS

"A New Flash E2Prom Cell Using Triple Polysilicon Technology", Fujio Masuoka, et al., 464-467—IEDM 84, CH2099-0/84/0000-0464; 17.3 (1984).

"New Ultra High Density EDPROM And Flash EEPROM With NAND Structure Cell", Fujio Masuoka, et al., CH2515-5/87/0000-0552 1987 IEEE, IEDM 87 pp. 552-555, May 1987.

Chapter 1 Basics of Nonvolatile Semiconductor Memory Devices, p. 70; Chapter 4 Floating Gate Flash Memories, p. 212; Chapter 5 SONOS Nonvolatile Semiconductor Memories, p. 316; p. 326, 5.1 The SONOS Nonvolatile Memory Transistor, p. 327: Chapter 5 SONOS Nonvolatile Semiconductor Memories, p. 344, (Undated).

European Search Report dated Sep. 22, 2000.

Art Lancaster et al., ISSCC Dig. Tech. Papers, "Nonvolatile Memory," Feb. 1983, pp. 164-165.

Yoshiaki Kamigaki et al., IEEE J. of Solid-State Circuits, vol. 24, No. 6, "Yield and Reliability of MNOS EEPROM Products," Dec. 1989, pp. 1714-1722.

Atsushi Nozoe et al., ISSCC99/Session 6/Paper MP6.5, "A 256 Mb Multilevel Flash Memory with 2MB/s Program Rate for Mass Storage Applications," pp. 1-6.

Takeuchi, Ken, et al., "A Double-Level-Vth Select Gate Array Architecture for Multilevel NAND Flash Memories," IEICE Trans. Electron., vol. E79-C, No. 7, Jul. 1, 1996, pp. 1013-1020.

Choi, J.D., et al., "A New Double Boosting Program Scheme in Booster Plate NAND Flash Memories with 9V Programming," Non-Volatile Semiconductor Memory Workshop, Aug. 1998, pp. 109-111.

EP Search Report dated Dec. 17, 2003, EP appln. No. 99117469.9.

JP Office Action mailed Mar. 14, 2006, JP appln. No. 11-010676.

* cited by examiner

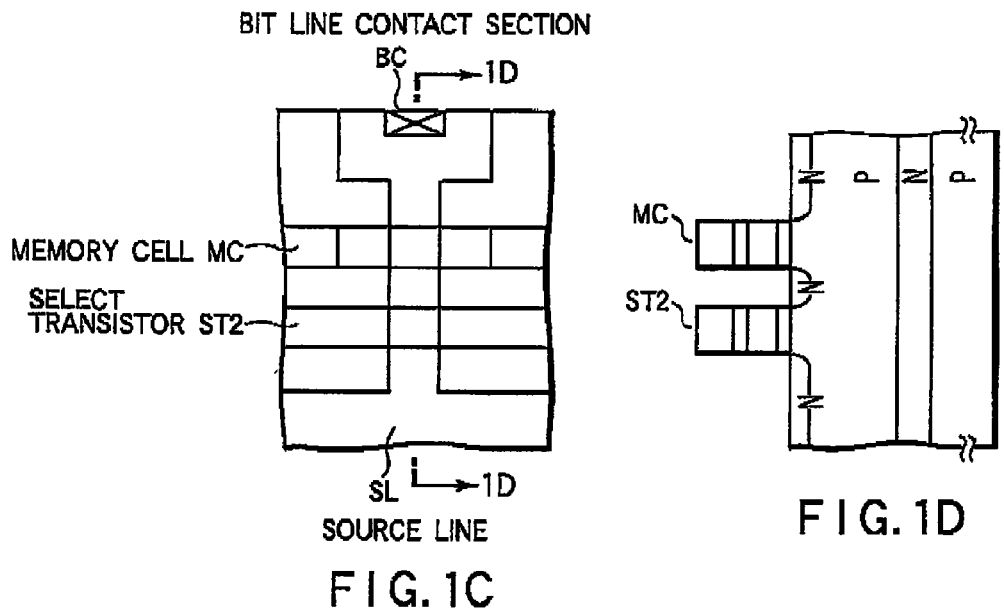
FIG. 1C
FIG. 1D
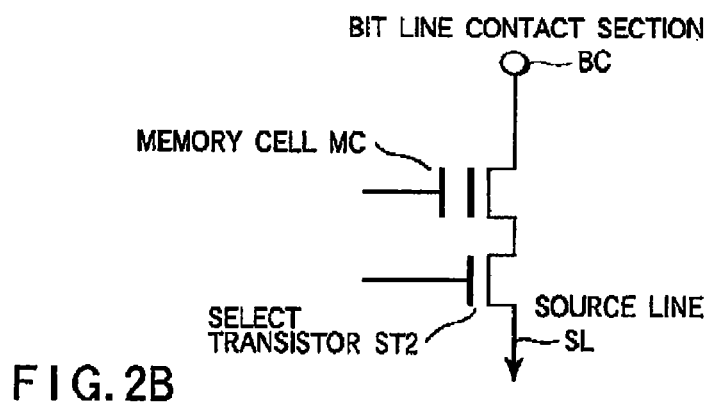
FIG. 2B

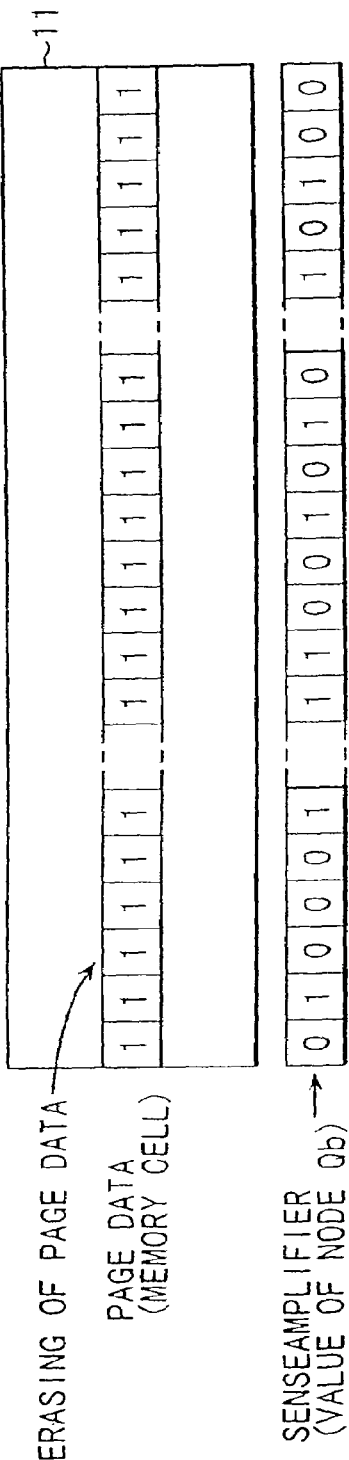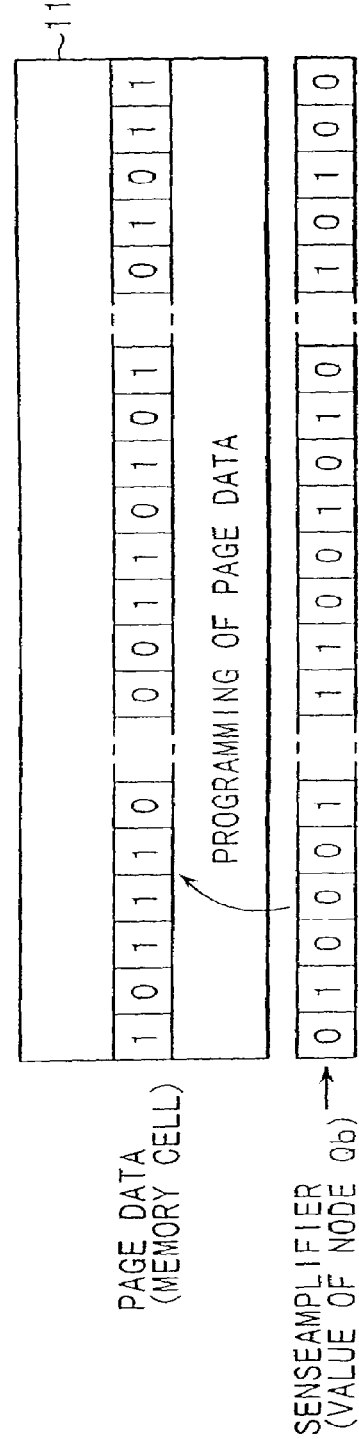

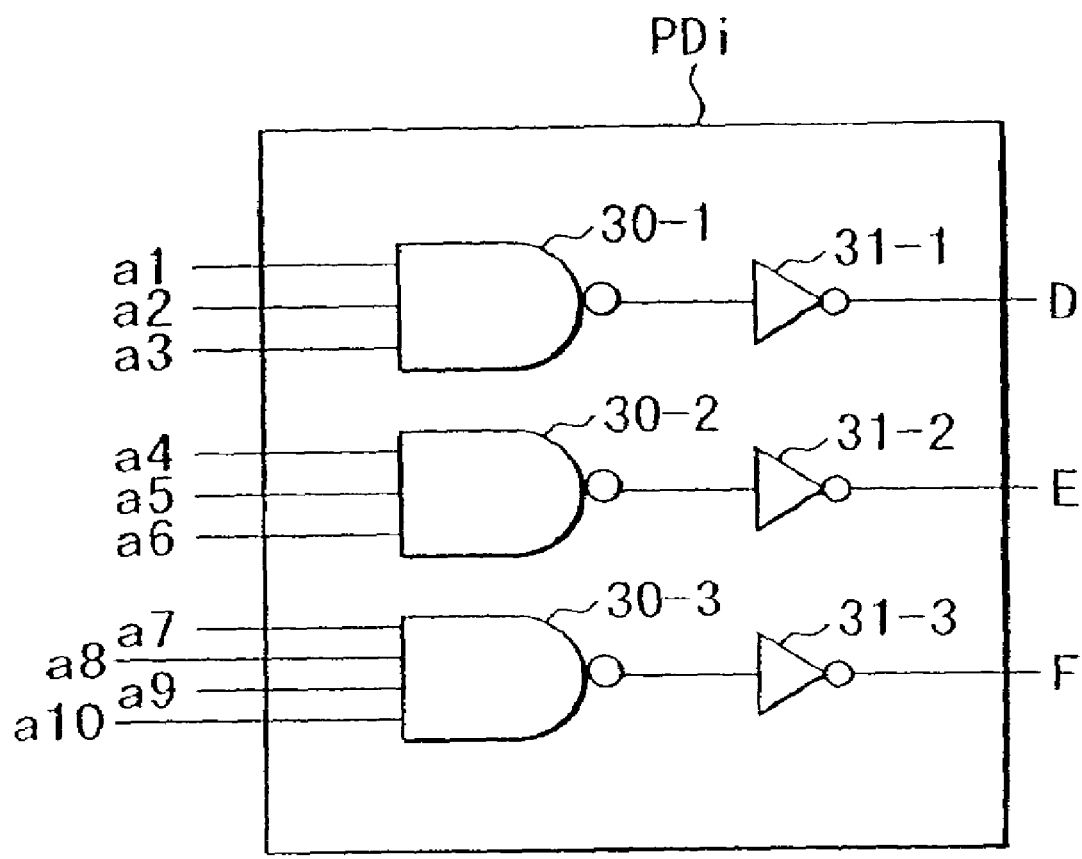
F I G. 29

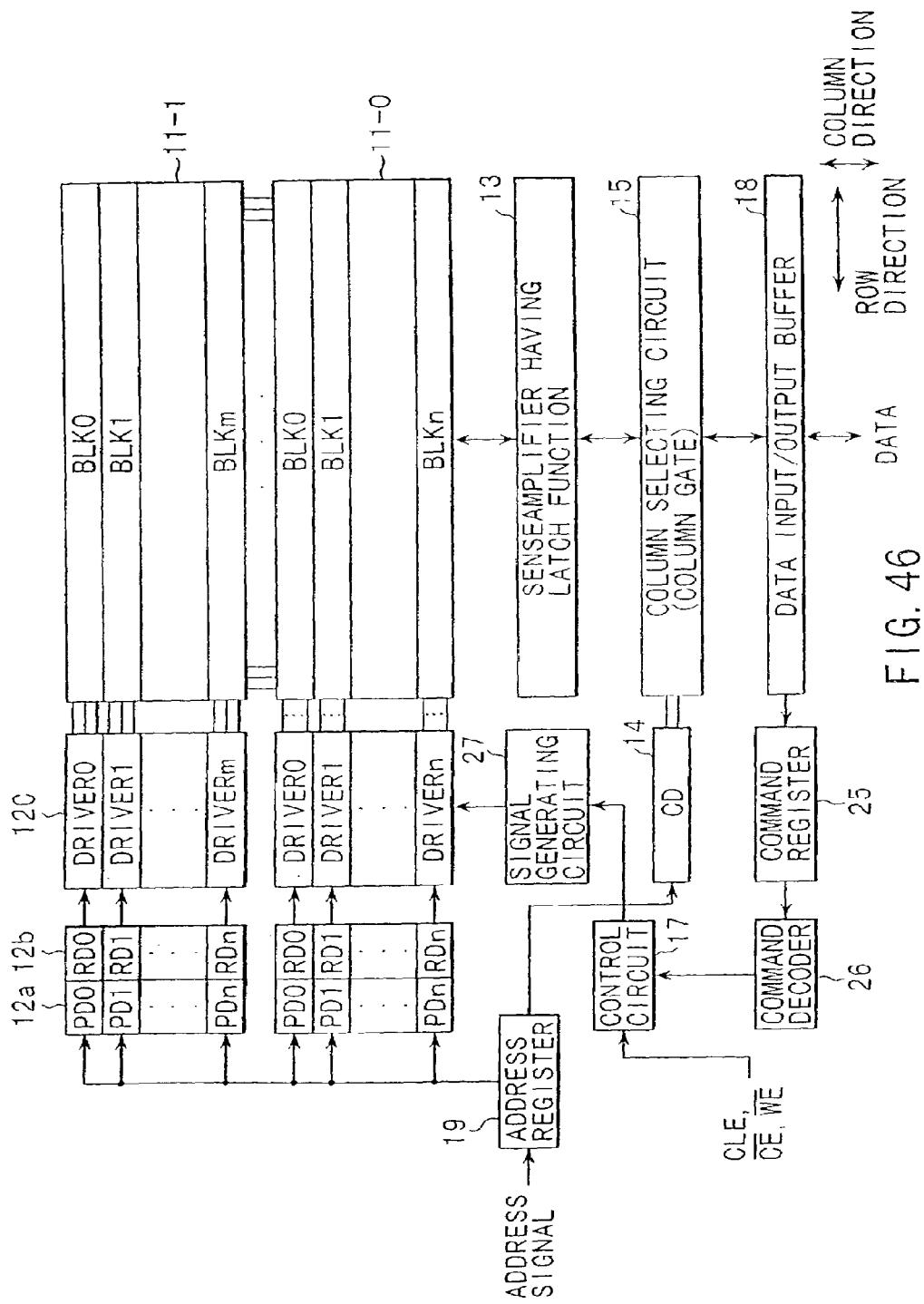
F I G. 46

NONVOLATILE SEMICONDUCTOR MEMORY

CROSS REFERENCE TO RELATED APPLICATIONS

This application is a divisional of prior application Ser. No. 10/929,014, filed Aug. 30, 2004, now U.S. Pat. No. 7,173,850, issued on Feb. 6, 2007, which is a continuation of prior application Ser. No. 10/638,406, filed Aug. 12, 2003, now U.S. Pat. No. 6,801,458, issued Oct. 5, 2004, which is a divisional of prior application Ser. No. 10/202,886, filed Jul. 26, 2002, now U.S. Pat. No. 6,657,892, issued Dec. 2, 2003, which is a continuation of prior application Ser. No. 09/921,570, filed Aug. 6, 2001, now U.S. Pat. No. 6,512,703, issued Jan. 28, 2003, which is a divisional of prior application Ser. No. 09/393,201, filed Sep. 9, 1999, now U.S. Pat. No. 6,307,807, issued Oct. 23, 2001, which claims priority under 35 U.S.C. §119 to Japanese patent applications 10-256738, filed Sep. 10, 1998 and 11-010676, filed Jan. 19, 1999. The entire disclosures of the prior applications are hereby incorporated by reference herein.

BACKGROUND OF THE INVENTION

The present invention relates to a nonvolatile semiconductor memory capable of changing memory cell data in units of bytes.

EEPROMs are conventionally known as nonvolatile semiconductor memories for changing memory cell data in units of bytes.

Reference 1 (W. Johnson et al., "A 16 Kb Electrically Erasable Nonvolatile Memory," ISSCC Digest of Technical Papers, PP. 152-153, February 1982) has proposed an EEPROM which changes memory cell data in units of bytes using FLOTOX (Floating Gate Tunnel Oxide) cells.

FIG. 65 is a plan view showing an example of a memory cell section of an EEPROM capable of byte erase. FIG. 66 is a sectional view taken along a line LXVI-LXVI in FIG. 65.

This EEPROM uses FLOTOX cells in the memory cell section. As a characteristic feature of a FLOTOX cell, an about 10-nm tunnel oxide film $22a$ is formed between an N$^+$ drain $20a$ and a floating gate $21a$, and charges are transferred between the N$^+$ drain $20a$ and the floating gate $21a$ by applying an electric field to the tunnel oxide film $22a$.

A current flowing to the tunnel oxide film $22a$ is an F-N (Fowler-Nordheim) tunneling current generated by the F-N tunneling phenomenon.

FIG. 67 is a view showing the energy band of a MOS capacitor section.

When an electric field is applied to the MOS capacitor (N$^+$ drain—tunnel oxide film—floating gate), an F-N tunneling current flows to the tunnel oxide film (SiO$_2$) on the basis of equation (1):

$$I = S \cdot \alpha \cdot E^2 \exp(-\beta/E) \quad (1)$$

$S$: area, $E$: electric field $\alpha = q^3/8\pi h \Phi B = 6.94 \times 10^{-7} \ [A/V^2]$ $\beta = -4(2m)^{0.5} \Phi B^{1.5}/3hq$ $= 2.54 \times 10^8 \ [V/cm]$ As is apparent from equation (1), the electric field with which the F-N tunneling current starts flowing is about 10 MV/cm. This electric field theoretically corresponds to a case wherein a voltage of 10V is applied to a tunnel oxide film of 10 nm.

Referring to FIGS. 65 and 66, assume that when a voltage is applied between the N$^+$ drain $20a$ and a control gate $23a$, the capacitance ratio (coupling ratio) between the control gate $23a$ and the floating gate $21a$ is 0.5.

In this case, to apply a voltage of 10V to the tunnel oxide film $22a$ between the N$^+$ drain $20a$ and the floating gate $21a$, a voltage as high as 20V must be applied between the N$^+$ drain $20a$ and the control gate $23a$.

For example, in the erase mode, the N$^+$ drain $20a$ is set at 0V and the control gate $23a$ at 20V to move electrons from the N$^+$ drain $20a$ to the floating gate $21a$. In the "1" program mode, the N$^+$ drain $20a$ is set at 20V and the control gate $23a$ at 0V to move electrons from the floating gate $21a$ to the N$^+$ drain $20a$.

The disadvantage of the EEPROM using FLOTOX cells is that two elements, a memory cell and a select transistor, are required to store 1-bit data, as shown in FIGS. 65 and 66.

FIG. 68 shows another example of the memory cell section of the EEPROM capable of byte erase.

As characteristic features of this EEPROM, FLOTOX cells are used in the memory cell section, and a byte control transistor Tr is prepared in correspondence with memory cells of 8 bits (1 byte).

Table 1 shows bias conditions in each mode of this EEPROM.

TABLE 1

| Mode | | Selected Byte | Unselected Byte Connected to the Same Word Line as That of Selected Byte | Unselected Byte Connected to the Same Bit Line as That of Selected Byte |
|---|---|---|---|---|
| Erase ("0" programming) | Word Line | High | High | Low |
| | Byte Control | High | Low | High |
| | Bit Line | Low | Low | Low |
| "1" Programming | Word Line | High | High | Low |
| | Byte Control | Low | Low | Low |
| | Bit Line | High or Low*[1] | Low | High or Low*[2] |

*[1] = Data Dependent
*[2] = Don't Care

When such a memory cell section is used, various operation errors (disturbances) can be avoided. However, since 2+(⅛) transistors are required to store 1-bit data, the cell area increases to result in an increase in cost.

Flash EEPROMs aim at eliminating this problem. A conventional EEPROM is very convenient because data can be erased or programmed in units of 1-bit data.

However, when a computer hard disk requiring a large memory capacity is to be formed from an EEPROM, the EEPROM need not have a function of erasing or programming data in units of 1-bit data. In most hard disks, data is often erased or programmed in units of sectors (or in units of blocks).

It is more advantageous to attain a large memory capacity by cell area reduction and reduce the cost of products while omitting the function of changing data in units of 1-bit data. On the basis of such an idea, flash EEPROMs have been developed.

Details of a flash EEPROM are described in, e.g., reference 2 (F. Masuoka et al., "A new Flash EEPROM cell using triple polysilicon technology," IEDM Technical Digest, pp. 464-467 December 1984).

FIG. 69 shows the structure of a memory cell of a flash EEPROM.

The memory cell of the flash EEPROM has a control gate and floating gate, like a memory cell of a UV erase EPROM. In the flash EEPROM, data is programmed by injecting hot electrons to the floating gate, as in the UV erase EPROM. Data is erased by removing electrons from the floating gate using the F-N tunneling phenomenon, like a byte EEPROM.

In the flash EEPROM, the erase operation for the individual memory cells is the same as in the byte EEPROM. However, the operation for the entire memory cell array is completely different from that in the byte EEPROM. More specifically, the byte EEPROM erases data in units of bytes while the flash EEPROM erases all bit data at once. Employing such an operation method, the flash EEPROM realizes a memory cell section with one transistor per bit and achieves a large memory capacity.

In the flash EEPROM, data can be programmed in units of bits, like the UV erase EPROM. More specifically, the flash EEPROM is the same as the UV erase EPROM in that all bit data are erased at once, and data can be programmed in units of bits.

To realize a memory chip with a large memory capacity, a NAND flash EEPROM has been proposed on the basis of the above-described flash EEPROM.

Reference 3 (F. Masuoka et al., "New ultra high density EPROM and Flash EEPROM with NAND structured cell," IEDM Technical Digest, pp. 552-555 December 1987) discloses a NAND flash EEPROM.

The memory cell array portion of a NAND EEPROM has a NAND unit in which a plurality of (e.g., 16) memory cells are serially connected to form a NAND series with select transistors connected to its two ends, respectively, as shown in FIGS. 70 and 71.

In the NAND EEPROM, a bit line contact section and source line need be formed not for each memory cell but for one NAND unit. Two adjacent memory cells of the plurality of memory cells forming the NAND series share one diffusion layer. For this reason, the memory cell size per bit can be largely reduced, and a memory chip having a large memory capacity can be realized.

FIG. 72 shows a NOR flash EEPROM. In the NOR flash EEPROM, a 1-bit (one) memory cell is formed between a bit line and a source line.

In terms of cost, the above-described NAND flash EEPROM has a characteristic feature suitable to a large-capacity file memory: the cost per bit is low because the cell size can be reduced as compared to the NOR flash EEPROM. In terms of function, the NAND flash EEPROM has a higher data change rate and lower power consumption than those of the NOR flash EEPROM.

In terms of function, the NAND flash EEPROM is characterized in the scheme for changing data. More specifically, the NAND flash EEPROM achieves program and erase by charge transfer between the silicon substrate (channel) and the floating gate.

To transfer charges, the F-N tunneling phenomenon is used. A current necessary for programming is an F-N tunneling current flowing from the silicon substrate (channel) to the floating gate. Unlike the NOR flash EEPROM that uses hot electrons for programming, the NAND flash EEPROM has very small current consumption.

In a 64-Mbit NAND flash EEPROM, data of one page (512 bytes) can be programmed in 200 μs. This programming time is shorter than that for one block in the NOR flash EEPROM.

Table 2 shows comparison between the characteristic features of the NAND flash EEPROM and those of the NOR flash EEPROM.

TABLE 2

| | NAND | NOR |
| --- | --- | --- |
| Advantage | ① Programming rate is high<br>② Erase rate is high<br>③ Block size is small and file management is easy | ① Random access rate is high<br>② Data can be programmed in units of bytes at random |
| Disadvantage | ① Random access rate is low<br>② Data cannot be programmed in units of bytes | ① Random access rate is low<br>② Erase rate is low |
| Application Purpose | Replacement for hard disk and floppy disk, and data recorder for portable terminal (handy terminal, voice recording, electronic still camera) and Fax/modem | Replacement for conventional EPROM, and control memory for control device, BIOS of PC, portable telephone, and HDD |

As shown in Table 2, the advantages and disadvantages of these memories are complementary to each other.

For the application purpose, the NAND flash EEPROM is used aiming at changing data in units of blocks. For example, in a digital camera having 300,000 pixels requires a memory capacity of about 0.5 Mbit for a photograph of one shot. When one block of the NAND flash EEPROM has a memory capacity of about 0.5 Mbit or more, photograph data of one shot can be stored in one block. In this case, data is erased in units of blocks. More specifically, photograph data of one shot is erased by erasing data of memory cells in one block.

On the other hand, the NOR flash EEPROM is capable of random access at a high speed of 100 ns and is widely used as a control program memory for, e.g., a portable telephone.

As described above, nonvolatile semiconductor memories have been developed as EEPROM (conventional type) →flash EEPROM→NAND flash EEPROM. The memory size, i.e., the cost per bit (bit cost) is reduced by sacrificing the function of changing data in units of bytes.

However, for, e.g., a nonvolatile memory embedded LSI which has received a great deal of attention recently, the function of changing data in units of bytes is required. For example, when an IC card used in a system for managing income and expenditure uses a flash EEPROM as an internal memory, data must be erased in units of blocks even when the data need a partial change. For this reason, the function of changing data in units of bytes is essential for such a system.

To cope with this situation, a byte EEPROM capable of changing data in units of bytes is required. However, the byte EEPROM has the large number of elements per bit, as described above, and therefore, is disadvantageous in increasing the memory capacity or reducing the bit cost.

Nonvolatile semiconductor memories of the current mainstream are flash EEPROMs (e.g., NOR type and NAND type). Hence, development of a byte EEPROM having the same process and scheme for changing data as those of a flash EEPROM makes it possible to produce EEPROMs meeting the requirements of the market at low cost.

BRIEF SUMMARY OF THE INVENTION

The present invention has been made in consideration of the above situation, and has as its object to provide a new nonvolatile semiconductor memory which can be formed by the same process as that of a flash EEPROM, has the same scheme for changing data as in the flash EEPROM, and has a function of changing data in units of bytes.

According to the present invention, there is provided a nonvolatile semiconductor memory comprising a memory cell array having a memory cell unit formed from one memory cell and two select transistors sandwiching the memory cell, a bit line connected to one of the select transistors, and a sense amplifier connected to the bit line and having a latch function, wherein the memory cell has a stacked gate structure having a floating gate and a control gate.

According to the present invention, there is also provided a nonvolatile semiconductor memory comprising a memory cell array having a first memory cell unit formed from one memory cell and two select transistors sandwiching the memory cell and a second memory cell unit formed from a plurality of memory cells, a bit line commonly connected to the first and second memory cell units, and a sense amplifier connected to the bit line and having a latch function, wherein each of the memory cells has a stacked gate structure having a floating gate and a control gate.

The second memory cell unit comprises a NAND unit in which the plurality of memory cells are connected in series or an AND or DINOR unit in which the plurality of memory cells are connected in parallel.

Each of the two select transistors has the same structure as that of the memory cell. That is, each of the two select transistors has a stacked gate structure. Actually, of the upper and lower layers of the stacked gate structure, only, e.g., the lower layer functions as a gate electrode.

The nonvolatile semiconductor memory of the present invention further comprises means for, when data are to be changed for selected memory cells in memory cells of one page connected to a selected control gate line in the memory cell array, reading data of the memory cells of one page to the sense amplifiers, superscribing, in the sense amplifiers, data on data corresponding to the selected memory cells of the page, erasing the data of the memory cells of one page, and programming the data of the sense amplifiers in the memory cells of one page.

The data corresponding to the selected memory cells constitute byte data or page data.

According to the present invention, there is also provided a nonvolatile semiconductor memory comprising a memory cell array formed from memory cell units each including a memory cell, a bit line connected to the memory cell unit, a sense amplifier connected to the bit line and having a latch function, and means for, when data are to be changed for selected memory cells in memory cells of one page connected to a selected control gate line in the memory cell array, reading data of the memory cells of one page to the sense amplifiers, superscribing, in the sense amplifiers, data on data corresponding to the selected memory cells of the page, erasing the data of the memory cells of one page, and programming the data of the sense amplifiers in the memory cells of one page.

According to the present invention, there is also provided a nonvolatile semiconductor memory comprising a memory cell array having a memory cell for programming data using an F-N tunneling current, a bit line connected to the memory cell, a sense amplifier connected to the bit line and having a latch function, and means for, when data are to be simultaneously programmed in memory cells corresponding to one page, which are connected to a selected control gate line, applying a first potential to wells in which the memory cells of one page are formed, a second potential to a control gate of each of the memory cells of one page, the first potential to a bit line connected to a selected memory cell of the memory cells of one page, for which programming is to be executed, and an intermediate potential between the first and second potentials to a bit line connected to an unselected memory cell of the memory cells of one page, for which programming is not to be executed.

According to the present invention, there is also provided a nonvolatile semiconductor memory comprising a memory cell array formed from a plurality of memory cell units arranged in a matrix, a main control gate line extending in a row direction on the memory cell array, a main control gate driver at one end of the main control gate line, a sub control gate line connected to a plurality of memory cells of memory cells of one page in the memory cell units arranged in the row direction, and a sub control gate driver inserted between the main control gate line and the sub control gate line.

Each of the plurality of memory cell units is formed from one memory cell and two select transistors respectively connected to two ends of the memory cell.

The nonvolatile semiconductor memory of the present invention further comprises two select gate lines connected to gates of the two select transistors in each of the memory cell units arranged in the row direction, and a select gate driver connected to one end of each of the two select gate lines near the control gate driver.

The nonvolatile semiconductor memory of the present invention further comprises a sub decoder for decoding an address signal and outputting a control signal, and the sub control gate driver comprises a MOS transistor connected between the main control gate line and the sub control gate line and having a gate for receiving the control signal.

The nonvolatile semiconductor memory of the present invention further comprises a sub decoder for decoding an address signal and applying a predetermined potential to the sub control gate line, and the sub control gate driver comprises a MOS transistor connected between the sub control gate line and the sub decoder and having a gate for receiving the potential of the main control gate line.

The nonvolatile semiconductor memory of the present invention further comprises means for, when data are to be changed for arbitrary memory cells in memory cells of one page in the memory cell units arranged in the row direction, reading to the sense amplifiers data of the plurality of memory cells connected to the sub control gate line, superscribing, in the sense amplifiers, data on predetermined data of the data of the plurality of memory cells, erasing the data of the plurality of memory cells connected to the sub control gate line, and programming the data of the sense amplifiers in the plurality of memory cells connected to the sub control gate line.

The nonvolatile semiconductor memory of the present invention further comprises means for, when data are to be changed for arbitrary memory cells in memory cells of one page in the memory cell units arranged in the row direction, reading to the sense amplifiers data of memory cells of one page connected to the main control gate line, superscribing, in the sense amplifiers, data on predetermined data of the data of the plurality of memory cells connected to the sub control gate line, erasing the data of the plurality of memory cells connected to the sub control gate line, and programming, of the data of the sense amplifiers, data corresponding to the plurality of memory cells connected to the sub control gate line in the plurality of memory cells connected to the sub control gate line.

The sub control gate line is connected to memory cells of n bytes (n is a natural number), and data corresponding to the selected memory cells constitute byte data.

When the plurality of memory cells connected to the sub control gate line are defined as a block, a plurality of blocks are connected to the main control gate line, and a data read, erase, or program operation is performed in units of n (n is a natural number) blocks.

According to the present invention, there is also provided a nonvolatile semiconductor memory comprising a memory cell array formed from a plurality of memory cell units arranged in a matrix, first and second main control gate lines extending in a row direction on the memory cell array, a first main control gate driver connected to one end of the first main control gate line, a first sub control gate line connected to a plurality of memory cells of memory cells of one page in first memory cell units, which are arranged in the row direction, a first sub control gate driver inserted between the first main control gate line and the first sub control gate line, a first select gate line connected to a select transistor in each of the first memory cell units, a first select gate driver connected to one end of the first select gate line, a second main control gate driver connected to one end of the second main control gate line, a second sub control gate line connected to a plurality of memory cells of memory cells of one page in second memory cell units, which are arranged in the row direction, a second sub control gate driver inserted between the second main control gate line and the second sub control gate line, a second select gate line connected to a select transistor in each of the second memory cell units, and a second select gate driver connected to one end of the second select gate line, wherein the first main control gate driver and the first select gate driver are arranged at one end of the memory cell array in the row direction, and the second main control gate driver and the second select gate driver are arranged at the other end of the memory cell array in the row direction.

According to the present invention, there is provided a nonvolatile semiconductor memory comprising a memory cell array formed from a plurality of memory cell units arranged in a matrix, first and second main control gate lines extending in a row direction on the memory cell array, a first sub control gate line connected to a plurality of memory cells of memory cells of one page in first memory cell units, which are arranged in the row direction, a first sub control gate driver inserted between the first main control gate line and the first sub control gate line, a first select gate line connected to a select transistor in each of the first memory cell units, a first select gate driver connected to one end of the first select gate line, a main control gate driver connected to one end of each of the first and second main control gate lines, a second sub control gate line connected to a plurality of memory cells of memory cells of one page in second memory cell units, which are arranged in the row direction, a second sub control gate driver inserted between the second main control gate line and the second sub control gate line, a second select gate line connected to a select transistor in each of the second memory cell units, and a second select gate driver connected to one end of the second select gate line, wherein the main control gate driver and the first and second select gate drivers are arranged at one end of the memory cell array in the row direction.

The first and second memory cell units are, e.g., adjacent to each other in a column direction.

According to the present invention, there is provided a nonvolatile semiconductor memory comprising a memory cell array having first and second memory cell units each formed from one memory cell and two select transistors, a first bit line connected to one of the two select transistors in the first memory cell unit, a second bit line connected to one of the two select transistors in the second memory cell unit, and a sense amplifier connected to each of the first and second bit lines and having a latch function.

According to the present invention, there is also provided a nonvolatile semiconductor memory comprising a memory cell array having a memory cell unit formed from a plurality of memory cells and two select transistors sandwiching the memory cells, a bit line connected to one of the two select transistors, a sense amplifier connected to the bit line and having a latch function, and means for, in a program operation, applying a high program potential higher than a power supply potential to a selected control gate line and, to an unselected control gate line, the power supply potential or a read potential to be applied to the unselected control gate line in a read operation.

The memory cell unit includes two memory cells. Each of the plurality of memory cells has a stacked gate structure having a floating gate and a control gate.

Each of the two select transistors has the same structure as that of the plurality of memory cells.

According to the present invention, there is also provided a nonvolatile semiconductor memory comprising a memory cell array having a first memory cell unit formed from a plurality of memory cells and two select transistors sandwiching the memory cells and a second memory cell unit having a plurality of memory cells, a bit line commonly connected to the first and second memory cell units, a sense amplifier connected to the bit line and having a latch function, and means for, in a program operation, when a block including the first memory cell unit is selected, applying a high program potential higher than a power supply potential to a selected control gate line and, to an unselected control gate line, the power supply potential or a read potential to be applied to the unselected control gate line in a read operation.

The nonvolatile semiconductor memory of the present invention further comprises means for, when data are to be changed for arbitrary memory cells in memory cells of one page connected to a selected control gate line, reading data of the memory cells of one page to the sense amplifiers, superscribing, in the sense amplifiers, data on predetermined data of the page, erasing the data of the memory cells of one page connected to the selected control gate line, and programming the data of the sense amplifiers in the memory cells of one page connected to the selected control gate line.

In the program operation, the means applies the power supply potential or the read potential to the selected control gate line and the unselected control gate line and then increases only the potential of the selected control gate line to the high program potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1C is a view showing the memory cell unit of a byte EEPROM of the present invention;

FIG. 1D is a sectional view taken along a line ID-ID in FIG. 1C;

FIG. 2B is a view showing the equivalent circuit of the structure shown in FIG. 1C;

FIG. 13 is a view showing erasing of page data in the sequence shown in FIG. 10;

FIG. 14 is a view showing programming of page data in the sequence shown in FIG. 10;

FIG. 29 is a circuit diagram showing an example of the predecoder shown in FIG. 28;

FIG. 46 is a block diagram showing another example of the EEPROM to which the present invention is applied;

DETAILED DESCRIPTION OF THE INVENTION

A nonvolatile semiconductor memory of the present invention will be described below in detail with reference to the accompanying drawing.

Figures 1A, 1B:
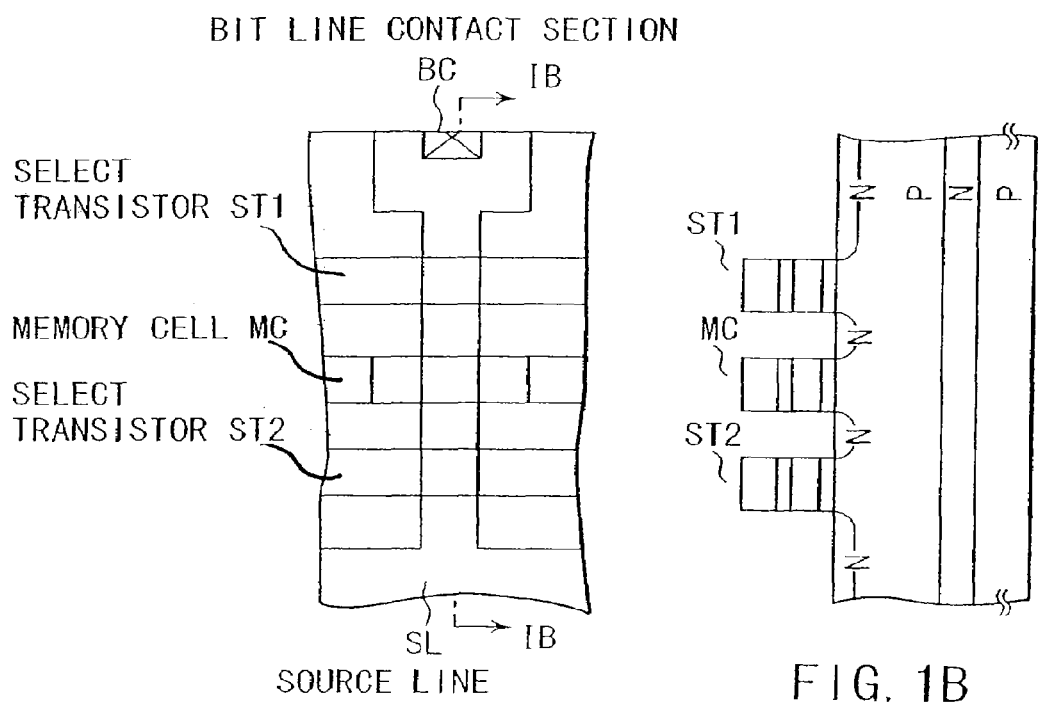
FIG. 1A is a view showing the memory cell unit of a byte EEPROM of the present invention.
FIG. 1B is a sectional view taken along a line IB-IB in FIG. 1A.
Figure 2A:
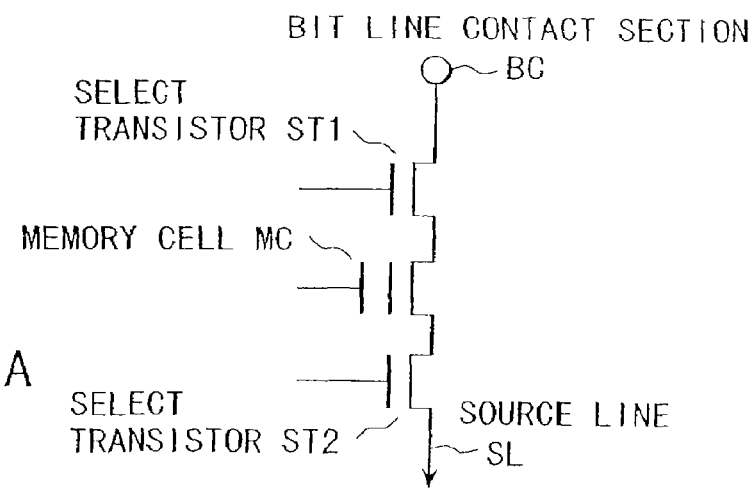
FIG. 2A is a view showing the equivalent circuit of the structure shown in FIG. 1A.
Figure 3:
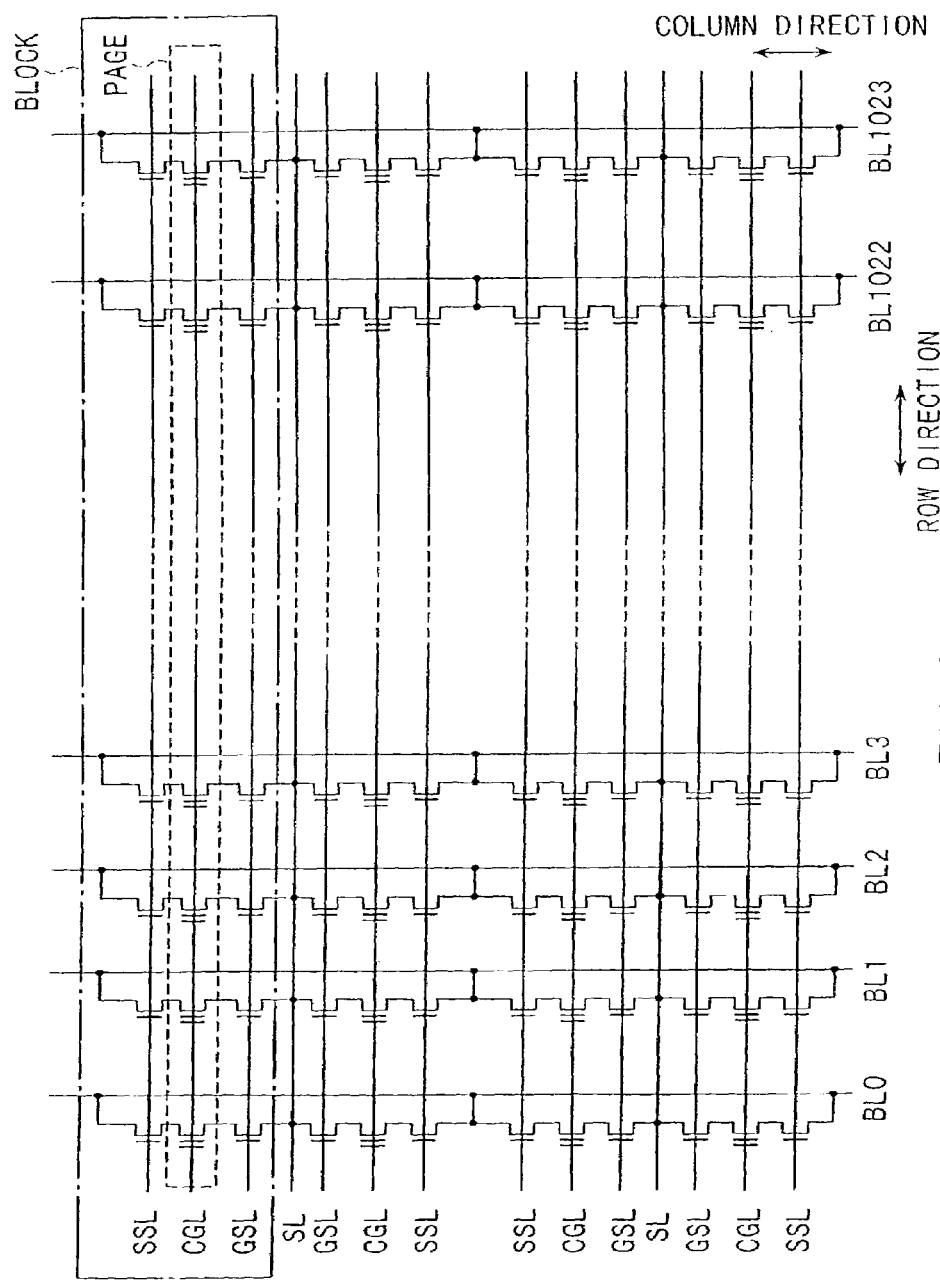
FIG. 3 is a view showing the memory cell array of the byte EEPROM of the present invention.
Figure 4:
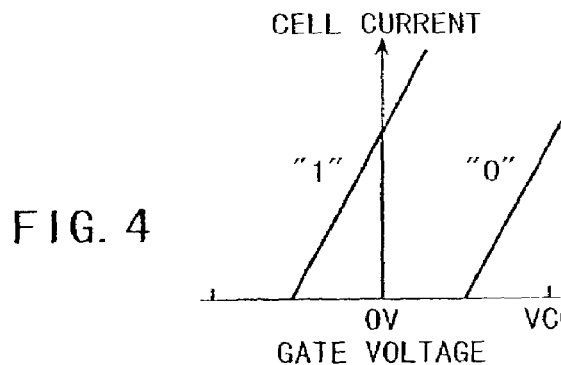
FIG. 4 is a graph showing the relationship between a gate voltage and a cell current corresponding to the data of a memory cell.
Figure 5A:
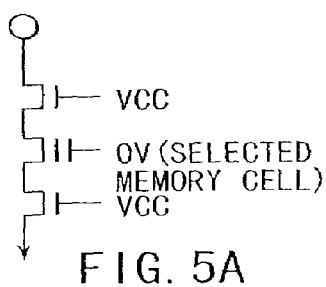
FIGS. 5A and 5B are views showing potentials applied to the memory cell unit in a data read.
Figure 5B:
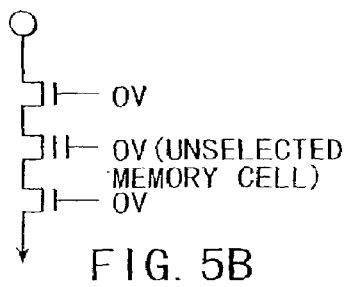

FIGS. 1A and 1B show a memory cell of a byte EEPROM of the present invention. FIG. 2A shows the equivalent circuit of the memory cell shown in FIGS. 1A and 1B. FIG. 3 shows the entire circuit arrangement of the memory cell array.

A memory cell MC has a control gate and floating gate. This structure is the same as a memory cell of a flash EEPROM. Select transistors ST1 and ST2 are connected to the two ends of the memory cell MC, respectively. The select transistor ST1 is connected to a bit line via a bit line contact section BC. The select transistor ST2 is connected to a source line SL.

The memory cell MC and select transistors ST1 and ST2 form one memory cell unit. A memory cell array is constructed by arraying a plurality of memory cell units.

A plurality of memory cell units in the row direction form one block. One control gate line CGL extends in one block in the row direction. Memory cells connected to one control gate line CGL are called one page.

An erase can be performed in units of pages. A program and read for the memory cells can also be performed in units of pages by using a sense amplifier having a latch function for each column. However, data is serially input/output in units of bits.

This arrangement allows a data change operation for byte data.

In terms of structure, the byte EEPROM of the present invention can be regarded as a NAND flash EEPROM having one memory cell in one NAND unit. In terms of function, however, the byte EEPROM of the present invention is largely different from the NAND flash EEPROM. This will be described later in association with the operation.

The advantages of the structure of the byte EEPROM of the present invention will be described.

The memory cell section of the byte EEPROM of the present invention is different from that of the NAND flash EEPROM in only the number of memory cells constituting one unit. Hence, the byte EEPROM of the present invention can directly employ the process of the NAND flash EEPROM. For this reason, the memory capacity can be increased and the production cost can be reduced, though data can be erased in units of bytes.

Figure 65:
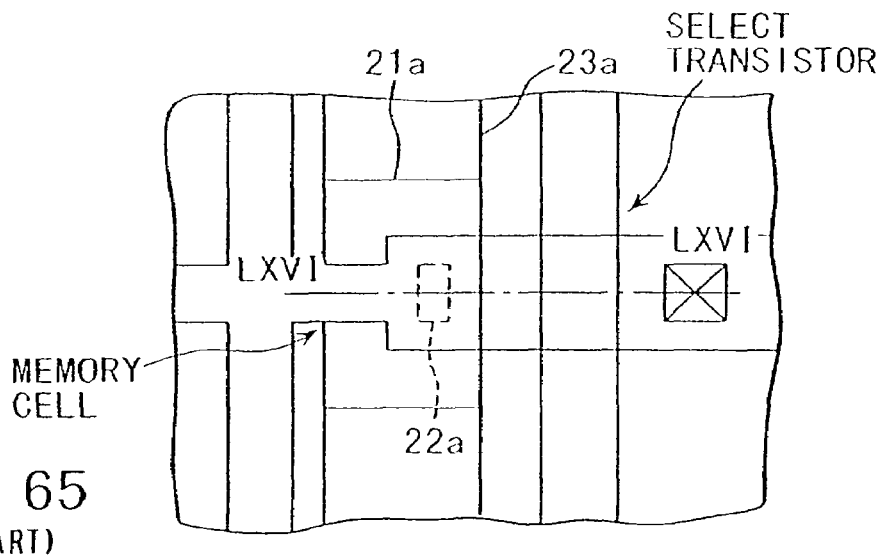
FIG. 65 is a view showing a memory cell of a conventional byte EEPROM.
Figure 66:
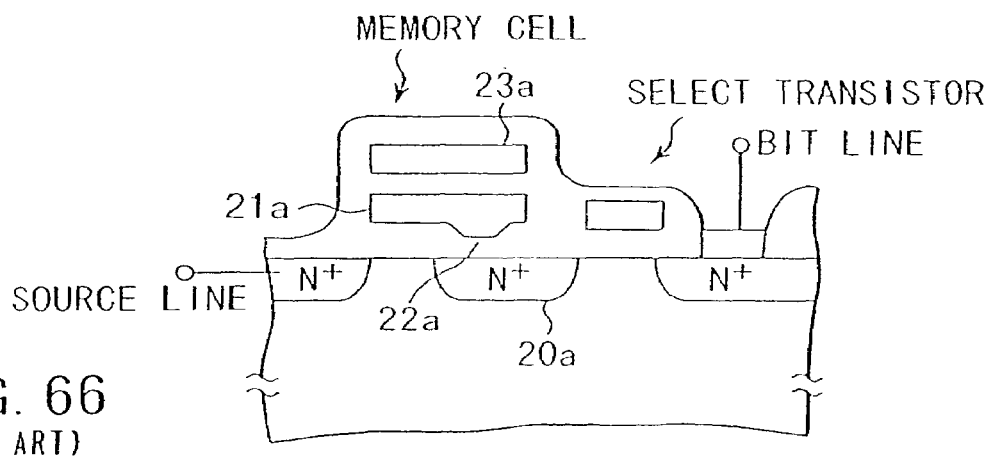
FIG. 66 is a sectional view taken along a line LXVI-LXVI in FIG. 65.
Figure 67:
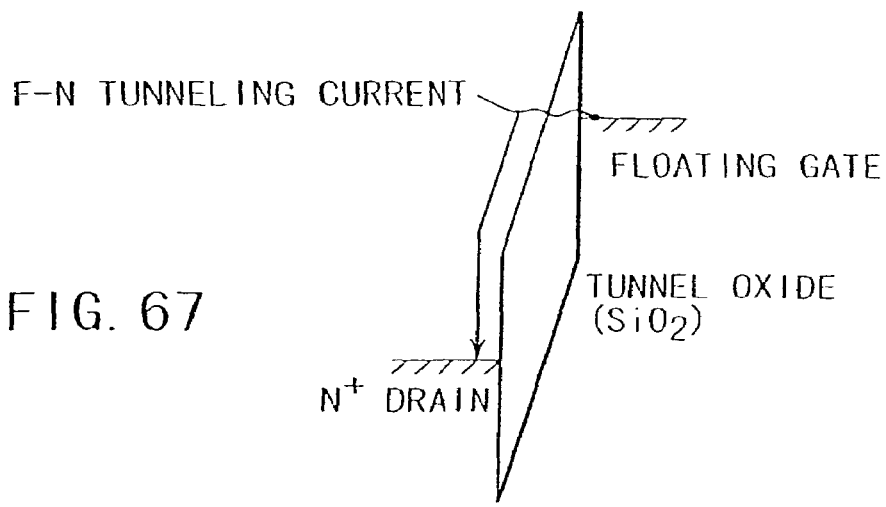
FIG. 67 is an energy band diagram showing the mechanism of an F-N tunneling current.
Figure 68:
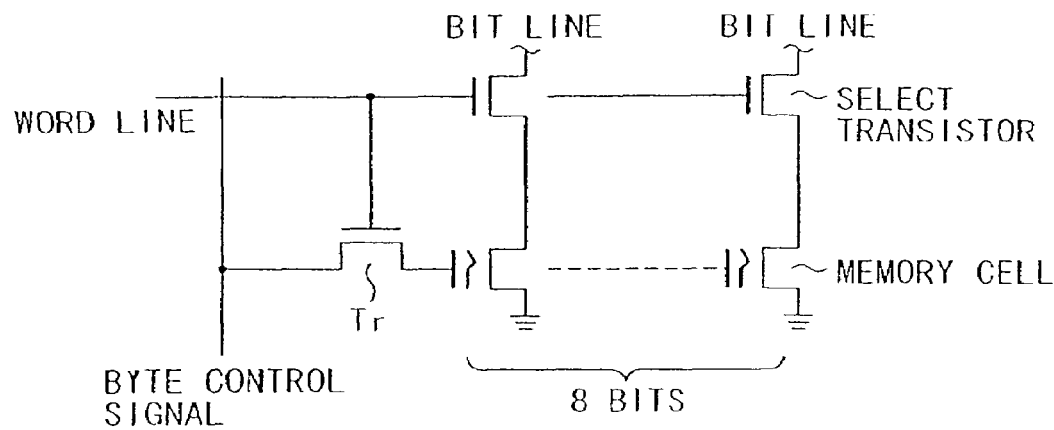
FIG. 68 is a view showing a memory cell of the conventional byte EEPROM.
Figure 69:
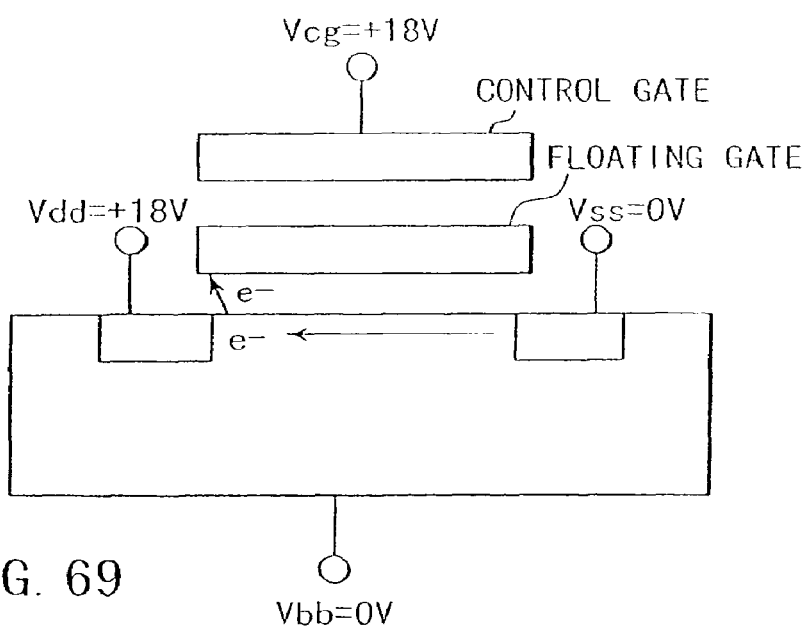
FIG. 69 is a view showing the basic structure of the memory cell of the conventional byte EEPROM.
Figure 70:
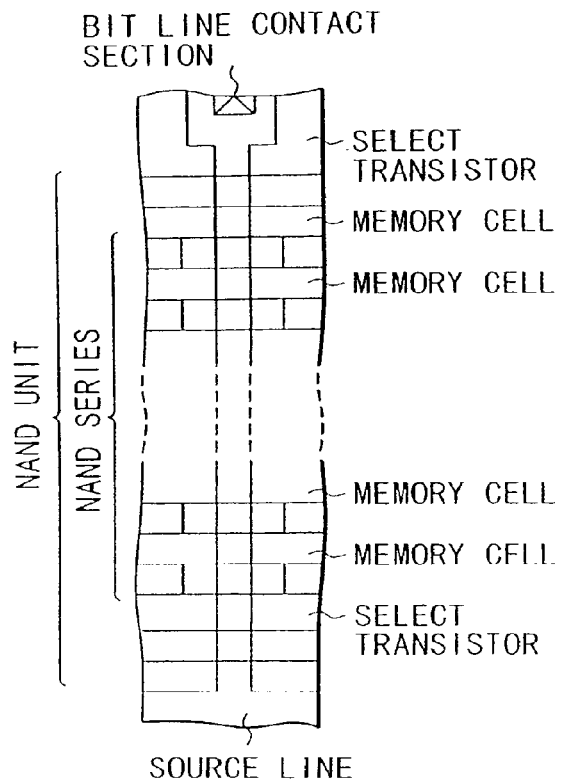
FIG. 70 is a view showing the NAND unit of a NAND flash EEPROM.
Figure 71:
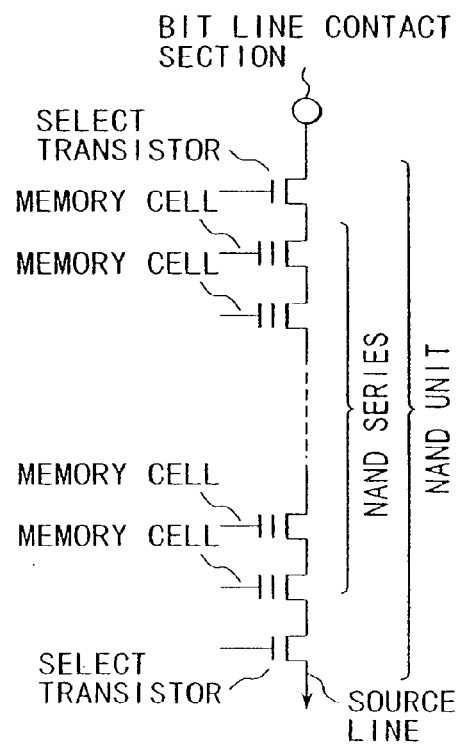
FIG. 71 is a view showing the equivalent circuit of the structure shown in FIG. 70.
Figure 72:
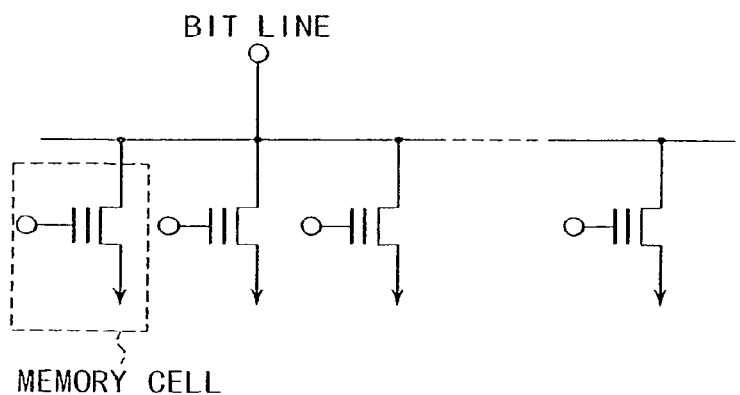
FIG. 72 is a view showing a memory cell of a NOR flash EEPROM.

For example, when the design rule is 0.4 µm, a short-side length a is 1.2 µm and a long-side length b is 3.2 µm. The area (short-side length a×long-side length b) per memory cell is 3.84 µm². In the conventional byte EEPROM as shown in FIGS. 65 and 66, when the design rule is 0.4 µm, the area per memory cell is 36 µm².

That is, for the memory cell array portion, the byte EEPROM of the present invention can realize a memory capacity 10-times larger than that of the conventional byte EEPROM by simple calculation.

Since the byte EEPROM of the present invention can be manufactured by the same process as that of the NAND flash EEPROM, the byte EEPROM can be easily applied to a logic embedded nonvolatile memory.

Since the memory cell of the byte EEPROM of the present invention has the same structure as that of the NAND flash EEPROM, the data change scheme of the flash EEPROM, i.e., the data change scheme using the F-N tunneling phenomenon can be directly employed for one memory cell.

For the entire memory cell array, the byte EEPROM of the present invention is different from the NAND flash EEPROM in that the data change operation for byte data, i.e., byte erase is possible.

The erase, program, and read operations of the byte EEPROM of the present invention will be described sequentially below.

In the erase operation, a ground potential is applied to the control gate (word line) CGL of a selected block. The control gate CGL of an unselected block is set in a floating state.

After this, for example, an erase pulse of 21V and 3 ms is applied to the bulk. A bulk means a well formed in a silicon substrate. The memory cell MC and select transistors ST1 and ST2 are formed in this well.

When the erase pulse is applied to the bulk, in the memory cell MC of the selected block, an erase voltage (21V) is applied between the bulk and the control gate, and electrons in the floating gate move to the well due to the F-N (Fowler-Nordheim) tunneling phenomenon. As a result, the threshold voltage of the memory cell is about −3V.

In the byte EEPROM of the present invention, an over-erase wherein the absolute value of the threshold voltage of a memory cell extremely increases in the erase operation need not be taken into consideration. Hence, when the erase operation is performed under the condition that the threshold voltage is set at about −3V by the erase pulse of one cycle, the erase time (if a verify is performed to confirm whether the threshold voltage has a value smaller than a predetermined value, the erase time includes the time required for the verify) can be shortened.

The byte EEPROM of the present invention need not take the over-erase into consideration because the select transistors ST1 and ST2 are connected to the two ends of one memory cell MC, respectively. More specifically, in a data read, an unselected memory cell must be always turned off, and a selected memory cell must be turned on or off depending on data. The over-erase turns on the unselected memory cell. The select transistors ST1 and ST2 prevent data of the unselected memory cell from being supplied to the bit line even when the unselected memory cell is ON. Hence, the operation of the memory has no problem.

In the erase operation, the control gate CGL of the unselected block is set in the floating state. In each memory cell MC of the unselected block, even when the potential of the bulk (well) rises, data is not erased because the potential of the control gate CGL also rises due to the capacitive coupling between the control gate CGL and the bulk.

The control gate CGL is formed from, e.g., polysilicon or a multilayered structure of polysilicon and a metal silicide. The control gate CGL is connected to the source of a word line drive MOS transistor via a metal interconnection. Hence, the control gate is connected to the junction capacitance of the source of the word line drive transistor, the overlap capacitance between the gate and source, the capacitance between the control gate and metal interconnection, the capacitance between the control gate and the bulk (well), and the like.

Of these capacitances, the capacitance between the control gate and the bulk is especially large. Since the coupling ratio between the control gate and the bulk is as large as about 0.9, the F-N tunneling current can be prevented from flowing to the memory cell MC of the unselected block by the capacitive coupling between the control gate CGL and the bulk.

In an erase verify, it is verified whether, for example, the threshold voltages of all memory cells in the selected block is −1V or less. In the present invention, the over-erase does not pose any problem, as described above. For this reason, the over-erase need not be verified. In addition, when the erase is performed under a condition for allowing a proper decrease in threshold voltage to about −3V, the verity can be omitted.

In the "0" program mode, the bit-line-side select transistor ST1 of the selected block is turned on, and the source-line-side select transistor ST2 is turned off. For a memory cell for which programming is to be executed ("0" programming), a bit line BLi is set at 0V. For a memory cell for which programming is to be inhibited ("1" programming), the bit line BLi is set at a power supply potential VCC (e.g., 3.3V).

A potential of 0V is applied from the bit line BLi to the channel of the memory cell for program execution via the select transistor ST1. Hence, the channel potential of the memory cell for program execution is the ground potential.

A program potential is applied to the selected word line (control gate). At this time, of the selected memory cells connected to the selected word line, a memory cell for program execution generates a large potential difference between the floating gate and the channel. In the memory cell for program execution, electrons move from the channel to the floating gate due to the F-N tunneling phenomenon.

On the other hand, in a program inhibit memory cell, the channel is charged to the power supply voltage VCC and also set in the floating state. When the program potential is applied to the selected word line (control gate), the channel potential is also automatically boosted by the series capacitive coupling between the control gate, floating gate, channel, and bulk (well).

No large potential difference is generated between the floating gate and channel of the program inhibit memory cell, which is connected to the selected word line, and electrons do not move from the channel to the floating gate.

For the program inhibit memory cell, the coupling ratio between the control gate and channel is increased, and the channel is sufficiently charged. With this technique, the channel potential (program inhibit potential) when the program potential is applied to the selected word line can be made high enough.

A coupling ratio B between the control gate and channel is calculated by $$B = Cox/(Cox + Cj)$$

where Cox is the sum of gate capacitances of the control gate and channel, and Cj is the sum of junction capacitances of the source and drain of the memory cell.

The channel capacitance of the memory cell equals the sum of the sum Cox of the gate capacitances and the sum Cj of the junction capacitances.

The overlap capacitance between the gate and source of the select transistor and the capacitance between the bit line and source/drain are much smaller than the channel capacitance and therefore are neglected.

In the read operation, after the bit line is charged to the precharge potential, a potential of 0V is applied to the control gate (selected word line) of the selected memory cell. The power supply potential VCC is applied to the gates of the select transistors on both sides of a selected memory cell. A potential of 0V is applied to the gates of the select transistors on both sides of an unselected memory cell. At this time, the select transistors on both sides of the selected memory cell are turned on, and the select transistors on both sides of the unselected memory cell are turned off.

Of the selected memory cells, a memory cell having data "1", i.e., a memory cell in the erase state has a threshold voltage in a negative depletion mode and therefore is ON, so the potential of the bit line decreases. Conversely, a memory cell with data "0" has a threshold voltage in a positive enhancement mode and therefore is OFF. The potential of the bit line is maintained at the precharge potential.

In this way, data "0" or "1" is determined on the basis of whether a cell current flows from the bit line to the source line. A change in the potential of the bit line is amplified (detected) by a sense amplifier.

According to the byte EEPROM of the present invention, the memory cell MC sandwiched by the select transistors has the following advantages.

Figure 6:
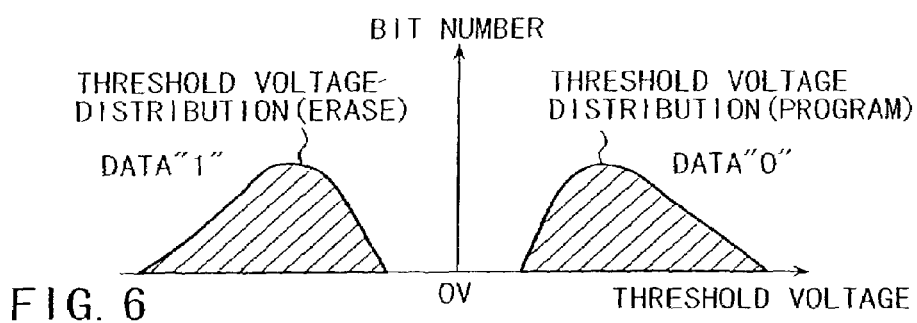
FIG. 6 is a graph showing an example of a threshold voltage distribution corresponding to the data of the memory cell.

As the first advantage, when the read potential is 0V, the threshold voltage distribution after the erase or programming only need have a negative value (data "1") or a positive value (data "0"), as shown in FIG. 6. More specifically, only a verify function of discriminating "1" from "0" is necessary, and a verify function of detecting an over-erase or over-program can be omitted. Hence, a complex verify is unnecessary, unlike the conventional flash EEPROM. In the present invention, a normal read operation is possible even when the absolute value of a negative threshold voltage is increased by the over-erase, or the absolute value of a positive threshold voltage is increased by the over-program. For this reason, the electric field to be applied to the gate oxide film (tunnel oxide film) can be set high, and the erase time or programming time can be shortened.

As the second advantage, both the erase and programming are performed by transferring charges between the floating gate and channel using the F-N tunneling phenomenon, like the NAND flash EEPROM. For this reason, the current consumption of the data change operation can be minimized. As a consequence, the number of memory cells in which data can be simultaneously changed by one-time data change operation can be increased.

As the third advantage, in the byte EEPROM of the present invention, only one memory cell is sandwiched between select transistors, unlike the NAND flash EEPROM. That is, selected memory cells and unselected memory cells are not present between the select transistors at the same time. For this reason, in the read mode, the unselected memory cell need not always be turned on and made to function as a pass transistor. Hence, no means for preventing the over-program is required.

In the read mode, the unselected memory cell need not always be ON. For this reason, when the read is to be performed by setting the control gate of the selected memory cell at 0V, the control gate of the unselected memory cell can also be set at 0V because read retention need not be taken into consideration.

In the conventional NAND flash EEPROM, a plurality of memory cells are connected in series between select transistors. In the read mode, the control gate of a selected memory cell is set at 0V, and the control gate of an unselected memory cell is set at a voltage Vread (=4.5V). This shortens read retention.

In the present invention, only one memory cell is connected between select transistors. In the read mode, when the control gates of all memory cells are set at 0V, selection/nonselection of a memory cell can be determined by only turning on/off the select transistors at the two ends of the memory cell.

Since select transistors are connected between a bit line and memory cells, unselected memory cells need not always be OFF in the read mode. Hence, no means for preventing the over-erase is required, either.

In the "0" program mode, the intermediate potential (potential of about ½ the program potential) need not be applied to an unselected word line (control gate). This is because select transistors are present between memory cells and a bit line, and only one memory cell is connected between select transistors.

Since any program error can be prevented without applying the intermediate potential to the unselected word line, the reliability of programming is high. Additionally, data can be changed in units of pages (or in units of bits). In the read mode as well, the cell current can be made large because of the absence of pass transistors. This increases the read rate and improves data holding characteristics in the read operation.

Table 3 shows the potentials of select gate lines SSL and GSL, control gate line (word line) CGL, bit line BLi, cell source line SL, and cell P-well in the above-described erase, program, and read operations.

For this reason, the bit line BLi and cell source line SL are charged to Vera-Vb. Vb is the built-in potential of the p-n junction.

In the programming operation, the bit line BLi connected to a selected memory cell in which "1" data is to be programmed, i.e., the bit line BLi connected to a selected memory cell maintaining the erase state is set at the power supply potential VCC (e.g., 3.3V). The bit line BLi connected to a selected memory cell in which "0" data is to be programmed is set at 0V.

The select gate line SSL of a selected block on the bit line side is set at the power supply potential VCC. The select gate line GSL on the cell source line side is set at 0V. The control gate line CGL is set at a program voltage Vprog (e.g., 18V).

The select gate lines SSL and GSL, control gate line CGL, and cell P-well of an unselected block are set at 0V.

The cell source line is set at 0V. However, if the channel potential of a memory cell in the selected block, in which "1" data is to be programmed, is boosted by capacitive coupling with the control gate line CGL, and the leakage current of the cell source line poses a problem due to punch-through, the potential of the cell source line is preferably set at the power supply potential VCC.

In the read operation, the select gate lines SSL and GSL of a selected block are set at the power supply potential VCC, and the control gate line CGL is set at 0V. When the

TABLE 3

| | | Erase | Program | Read |
|---|---|---|---|---|
| Selected Block | Select Gate Line SSL on Bit Line Side | Vera×β | VCC | VCC |
| | Control Gate Line CGL | 0V | Vprog | 0V |
| | Select Gate Line GSL on Source Line Side | Vera×β | 0V | VCC |
| Unselected Block | Select Gate Line SSL on Bit Line Side | Vera×β | 0V | 0V |
| | Control Gate Line CGL | Vera×β | 0V | 0V |
| | Select Gate Line GSL on Source Line Side | Vera×β | 0V | 0V |
| Bit Line | "1" Data | Vera-Vb | VCC | VBL→0V |
| | "0" Data | Vera-Vb | 0V | VBL |
| Cell Source Line | | Vera-Vb | VCC | 0V |
| Cell P-well | | Vera | 0V | 0V |

In the erase operation, the control gate CGL of a selected block is set at 0V. The control gate line CGL and all the select gate lines SSL and GSL of an unselected block are set in the floating state.

In this state, when an erase potential Vera of, e.g., 21V is applied to the cell P-well, the potentials of all the select gate lines SSL and GSL in the floating state and the potential of the control gate line CGL of the unselected block are given by Vera×β (β is the coupling ratio) because of capacitive coupling with the cell P-well.

When the coupling ratio β is 0.8, the potentials of all the select gate lines SSL and GSL in the floating state and the potential of the control gate line CGL of the unselected block increase to 16.8V each.

In the erase operation, p-n junction formed from an N⁺-type diffusion layer and cell P-well, which are connected to the bit line BLi and cell source line SL, is forward-biased.

bit line is to be precharged before the data read, the bit line BLi is set at a precharge potential (e.g., 1.2V) VBL.

Of selected memory cells, a memory cell storing "1" data is turned on to flow the cell current, so the bit line BLi is discharged to 0V. Of the selected memory cells, a memory cell storing "0" data is turned off, and no cell current flows. Hence, the bit line BLi holds the precharge potential VBL.

Figure 7:
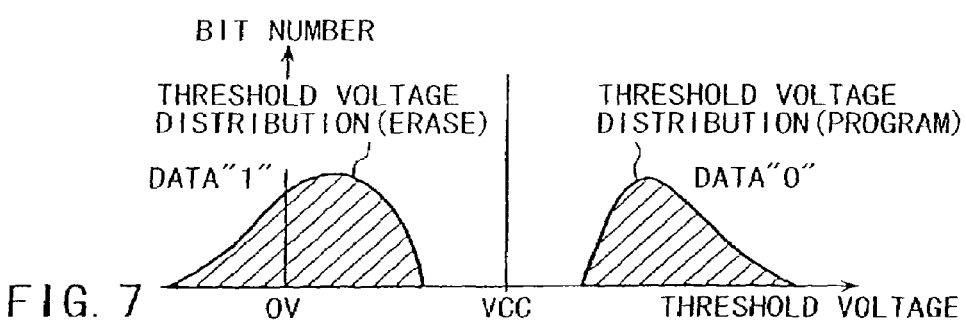
FIG. 7 is a graph showing another example of the threshold voltage distribution corresponding to the data of the memory cell.

If the read operation is to be performed by applying the power supply potential VCC (e.g., 3.3V) to the control gate line CGL of the selected block, the threshold distribution of memory cells is set as shown in FIG. 7.

Table 4 shows the potentials of the select gate lines SSL and GSL, control gate line (word line) CGL, bit line BLi, cell source line SL, and cell P-well in the above-described erase, program, and read operations when the threshold distribution shown in FIG. 7 is set.

TABLE 4

|  |  | Erase | Program | Read |
|---|---|---|---|---|
| Selected Block | Select Gate Line SSL on Bit Line Side | Verax β | VCC | VCC |
|  | Control Gate Line CGL | 0V | Vprog | VCC |
|  | Select Gate Line GSL on Source Line Side | Verax β | 0V | VCC |
| Unselected Block | Select Gate Line SSL on Bit Line Side | Verax β | 0V | 0V |
|  | Control Gate Line CGL | Verax β | 0V | 0V |
|  | Select Gate Line GSL on Source Line Side | Verax β | 0V | 0V |
| Bit Line | "1" Data | Vera-Vb | VCC | VBL→0V |
|  | "0" Data | Vera-Vb | 0V | VBL |
| Cell Source Line |  | Vera-Vb | VCC | 0V |
| Cell P-well |  | Vera | 0V | 0V |

In the present invention, as described above, since select transistors are connected to the two ends of a memory cell, the tail of the threshold distribution of a memory cell after the erase ("1" data) may move from the positive to negative sides.

Figure 8:
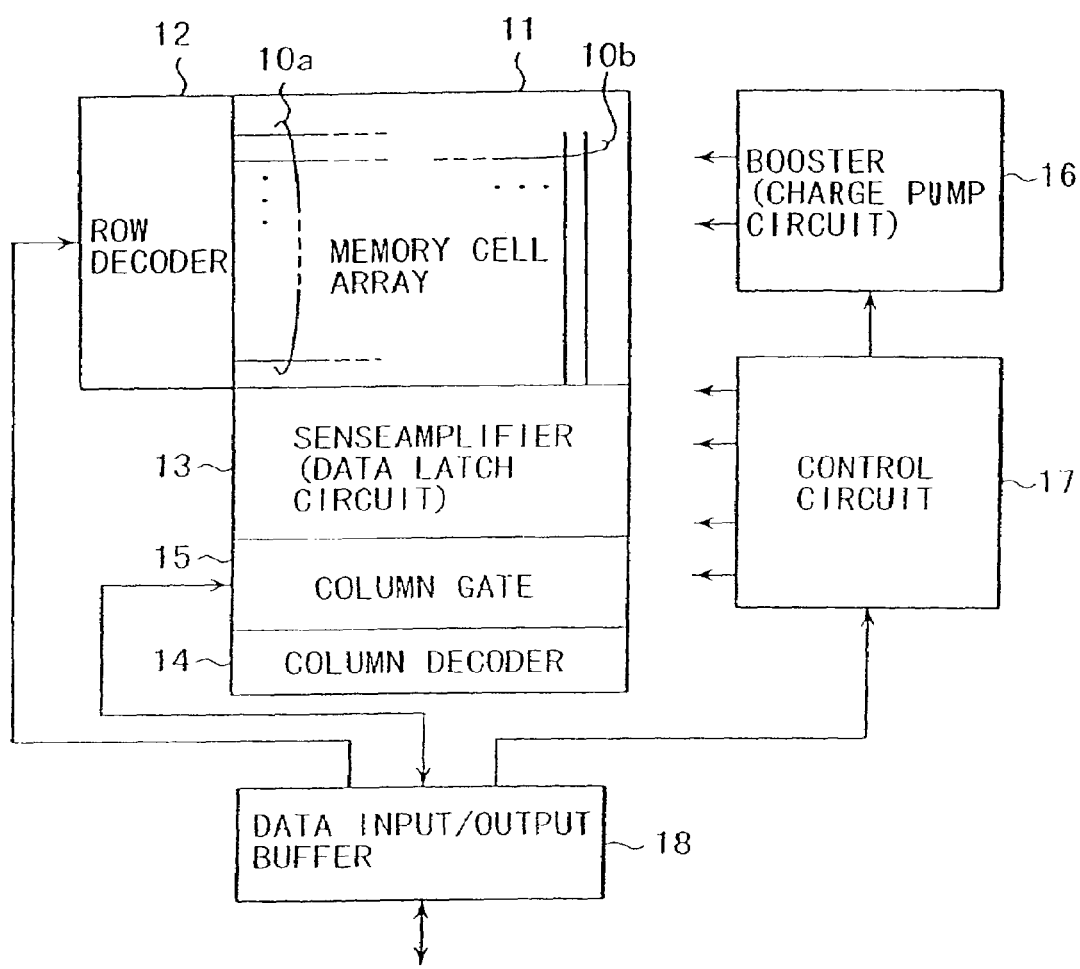
FIG. 8 is a block diagram showing the main portion of the byte EEPROM of the present invention.

FIG. 8 is a block diagram showing the main portion of the byte EEPROM of the present invention.

This EEPROM has a memory cell array 11 in which memory cell units each formed from three elements, i.e., one memory cell sandwiched by two select transistors, a plurality of control gate lines 10a extending in the row direction on the memory cell array 11, and a plurality of bit lines 10b extending in the column direction on the memory cell array 11.

A row decoder 12 selects a row, i.e., one of the control gate lines 10a. Data of memory cells connected to the selected control gate line 10a are input to sense amplifiers 13 each formed from a sense amplifier having a data latch function and arranged in units of columns. A column decoder 14 selects a column, i.e., the bit line BLi.

Data of the sense amplifier of the selected column is output from the memory chip via a data input/output buffer 18. Data input to the memory chip is latched by the sense amplifier of the selected column, which has the latch function, via the data input/output buffer 18.

A booster 16 generates a high voltage necessary for the program operation or erase operation. A control circuit 17 controls the operation of each circuit in the memory chip and also serves as an interface between the internal and external circuits of the memory chip. The control circuit 17 includes a sequence control means (e.g., a programmable logic array) for controlling the erase, program, and read operations for a memory cell.

Figure 9:
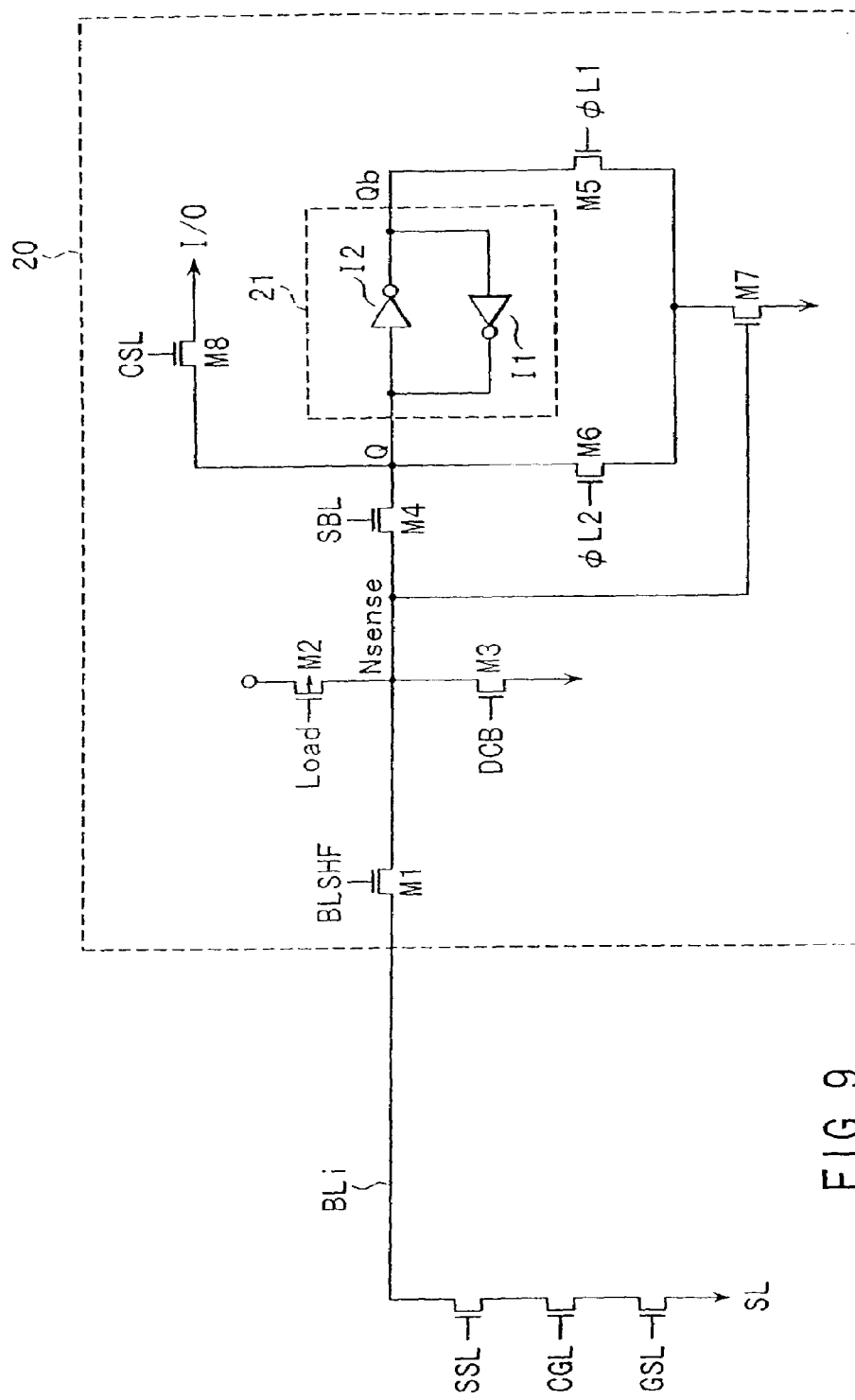
FIG. 9 is a circuit diagram showing a sense amplifier shown in FIG. 8.

FIG. 9 shows one of the sense amplifiers 13 shown in FIG. 8, which is connected to one bit line BLi and has the latch function.

The sense amplifier is mainly constructed by a latch circuit 21 having two CMOS inverters I1 and I2. The output of one inverter is input to the other inverter. A latch node Q of the latch circuit 21 is connected to the I/O line via a column selection NMOS transistor M8. The latch node Q is also connected to the bit line BLi via a sense amplifier disconnection NMOS transistor M4 and bit line potential clamp NMOS transistor M1.

The connection node between the NMOS transistors M1 and M4 is a sense node Nsense. The sense node Nsense is connected to a precharge PMOS transistor M2 and discharge NMOS transistor M3. The precharge PMOS transistor M2 charges the sense node Nsense in a predetermined period on the basis of a precharge control signal Load. The discharge NMOS transistor M3 discharges the sense node Nsense on the basis of a discharge control signal DCB.

A latch node Qb of the latch circuit 21 is connected to a reset NMOS transistor M5 for forcibly grounding the latch node Qb on the basis of a control signal φL1. The latch node Q of the latch circuit 21 is connected to a reset NMOS transistor M6 for forcibly grounding the latch node Q on the basis of a control signal φL2.

The common source of the reset NMOS transistors M5 and M6 is connected to ground via a sense NMOS transistor M7 controlled by the potential of the sense node Nsense. The sense NMOS transistor M7 is also used to reset the latch circuit 21 together with the NMOS transistors M5 and M6.

Figure 10:
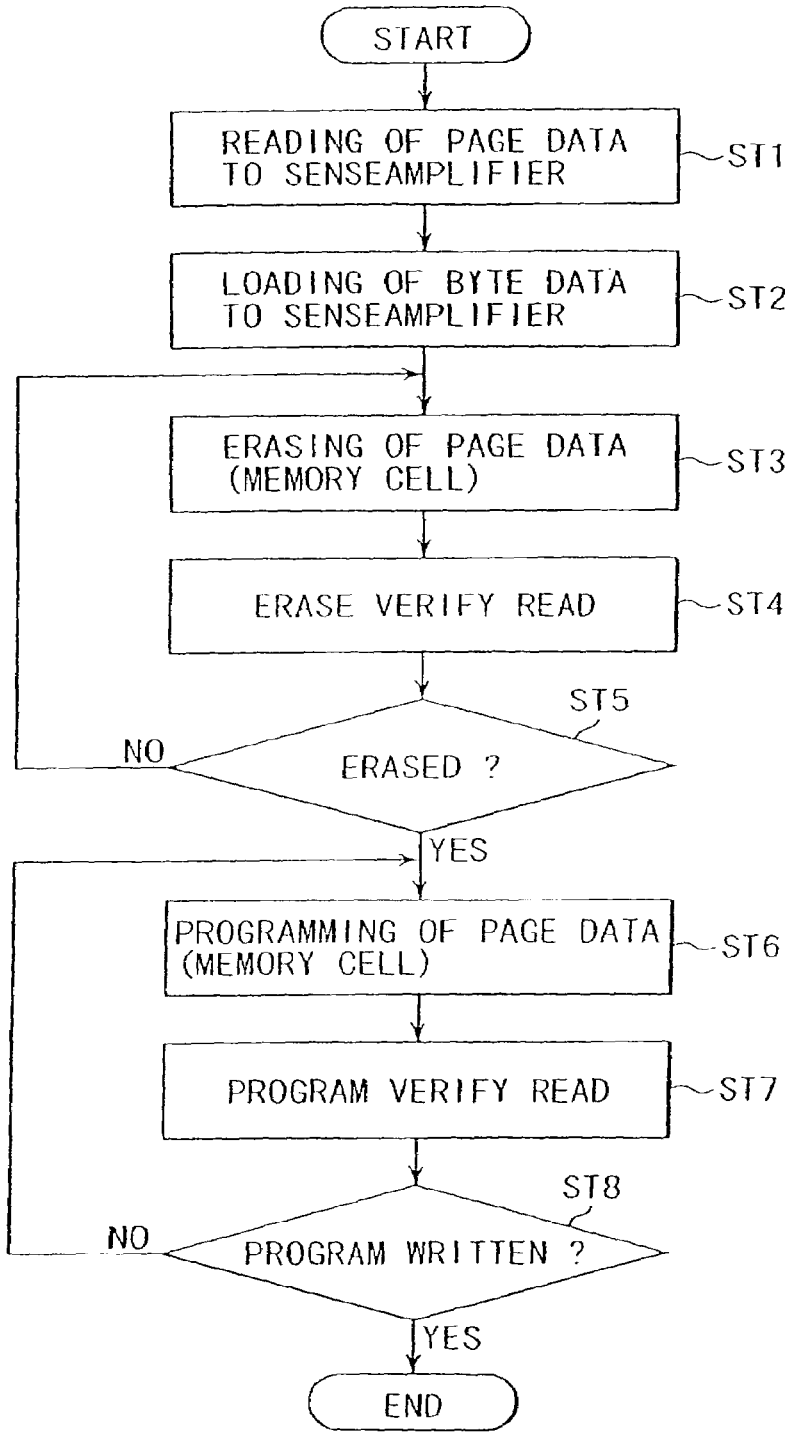
FIG. 10 is a flow chart showing the data change operation for byte data of the present invention.

FIG. 10 is a schematic flow chart showing the data change operation for byte data of the byte EEPROM of the present invention.

The sequence operation shown in this flow chart is controlled by the control circuit 17 shown in FIG. 8. The data change operation for byte data will be described with reference to this flow chart.

In the byte data change mode, data of one page of memory cells connected to a selected control gate line (word line) are read out to the sense amplifiers (page read). The sense amplifiers latch the data of one page (step ST1).

Byte data corresponding to columns designated by addresses is loaded. The loaded byte data is superscribed on byte data in the data of one page latched by the sense amplifiers, which is subjected to data change (step ST2).

The data of one page of the memory cells connected to the selected control gate line are simultaneously erased (page erase) (step ST3). After the erase, an erase verify is performed to verify whether all the memory cells connected to the selected control gate line are completely erased or over-erased (steps ST4 and ST5).

The page erase and erase verify are repeated until the threshold values of all the memory cells of the page fall within a predetermined range. When the threshold values of all the memory cells of the page fall within the predetermined range (completion of erase), the flow advances to the next operation (steps ST3 to ST5).

When only one sense amplifier having the latch function is connected to one bit line (only one page is present), the data in the sense amplifier may be destroyed depending on the result of the erase verify. In this case, the erase is performed only once without an erase verify.

After this, data of one page latched by the sense amplifiers are simultaneously programmed in the memory cells connected to the selected control gate line (step ST6). After programming, a program verify is performed to verify whether the data are completely programmed or over-programmed in the memory cells connected to the selected control gate line (steps ST7 and ST8).

The page program and program verify are repeated until the threshold values of all the memory cells of the page fall within a predetermined range. When the threshold values of all the memory cells of the page fall within the predetermined range (completion of programming), the data change operation for byte data is ended.

When data are to be programmed only once using a high program potential in accordance with one program pulse, the program verify may be omitted.

FIGS. 11 to 14 show the data of the selected memory cells and the states of the node Qb (FIG. 9) in the main processes in FIG. 10.

Figure 11:
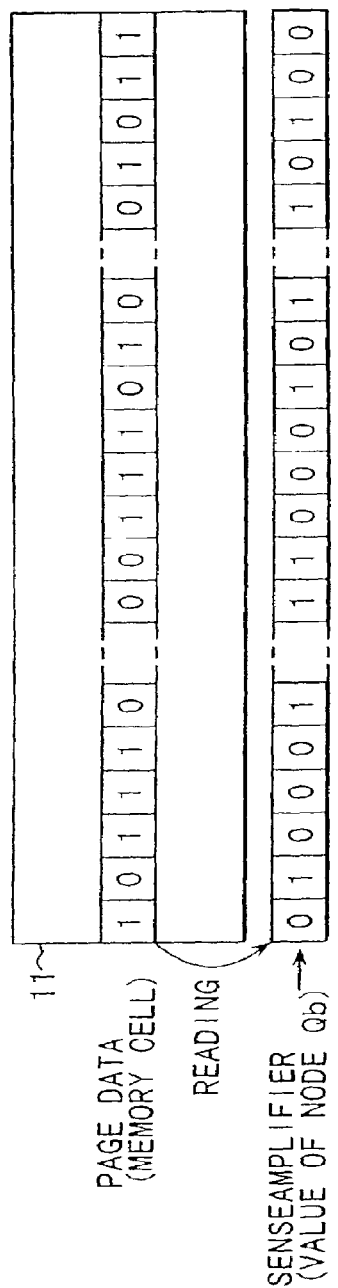
FIG. 11 is a view showing reading of data in the sequence shown in FIG. 10.

FIG. 11 shows a state wherein data of one page of the memory cells connected to the selected control gate line (word line) are read to the sense amplifiers (corresponding to step ST1).

When the data of a memory cell is at "0" (the threshold voltage is positive), the bit line BLi is not discharged and maintains the precharge potential. The sense node Nsense shown in FIG. 9 has the power supply potential VCC. When the control signal φL2 is at the power supply potential VCC, the node Q is at a ground potential VSS, i.e., "0".

When the data of a memory cell is at "1" (the threshold voltage is negative), the bit line BLi is discharged. The sense node Nsense shown in FIG. 9 has the ground potential VSS. When the control signal φL2 is at the power supply potential VCC, the node Q is at the power supply potential VCC, i.e., "1".

Figure 12:
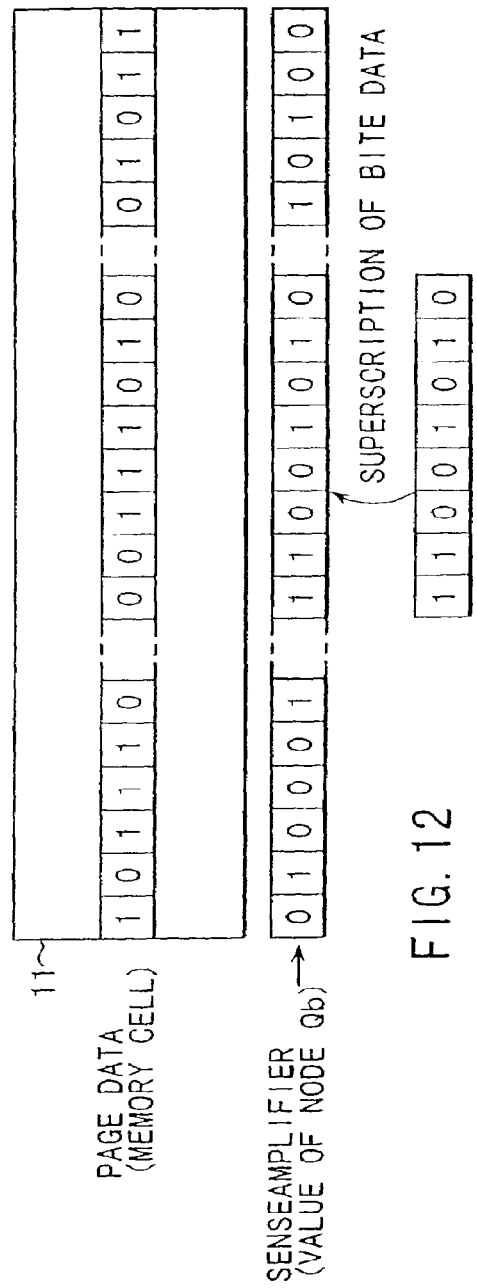
FIG. 12 is a view showing superscription of byte data in the sequence shown in FIG. 10.

FIG. 12 shows a state wherein data is superscribed on byte data (8-bit data) designated by addresses in the data of one page latched by the sense amplifiers (corresponding to step ST2).

FIG. 13 shows a state wherein the data of the memory cells connected to the selected control gate line (word line) are erased (page erase) (corresponding to step ST3). The data of the memory cells connected to the selected control gate line are set at "1" by the page erase.

FIG. 14 shows a state wherein the data of one page latched by the sense amplifiers are programmed in the memory cells connected to the selected control gate line (word line) (corresponding to step ST6).

In the memory cell array 11, the data change operation for page data is performed. In fact, the data change operation for byte data is performed.

The read operation for the page program and program verify will be described next in detail with reference to the timing charts in FIGS. 15 and 16 with emphasis on the operation of the sense amplifier shown in FIG. 9.

Figure 15:
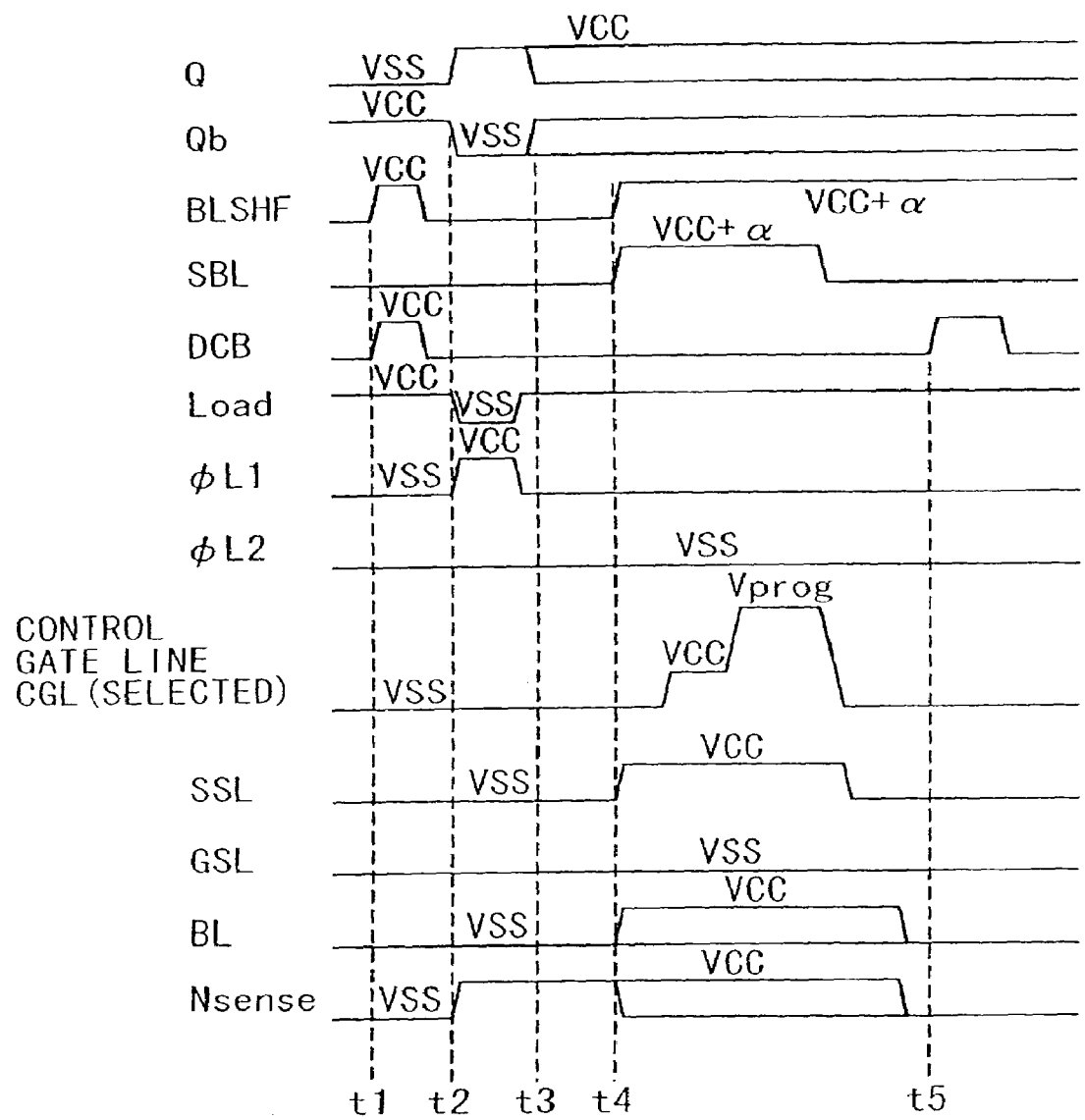
FIG. 15 is a timing chart showing the data change operation for page data of the present invention.
Figure 16:
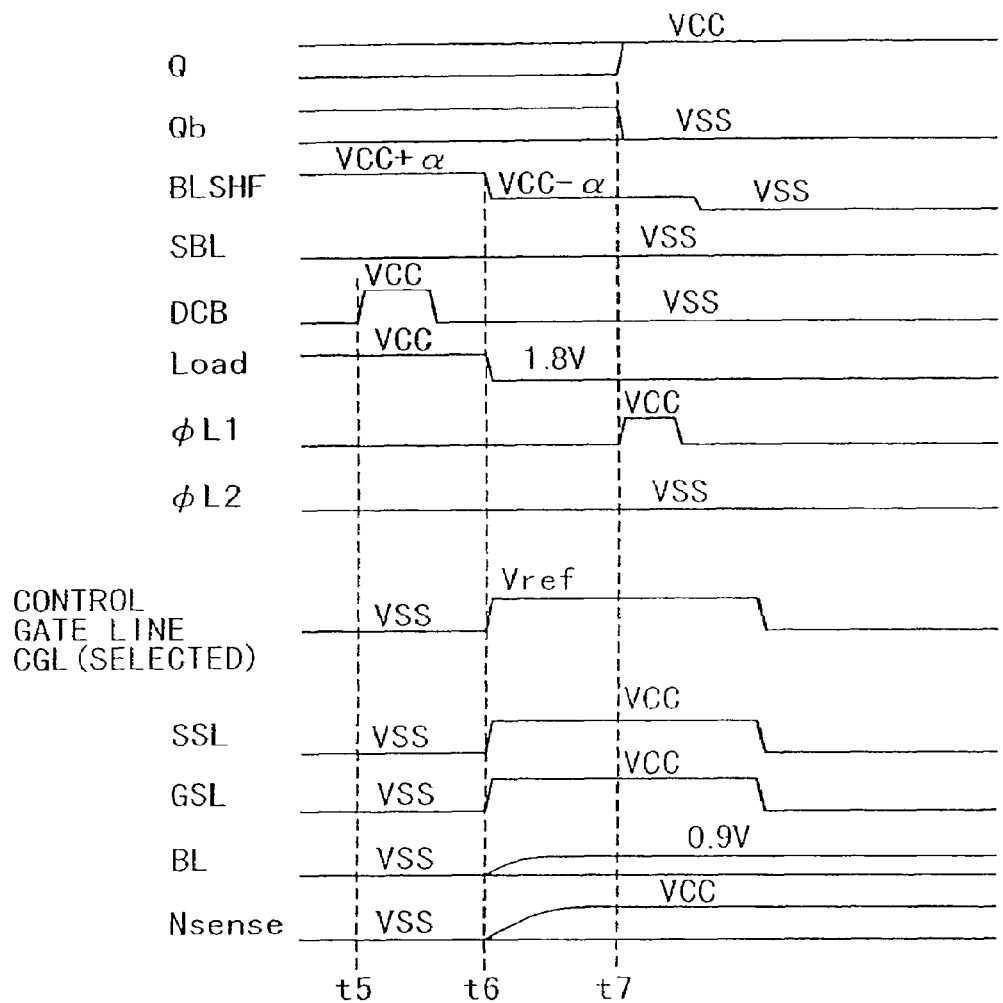
FIG. 16 is a timing chart showing the data change operation for page data of the present invention.

FIGS. 15 and 16 show two divisions of one timing chart, and t5 in FIG. 15 and t5 in FIG. 6 represent the same time. That is, waveforms at the second half of FIG. 15 partly overlap those at the first half of FIG. 16.

When a command for instructing programming is input from an external circuit to an internal circuit of the chip, the program operation is started.

To reset the sense node Nsense, the control signal DCB is set at the power supply potential VCC. The MOS transistor M3 is turned on to ground the sense node Nsense (t1).

A control signal BLSHF is also set at the power supply potential VCC together with the control signal DCB. The MOS transistor M1 is turned on to ground the bit line BLi.

Before program data are loaded to the sense amplifiers, the data latch control signal φL1 is set at the power supply potential VCC, and the precharge control signal Load is set at the ground potential VSS. The MOS transistors M5 and M7 are turned on to forcibly ground the latch node Qb of the latch circuit 21 and reset data. More specifically, in each of the sense amplifiers 20, the latch node Q of the latch circuit 21 is set at the power supply potential VCC, and the latch node Qb is set at the ground potential VSS (t2).

The program data are loaded from the I/O line and latched by the latch circuits 21 of the sense amplifiers 20. The nodes Q and Qb are set at "H" or "L" level in accordance with the loaded data (t3).

More specifically, in the latch circuit 21 of a sense amplifier corresponding to a memory cell for "0" programming, "L" level (=VSS) is applied to the latch node Q. In the latch circuit 21 of a sense amplifier corresponding to a memory cell for "1" programming (program inhibit), "H" level (=VCC) is applied to the latch node Q.

When the control signals BLSHF and SBL are at "H" level, charge of each bit line is started on the basis of the data latched by the latch circuit 21 of a corresponding sense amplifier 20 (t4).

More specifically, the bit line BLi connected to a memory cell for "0" programming is set at the ground potential VSS. The bit line connected to a memory cell for "1" programming (program inhibit) is charged to the power supply potential VCC. The selected control gate line (word line) is set at the program voltage Vprog (about 20V).

With this operation, the memory cells of one page are programmed.

After the data program is ended, the program verify is started to verify whether the data program is completely performed.

The program verify read is performed. This verify read operation is the same as the normal read operation.

When the control signal DCB is set at the power supply potential VCC, the MOS transistor M3 is turned on to forcibly ground the sense node Nsense (t5).

When a reference potential Vref (about 0.5V) is applied to the selected control gate line CGL, and the power supply potential VCC is applied to the select gate lines SSL and GSL, the verify read is performed (t6).

For the read, bit line precharge sensing scheme or current detection sensing scheme can be used. In the bit line precharge sensing scheme, the bit line BLi is precharged and floated, and then, the potential of the bit line is maintained or dropped in accordance with data of a memory cell. The current detection sensing scheme will be described below in detail.

At time t6, the control signal BLSHF is clamped from the boosted potential VCC+α to a potential VCC−α. Data is read on the basis of the balance between the memory cell current flowing to the MOS transistor M1 and the current of the MOS transistor M2 for charging the sense node Nsense. When the potential of the bit line BLi increases to, e.g., 0.9V, the MOS transistor M1 is cut off, and the sense node Nsense is set at the power supply potential VCC.

After the sense node Nsense is at "H" level (=VCC), the latch control signal φL1 is set at the power supply potential VCC to turn on the MOS transistor M5 (t7). When the sense node Nsense is at the power supply potential VCC (in a sense amplifier connected to a memory cell having a threshold voltage higher than the verify potential Vref), the MOS transistor M7 is turned on to set the latch node Qb at the ground potential VSS and the latch node Q at the power supply potential VCC.

When the ground potential VSS is loaded to the latch node Q, and programming is properly performed, the latch data of the latch circuit 21 is inverted. If programming in the memory cell is insufficient, the sense node Nsense remains "L" level (=VSS) in the verify read. For this reason, the data of the latch circuit 21 is not inverted, and the latch node Q keeps the ground potential VSS. In a sense amplifier connected to a program inhibit memory cell, the latch node Q is at the power supply potential VCC, and no data inversion occurs.

When a memory cell is insufficiently programmed, i.e., when data of the latch circuit 21 of a sense amplifier is not inverted, programming and verify read are repeated. When the potentials of the latch nodes Q of all sense amplifiers of one page are set at the power supply potential VCC, programming is ended.

The data change operation for byte data will be described next in detail with reference to the timing chart shown in FIG. 17 with emphasis on the operation of the sense amplifier shown in FIG. 9.

When a command for instructing the byte data change mode is input from an external circuit to an internal circuit of the chip, the data change operation for byte data starts.

A read of data already programmed in memory cells of one page, which are connected to the selected control gate line (word line), is started.

The data latch control signal $\phi L1$ is set at the power supply potential VCC, and the precharge control signal Load is set at the ground potential VSS. The MOS transistors M5 and M7 are turned on to forcibly ground the latch node Qb of each latch circuit 21 and reset the data. More specifically, in each of the sense amplifiers, the latch node Q of the latch circuit 21 is set at the power supply potential VCC, and the latch node Qb is set at the ground potential VSS (t1).

The control signal DCB is set at the power supply potential VCC. The MOS transistor M3 is turned on to forcibly ground the sense node Nsense (t2). When the ground potential VSS (=0V) is applied to the selected control gate line CGL, and the power supply potential VCC is applied to the select gate lines SSL and GSL, the read is performed (t3).

After the sense node Nsense is at "H" level (=VCC), the latch control signal $\phi L2$ is set at the power supply potential VCC to turn on the MOS transistor M6 (t4). When the sense node Nsense is at the power supply potential VCC (i.e., in a sense amplifier connected to a memory cell having data "0" and a threshold voltage higher than the ground potential VSS), the MOS transistor M7 is turned on to set the latch node Q at the ground potential VSS and the latch node Qb at the power supply potential VCC.

Next, the control signal DCB is set at the power supply potential VCC, and the control signal BLSHF is set at the power supply potential VCC or the potential VCC+α to reset the bit line BLi and sense node Nsense (t5).

After this, byte data is loaded to the latch circuit 21 of the sense amplifier 20 designated by a column address. The nodes Q and Qb are set at "H" or "L" level in accordance with the loaded data (t6).

The byte data input from the external circuit of the chip is superscribed on predetermined data of page data programmed in the latch circuit 21.

After this, the page erase operation is performed for the memory cells connected to the selected control gate line.

The control gate line of the selected block is set at the ground potential VSS. The control gate lines of unselected blocks and all select gate lines are set in the floating state. When the erase voltage Vera is applied to the cell P-well, the select gate lines and the control gate lines of the unselected blocks, which are in the floating state, are boosted to Vera×β (β is the coupling ratio) by the capacitive coupling with the cell P-well.

The bit line BLi and cell source line SL are connected to the N$^+$-type layer in the cell P-well. When the p-n junction between the N$^+$-type layer and cell P-well is forward-biased, the bit line BLi and cell source line SL are charged to Vera−Vb (t7) Vb is the built-in potential of the p-n junction.

After this, the erase verify is performed to confirm that all the memory cells of the selected page are in the erase state, i.e., the threshold voltage of each memory cell becomes negative. On the basis of the data stored in the latch circuit 21, the program operation and program verify operation are performed for each memory cell of the selected page.

Figure 17:
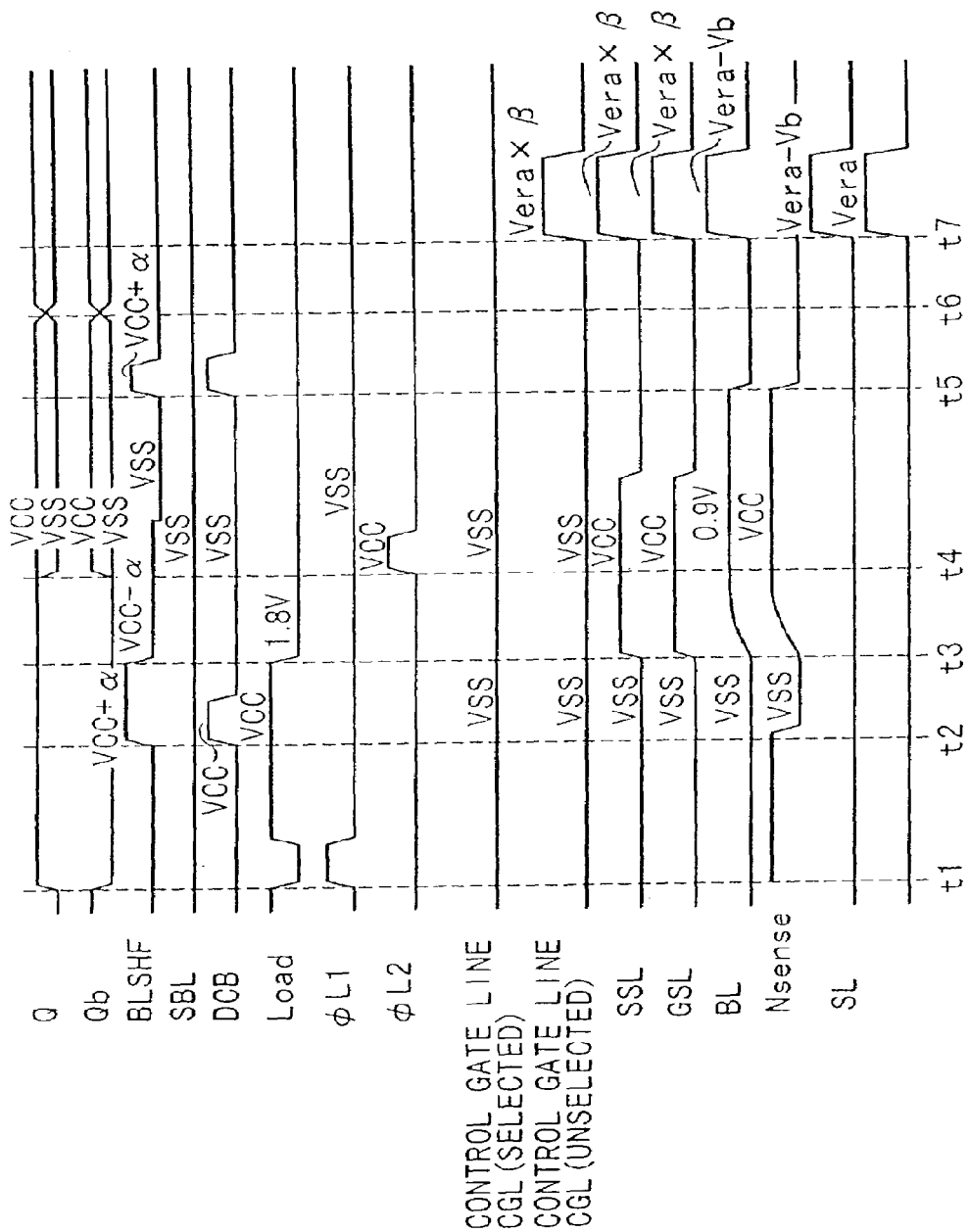
FIG. 17 is a timing chart showing the data change operation for byte data of the present invention.

The operation after the erase verify is not illustrated in FIG. 17.

Figure 18:
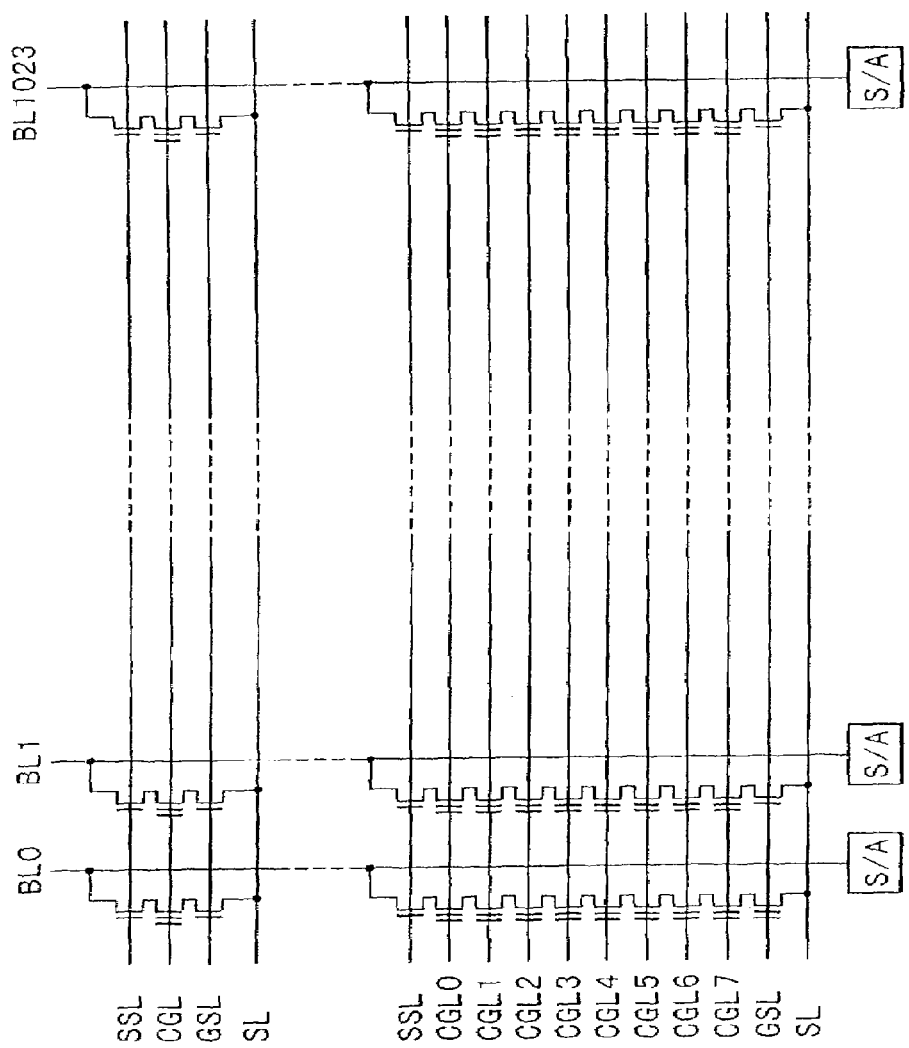
FIG. 18 is a view showing a modification of the memory cell array of the byte EEPROM of the present invention.

FIG. 18 shows an example in which a NAND flash EEPROM partially has the memory cell array of the byte EEPROM of the present invention.

The byte EEPROM of the present invention can be regarded as a NAND flash EEPROM whose memory cell array has only one memory cell between two select transistors. Hence, the EEPROM of this example can be easily realized.

In the EEPROM of this example, memory cell units of two types with different structures are connected to one bit line BLi. More specifically, the first memory cell unit has a plurality of (e.g., 4, 8, 16, or 32) memory cells connected between two select transistors. The second memory cell unit has one memory cell connected between two select transistors.

To select a control gate line (word line), a drive circuit may be prepared for each of the first and second memory cell unit regions. If possible, the two regions may share one drive circuit.

The following memory cell array may be employed in place of the memory cell array of the NAND flash EEPROM shown in FIG. 18.

Figure 19:
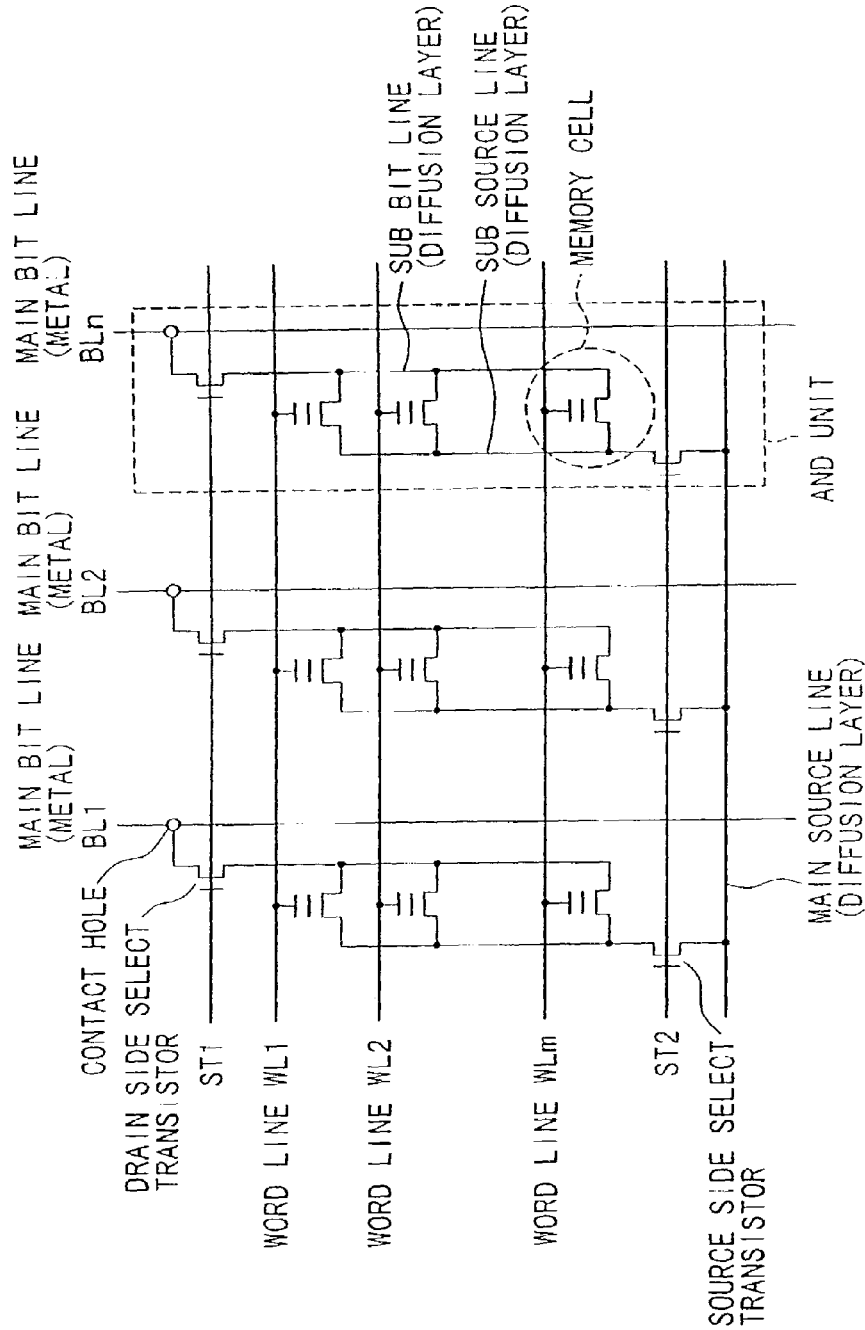
FIG. 19 is a view showing another modification of the memory cell array of the byte EEPROM of the present invention.
Figure 22:
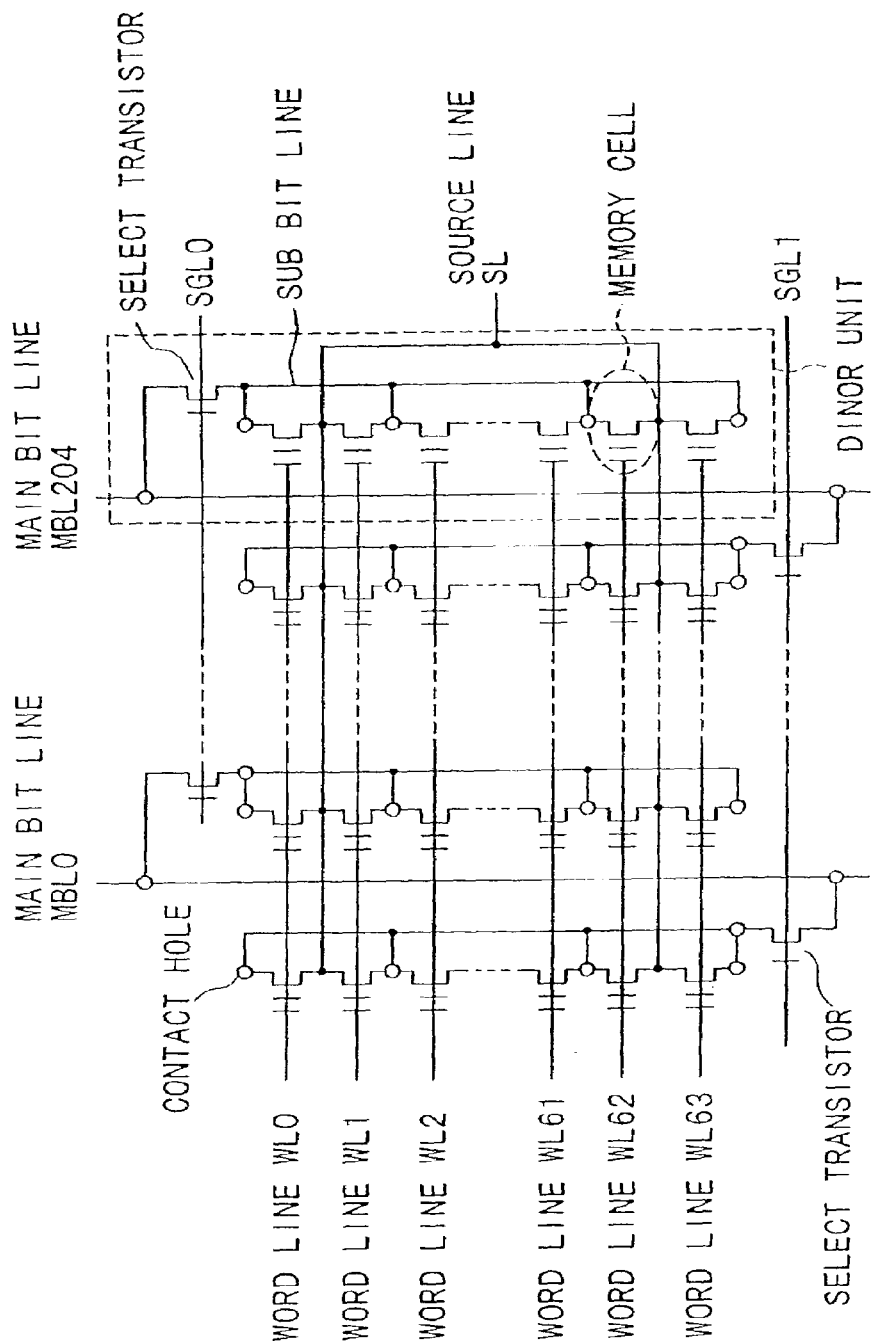
FIG. 22 is a view showing still another modification of the memory cell array of the byte EEPROM of the present invention.

FIG. 19 shows the memory cell array of an AND flash EEPROM. FIG. 22 shows the memory cell array of a DINOR flash EEPROM.

The AND unit of the AND flash EEPROM shown in FIG. 19 has a plurality of memory cells connected in parallel between a sub bit line and a sub source line. The sub bit line is connected to a main bit line via a drain-side select transistor. The sub source line is connected to a main source line via a source-side select transistor.

For example, in a 64-Mbit AND flash EEPROM, one AND unit is formed from 128 memory cells (m=128) and two select transistors.

As the characteristic feature of this memory cell array, the bit lines (data lines) and source lines have a hierarchical structure. The bit lines and source lines are formed from main lines and sub lines, respectively. The sub lines have a pseudo contactless structure formed from diffusion layers.

Data is programmed/erased in/from a memory cell by the F-N (Fowler-Nordheim) tunneling current.

Figure 20:
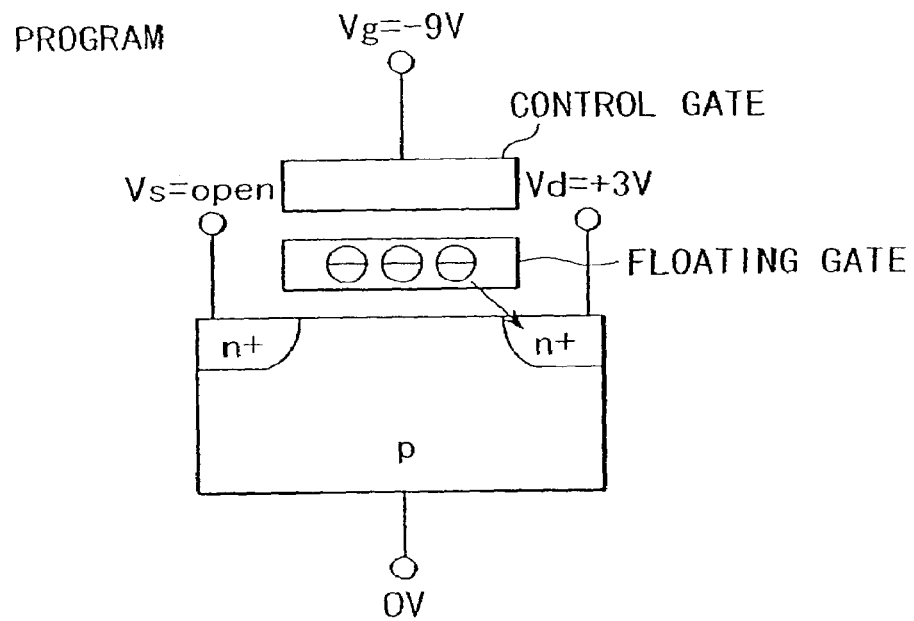
FIG. 20 is a view showing the program operation of a stacked gate memory cell.
Figure 21:
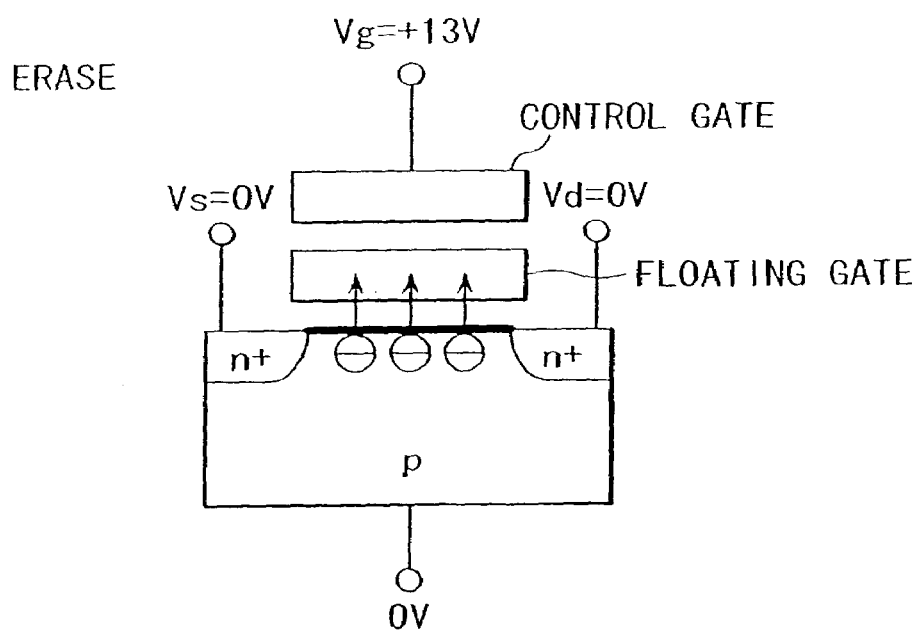
FIG. 21 is a view showing the erase operation of the stacked gate memory cell.

As shown in FIG. 20, data is programmed by removing electrons from the floating gate to the drain using the F-N tunneling current. As shown in FIG. 21, data is erased by injecting electrons from the substrate (entire channel surface) to the floating gate using the F-N tunneling current.

The characteristic features of the DINOR (Divided Bit Line NOR) flash EEPROM shown in FIG. 22 are as follows. This EEPROM can operate using a single power supply, like a NAND flash EEPROM. The change rate is high, and the memory size is small. High-speed random access is possible, as in a NOR flash EEPROM.

A memory cell unit of the DINOR flash EEPROM has the hierarchical structure of a main bit line and sub bit line in the memory cell array, and in terms of size, almost equals the AND unit of the AND flash EEPROM. The memory cell has a stacked gate structure, as in the NOR flash EEPROM or NAND flash EEPROM. The drain of a memory cell is connected to a sub bit line formed from polysilicon.

For example, in a 16-Mbit DINOR flash EEPROM, 64 memory cells are connected to a sub bit line. When a contact to each memory cell is achieved by a so-called buried contact between polysilicon and the diffusion layer, the memory cell size can be reduced.

The data program/erase mechanism in the memory cell is the same as that of the AND flash EEPROM and uses the F-N tunneling current.

More specifically, data is programmed in the memory cell by removing electrons from the floating gate to the drain using the F-N tunneling current. Data is erased by injecting electrons from the substrate (entire channel surface) to the floating gate using the F-N tunneling current.

The sense amplifier shown in FIG. 9 is connected to the main bit line shown in FIGS. 19 or 22. The data change operation for byte data is executed on the basis of the flow chart shown in FIG. 10.

As described above, even in the EEPROM having a memory cell array as shown in FIGS. 18, 19, or 22, the data change operation for byte data can be performed for each memory cell unit of the memory cell array by employing the data change scheme shown in the flow chart of FIG. 10.

In the memory cell of the byte EEPROM of the present invention, shown in FIGS. 1C, 1D and 2B, the select transistor on the bit line side may be omitted, and the memory cell unit may be formed from one memory cell transistor and one source-side select transistor. In this case, in the data program mode, a middle voltage Vm for program inhibit, which is about ½ the program voltage Vprog, is applied to the program inhibit bit line on the basis of the data of the sense amplifier.

Conventionally, a memory cell called an SONOS (Silicon-Oxide-Nitride-Oxide-Silicon) cell is known. As the characteristic feature of this memory cell, data ("0" or "1") is specified on the basis of the amount of electrons trapped by the silicon nitride film immediately under the gate electrode (word line).

A SONOS cell is disclosed in, e.g., reference 4 (A. Lancaster et al., "A 5V-Only EEPROM with Internal Program/Erase Control", IEEE International Solid-State Circuits Conference, pp. 164-165, February 1983).

The memory cell unit in reference 4 is constructed by one memory cell and two select transistors sandwiching the memory cell. Reference 4 also indicates that the data change operation for byte data can be performed in the SONOS cell ("LOAD-LATCHES-ROW-ERASE operation", lines 31 to 40, left column, p. 164).

However, reference 4 has not specifically disclosed the data change operation for byte data. That is, the actual method of data change operation for byte data is not clear. In addition, the memory cell disclosed in reference 4 has no stacked gate structure, unlike the flash EEPROM, but a structure in which the gate of the memory cell and the gates of the select transistors overlap.

The present invention can provide a remarkable effect different from those of the conventional NAND flash EEPROM and the memory cell in reference 4.

More specifically, as described above, after the program or erase, a memory cell has the threshold voltage distribution shown in FIGS. 6 or 7. In the conventional NAND flash EEPROM, the upper and lower limits of the threshold voltage distribution of data "0" or "1" are predetermined. The threshold voltage of each data must be set within a predetermined range by the verify. The memory cell in reference 4 has an SONOS structure. Since the electron trapping amount of the silicon nitride film is almost predetermined, it is difficult to freely shift the threshold voltage distribution of the memory cell (see e.g., W. D. Brown et al., "Nonvolatile Semiconductor Memory Technology", IEEE Press Series on Microelectronic Systems Stu Tewksbury, Series Editor, p. 70, p. 212, p. 316, p. 326, p. 327, and p. 344).

According to the present invention, by, e.g., adjusting the program or erase time or the voltage, the threshold voltage distribution of data "1" and that of data "0" can be sufficiently separated from each other in FIGS. 6 or 7. More specifically, the margin (gap) between the threshold voltage distribution of data "1" and that of data "0" can be increased to sufficiently program or erase data, thereby preventing any read error. In addition, since there are no upper and lower limits of the threshold voltage distribution of each data, no verify is required, and a so-called "only one program" and "only one erase" can be performed.

Figure 23:
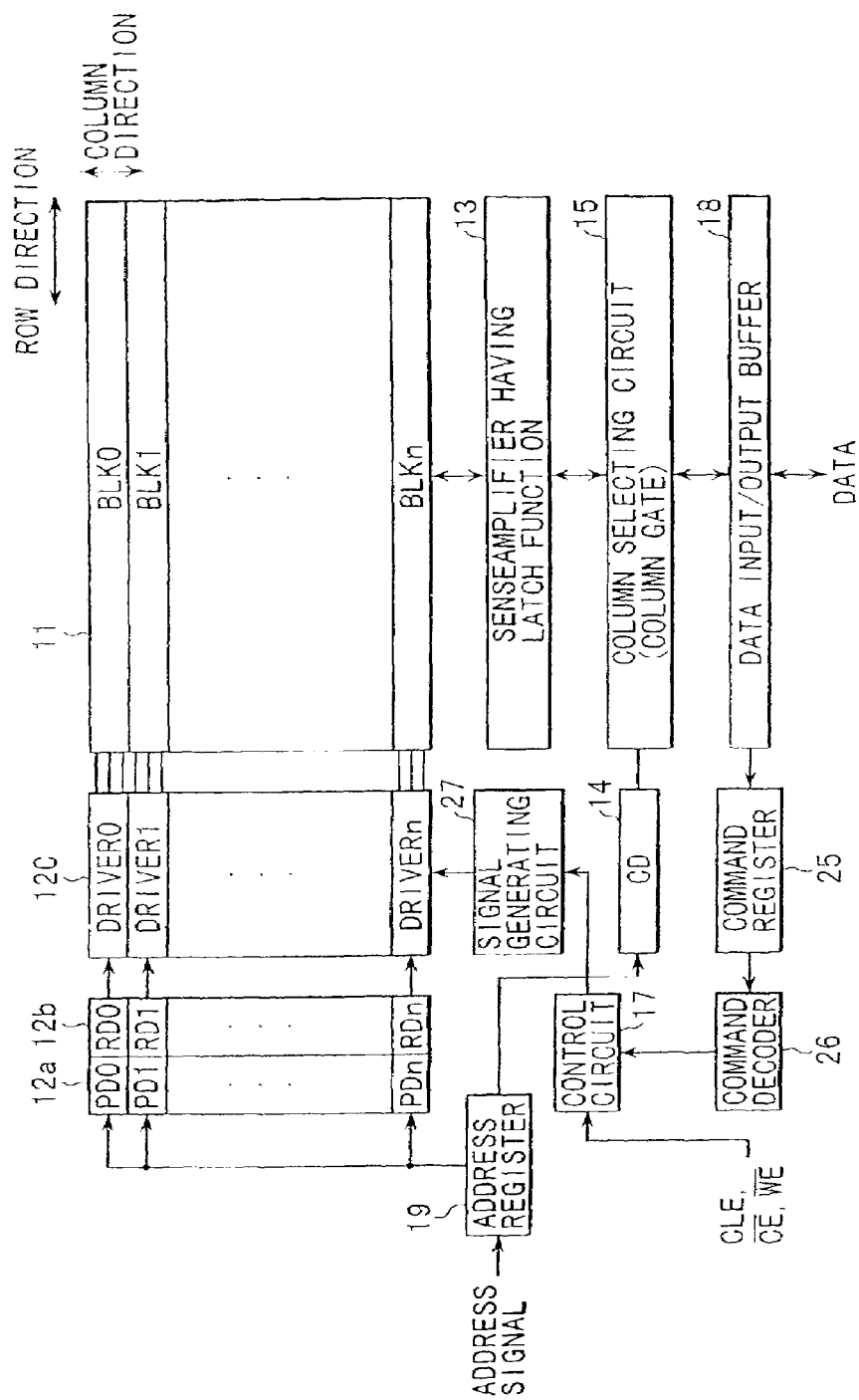
FIG. 23 is a block diagram showing an example of the byte EEPROM of the present invention.
Figure 24:
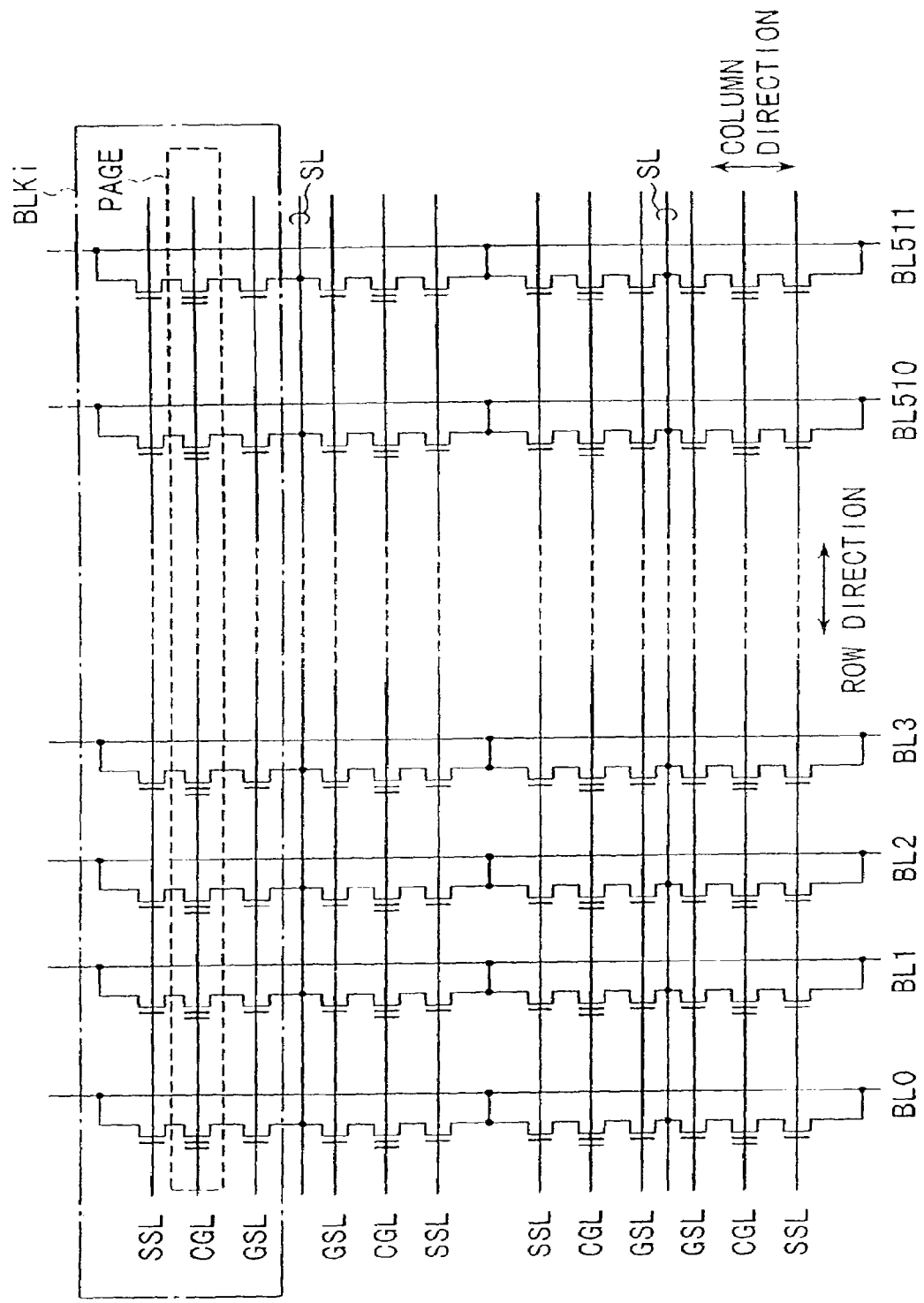
FIG. 24 is a view showing the memory cell array in FIG. 23.

FIG. 23 shows an example of the circuit block of the byte EEPROM of the present invention. FIG. 24 shows part of the memory cell array 11 in FIG. 23.

The circuit block of this example is applied to an EEPROM having the memory cell array shown in FIG. 3 and is similar to the circuit block of the NAND EEPROM.

In the present invention, a memory cell unit is formed from three elements, i.e., one memory cell and two select transistors sandwiching the memory cell. One block BLKi (i=0, 1, . . . , n) has memory cells connected to one control gate line CGL, i.e., memory cells of one page.

A control gate/select gate driver 12c is prepared in correspondence with one block BLKi (i=0, 1, . . . , n), i.e., one control gate line CGL (one page) Each driver 12c has a booster. A predecoder 12a and row decoder 12b are also prepared in correspondence with one block BLKi, i.e., one control gate line CGL (one page).

A row address signal is input to the predecoder 12a via an address register 19. The predecoder 12a and row decoder 12b select one row (or one block). When the block BLKi is selected, the driver 12c applies predetermined potentials corresponding to the operation mode to the control gate line CGL and select gate lines SSL and GSL in the selected block BLKi (Tables 3 and 4).

The sense amplifier 13 having the latch function latches read data or program data. Read data (output data) is output from the memory chip via a column selecting circuit 15 and the data input/output buffer 18. Program data (input data) is latched by the sense amplifier 13 having the latch function via the data input/output buffer 18 and column selecting circuit 15.

A command signal is input to a command decoder 26 via the data input/output buffer 18 and a command register 25. The output signal from the command decoder 26, a command latch enable signal CLE, a chip enable signal $\overline{CE}$, or a write enable signal $\overline{WE}$ is input to the control circuit 17.

A signal generating circuit (booster) 27 generates potentials to be applied to the control gate line CGL and select gate lines SSL and GSL and supplies the potentials to the control gate/select gate driver 12c under the control of the control circuit 17.

Figure 25:
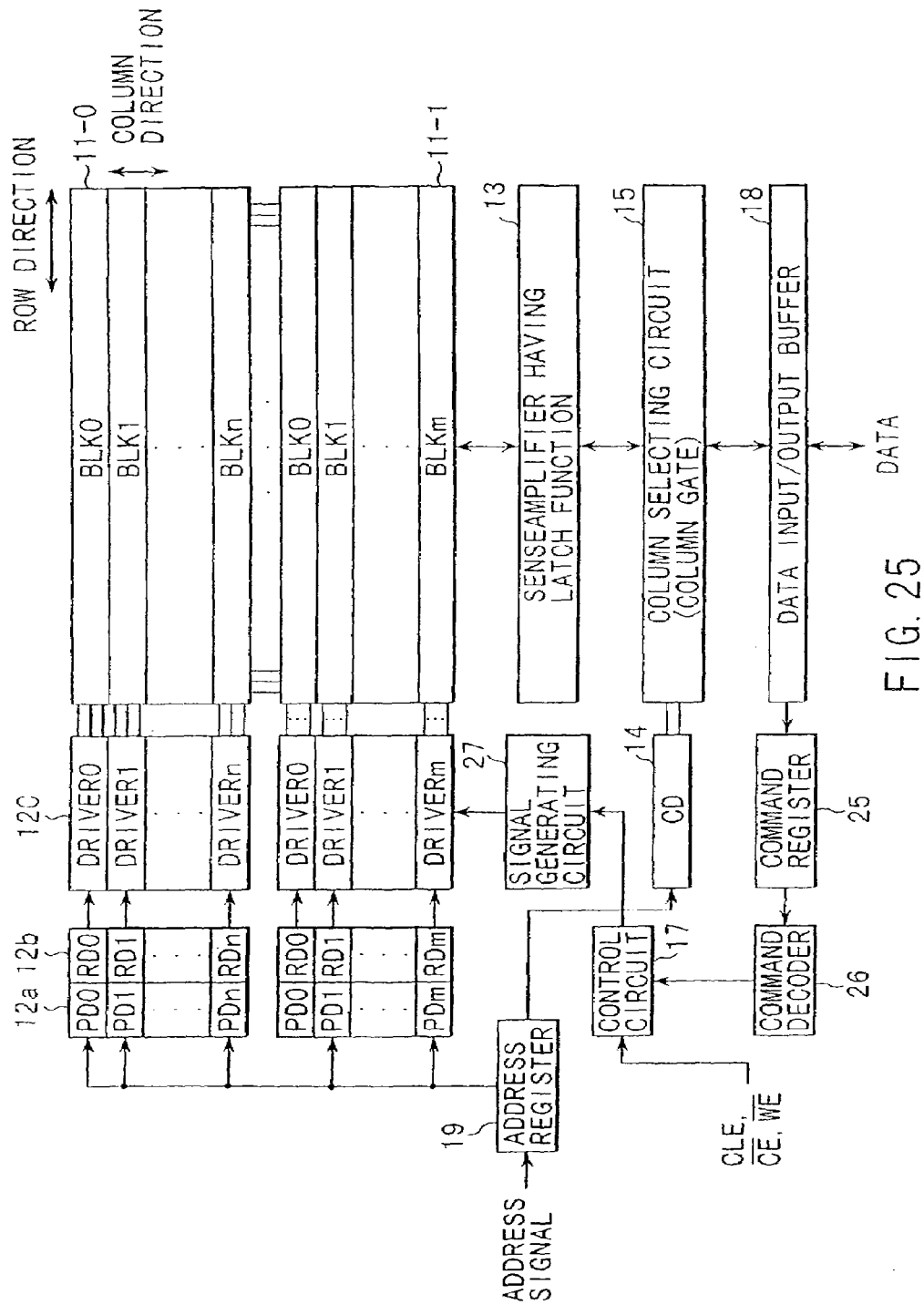
FIG. 25 is a block diagram showing another example of the byte EEPROM of the present invention.
Figure 26:
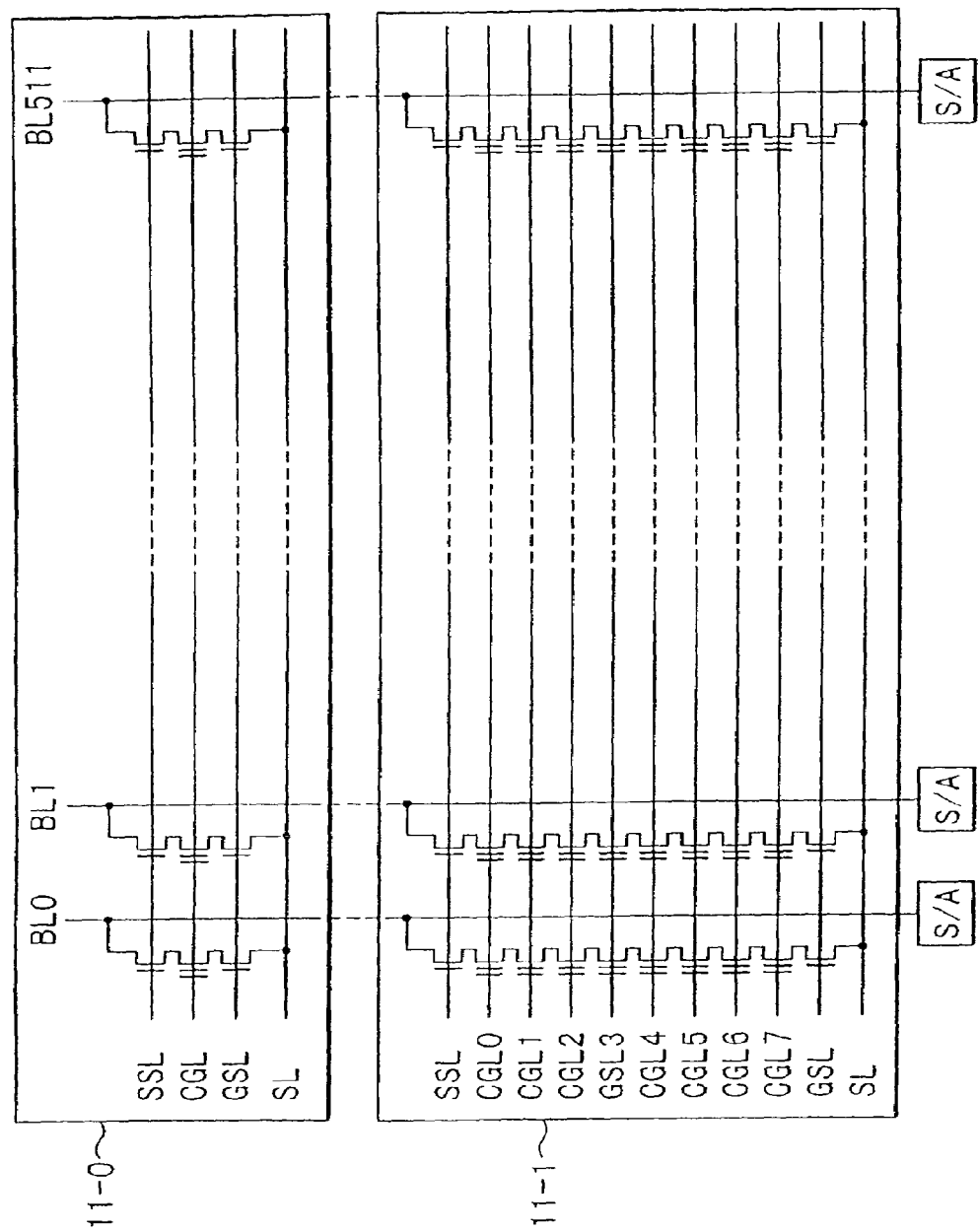
FIG. 26 is a view showing the memory cell array in FIG. 24.

FIG. 25 shows another example of the circuit block of the byte EEPROM of the present invention. FIG. 26 shows part of the memory cell array 11 in FIG. 25.

The circuit block of this example is applied to an EEPROM having the memory cell array shown in FIG. 18.

The memory cell array is comprised of a 3-tr cell section 11-0 having memory cell units of the present invention and a NAND cell section 11-1 having NAND cell units.

The 3-tr cell section 11-0 has memory cell units each having three elements, i.e., one memory cell and two select transistors sandwiching the memory cell, and is divided into n blocks BLK0, BLK1, . . . , BLKn. The NAND cell section 11-1 has NAND cell units each having a plurality of (e.g., 4, 8, or 16) memory cells serially connected and two select transistors sandwiching the memory cells, and is divided into m blocks BLK0, BLK1, . . . , BLKm.

Each block BLKi (i=0, 1, . . . , n) of the 3-tr cell section 11-0 has memory cells connected to one control gate line CGL, i.e., memory cells of one page. Each block BLKi (i=0, 1, . . . , m) of the NAND cell section 11-1 has memory cells connected to a plurality of control gate lines CGL, i.e., memory cells of a plurality of pages.

In the 3-tr cell section 11-0, the control gate/select gate driver 12c is prepared in correspondence with one block BLKI, i.e., one control gate line CGL (one page). Each driver 12c has a booster. The predecoder 12a and row decoder 12b are also prepared in correspondence with one block BLKi, i.e., one control gate line CGL (one page).

In the NAND cell section 11-1, the control gate/select gate driver 12c is prepared in correspondence with one block BLKi including a plurality of control gate lines CGL0, . . . , CGL7 (a plurality of pages). Each driver 12c has a booster. The predecoder 12a and row decoder 12b are also prepared in correspondence with one block BLKi including the plurality of control gate lines CGL0, . . . , CGL7 (a plurality of pages).

The row address signal is input to the predecoder 12a via the address register 19. The predecoder 12a and row decoder 12b select one row (or one block) of the 3-tr cell section 11-0 or NAND cell section 11-1.

The sense amplifier 13 having the latch function latches read data or program data. Read data (output data) is output from the memory chip via the column selecting circuit 15 and data input/output buffer 18. Program data (input data) is latched by the sense amplifier 13 having the latch function via the data input/output buffer 18 and column selecting circuit 15.

The command signal is input to the command decoder 26 via the data input/output buffer 18 and command register 25. The output signal from the command decoder 26, command latch enable signal CLE, chip enable signal $\overline{CE}$, or write enable signal $\overline{WE}$ is input to the control circuit 17.

The signal generating circuit (booster) 27 generates potentials to be applied to the control gate line CGL and select gate lines SSL and GSL and supplies the potentials to the control gate/select gate driver 12c under the control of the control circuit 17.

Figure 27:
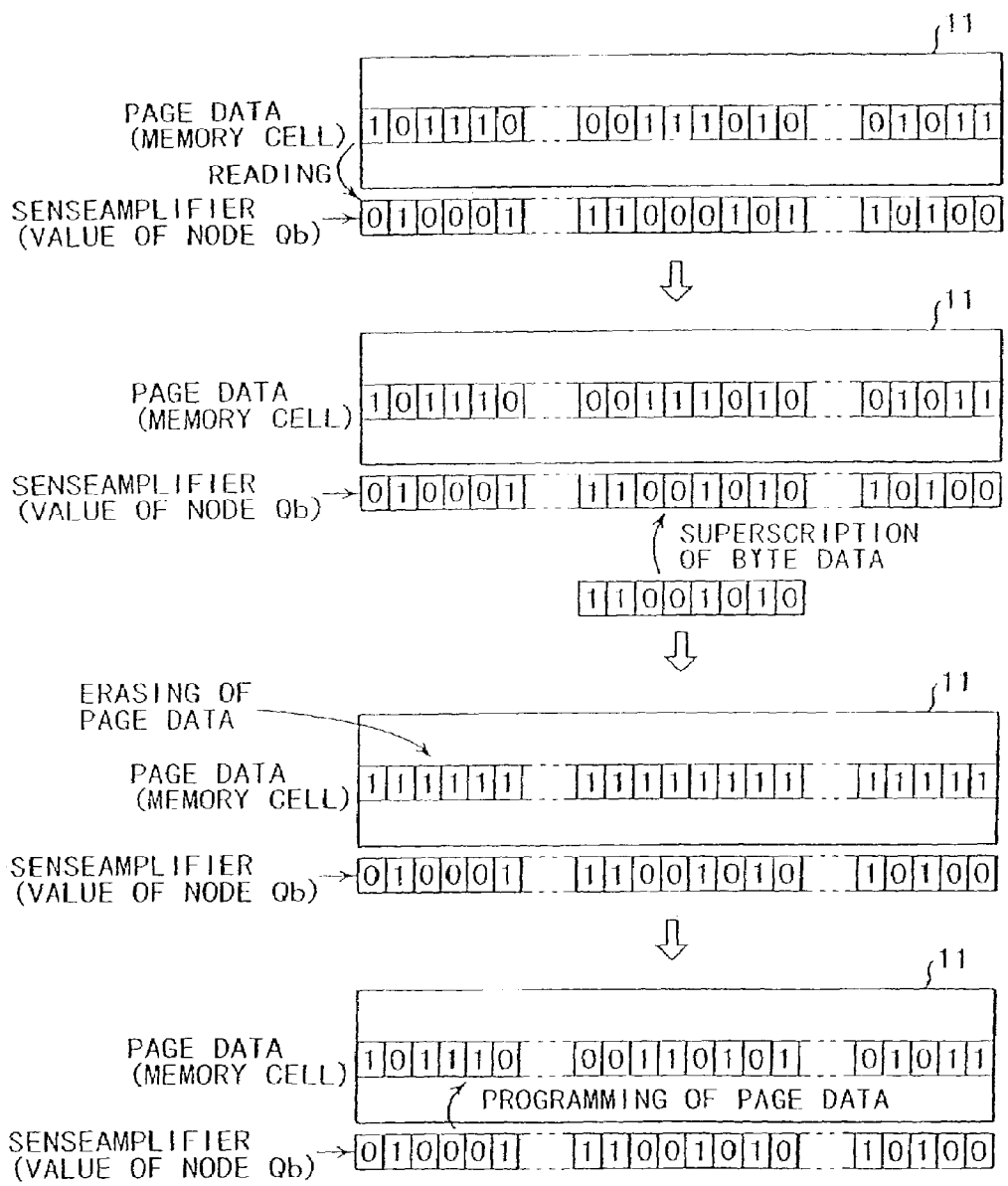
FIG. 27 is a view showing the data change operation for byte data of the present invention.

FIG. 27 shows the data change operation for byte data applied to the EEPROMs shown in FIGS. 23 to 26.

FIG. 27 shows the data change operations shown in FIGS. 11 to 14 together to help understanding.

The data change operation for byte data of the present invention has the following four main processes.

① Data are read out from memory cells of one page in the selected block and held by sense amplifiers having the latch function.

② Byte data is superscribed on the data held by the sense amplifiers having the latch function.

③ The data of the memory cells of one page in the selected block are erased.

④ The data held by the sense amplifiers having the latch function are programmed in the memory cells of one page in the selected block.

With these processes, a nonvolatile semiconductor memory which can be formed by the same process as that of a flash EEPROM and can perform data change operation for byte data although the same data change method as that of the flash EEPROM is applied can be provided. (A flash EEPROM usually erases data of memory cells at once in units of blocks without process ● and cannot perform the data change operation for byte data. However, data can be programmed in units of bytes after the data of all memory cells in the block are erased).

For the EEPROM to which the data change operation for byte data shown in FIG. 27 is applied, the number of data change operations of the memory cell, i.e., the maximum value of the number of program/erase cycles will be examined.

When 1-byte data is to be changed by the method shown in FIG. 27, the read, erase, and program operations are performed once for data of one page in the selected block. In the selected block, the read, erase, and program operations are performed once even for a memory cell whose data is not to be changed.

For example, when all data in one page are to be changed by the method shown in FIG. 27 in units of bytes, the number of pages read, erase, and program operations is substantially larger than that in changing data of one page at once by a multiple of the number of bytes contained in one page.

When one page has, e.g., 64 bytes, and the data of one page are to be changed at once, the page read, erase, and program operations need be performed once. However, the data of one page are to be changed in units of bytes, the page read, erase, and program operations need be performed 64 times.

In the data change operation for byte data shown in FIG. 27, the read, erase, and program operations are performed once for data of one page in the selected block, thereby changing 1-byte data. Hence, the number of page read, erase, and program operations in changing data of one page by the method of the present invention is larger than that in changing the data of one page at once by a multiple of the number of bytes contained in one page at maximum.

To prevent the increase in number of pages read, erase, and program operations, the number of pages read, erase, and program operations may be decreased by superscribing a plurality of byte data after one page read cycle shown in FIG. 27.

A nonvolatile semiconductor memory which can decrease the number of page read, erase, and program operations while maintaining the data change operation for byte data by a means different from superscription of a plurality of byte data will be described below.

Figure 28:
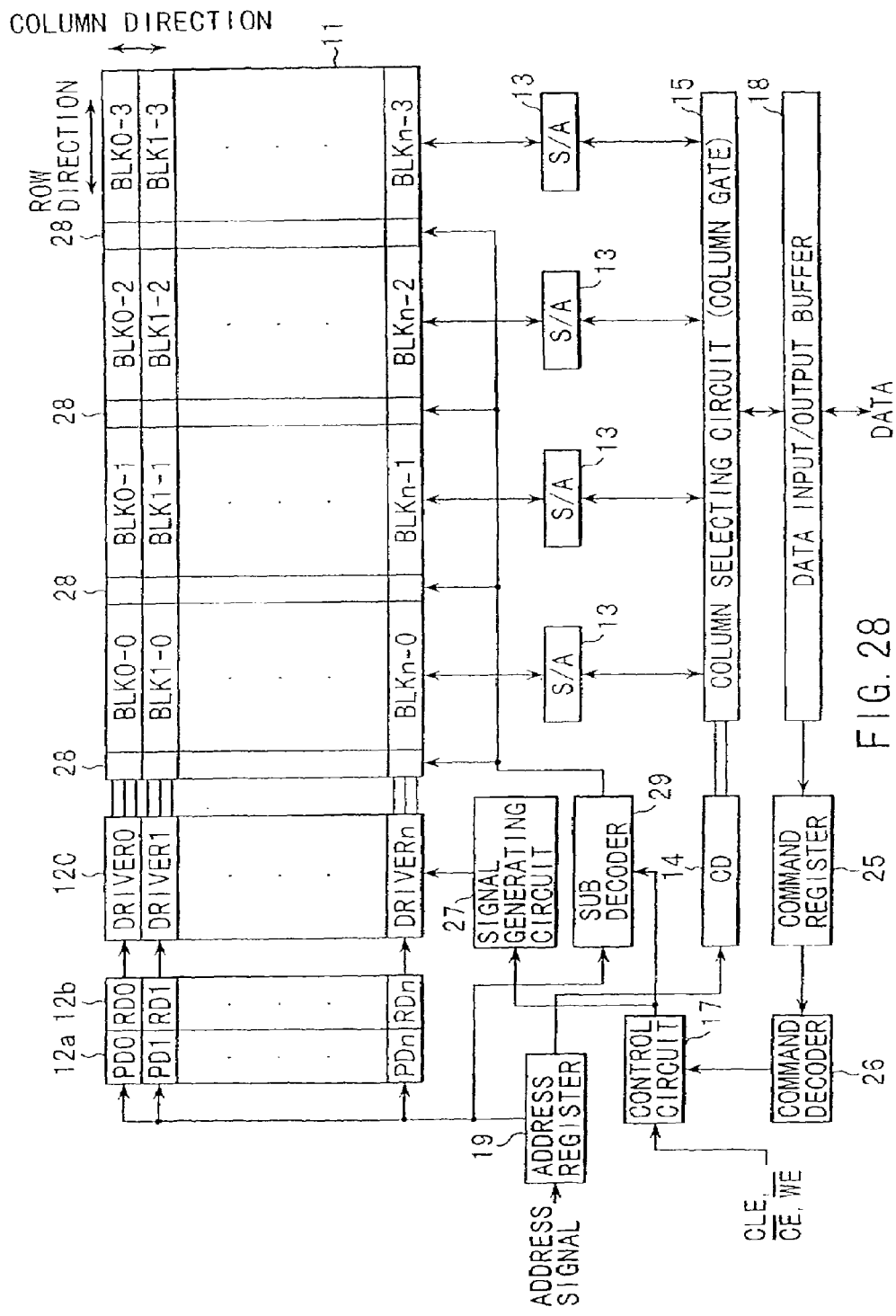
FIG. 28 is a block diagram showing a modification of the EEPROM shown in FIG. 23.

FIG. 28 shows an improved example of the byte EEPROM shown in FIG. 23.

In the present invention, the memory cell array 11 is formed from a plurality of blocks BLKi-j (i=0, 1, . . . , n; j=0, 1, 2, 3) arranged in a matrix in the row and column directions.

In the above-described examples, as shown in FIGS. 23 and 25, the blocks BLKi are arranged only in the column direction, and memory cells of one page, which are connected to one control gate line CGL are always in one block BLKi. In this example, however, memory cells of one page are divided into a plurality of blocks in units of integer multiples of 1 byte (8 bits), and a plurality of blocks are also arranged in the row direction.

More specifically, when one page has memory cells of k bytes (k is a positive integer), and memory cells of r bytes (r is a positive integer, r≦k) form one block, the number of blocks in the row direction is k/r. In this example, the number of blocks in the row direction is four. In this case, one block has memory cells of 16 bytes, and one page has memory cells of 64 bytes.

The control gate/select gate driver 12c is prepared in correspondence with four blocks BLKi-j in the row direction, i.e., one control gate line CGL (one page). Each driver 12c has a booster. The predecoder 12a and row decoder 12b are also prepared in correspondence with four blocks BLKi-j, i.e., one control gate line CGL (one page).

A sub control gate driver 28 is prepared in correspondence with one block BLKi-j.

The row address signal is input to the predecoder 12a and a sub decoder 29 via the address register 19. The predecoder 12a and row decoder 12b select four blocks BLKi-j in one row. The sub decoder 29 selects one of the four selected blocks BLKi-j.

The sub decoder 29 may have a function of selecting a plurality of blocks in one selected row or all blocks (in this example, four blocks) in one selected row.

In the present invention, the data read, erase, and program operations can be performed in units of blocks. That is, in the data change operation for byte data, data of one page need not be read out to the sense amplifiers having the latch function. According to the present invention, in the data change operation for byte data, the number of read, erase, and program operations can be decreased as compared to the examples shown in FIGS. 23 and 25, so the substantial program/erase endurance characteristics can be improved.

Assume that the program/erase endurance characteristics, i.e., the maximum value of the number of data change operations of an EEPROM in which one page has memory cells of k bytes (k is an integer) is $1 \times 10^6$.

In the examples shown in FIGS. 23 and 25, to change data of one page, the read, erase, and program operations are required k times. The program/erase endurance characteristics substantially decrease to $(1/k) \times 10^6$ times.

In the present invention, one page is divided into k/r blocks (r is a positive integer, $r \leq k$). Each block has memory cells of r bytes. The read, erase, and program operations can be performed in units of blocks. For this reason, the number of read, erase, and program operations for changing data of one page is substantially as small as $(1/r) \times 10^6$.

More specifically, when one page consists of 64 bytes, the program/erase endurance characteristics of the examples shown in FIGS. 23 and 25 are $1.7 \times 10^4$. On the other hand, when one page is formed from eight blocks, and each block has 8 bytes, the program/erase endurance characteristics of the present invention are given as $1.3 \times 10^5$ times. The substantial program/erase endurance characteristics are improved by one order of magnitude, as compared to the examples shown in FIGS. 23 and 25.

In the present invention, by forming one block from 1 byte, the substantial program/erase endurance characteristics can be maximized to $1 \times 10^6$ times.

When the block BLKi-j is selected, a control gate/select gate driver i applies predetermined potentials corresponding to the operation mode to the control gate line CGL and select gate lines SSL and GSL in the selected block BLKi-j (Tables 3 and 4).

The sense amplifier 13 having the latch function latches read data or program data. Read data (output data) is output from the memory chip via the column selecting circuit 15 and data input/output buffer 18. Program data (input data) is latched by the sense amplifier 13 having the latch function via the data input/output buffer 18 and column selecting circuit 15.

The command signal is input to the command decoder 26 via the data input/output buffer 18 and command register 25. The output signal from the command decoder 26, command latch enable signal CLE, chip enable signal $\overline{CE}$, or write enable signal $\overline{WE}$ is input to the control circuit 17.

The signal generating circuit (booster) 27 generates potentials to be applied to the control gate line CGL and select gate lines SSL and GSL and supplies the potentials to the control gate/select gate driver 12c under the control of the control circuit 17.

FIG. 29 shows an example of a predecoder PDi.

In this example, the number of rows, i.e., the number of control gate lines CGL (the number of blocks) is assumed to be 1,024 ($2^{10}$). In this case, one control gate line CGL can be selected by 10 row address signal bits a1, a2, . . . , a10.

The row address signal bits a1, a2, and a3 are input to a NAND circuit 30-1. The row address signal bits a4, a5, and a6 are input to a NAND circuit 30-2. The row address signal bits a7, a8, a9, and a10 are input to a NAND circuit 30-3.

The output signal from the NAND circuit 30-1 is output as a signal D via an inverter 31-1. The output signal from the NAND circuit 30-2 is output as a signal E via an inverter 31-2. The output signal from the NAND circuit 30-3 is output as a signal F via an inverter 31-3.

The predecoders PDi receive the different row address signal bits a1, a2, . . . , a10, respectively. Only the output signals D, E, and F from the predecoder PDi belonging to one selected row are at "1".

Figure 30:
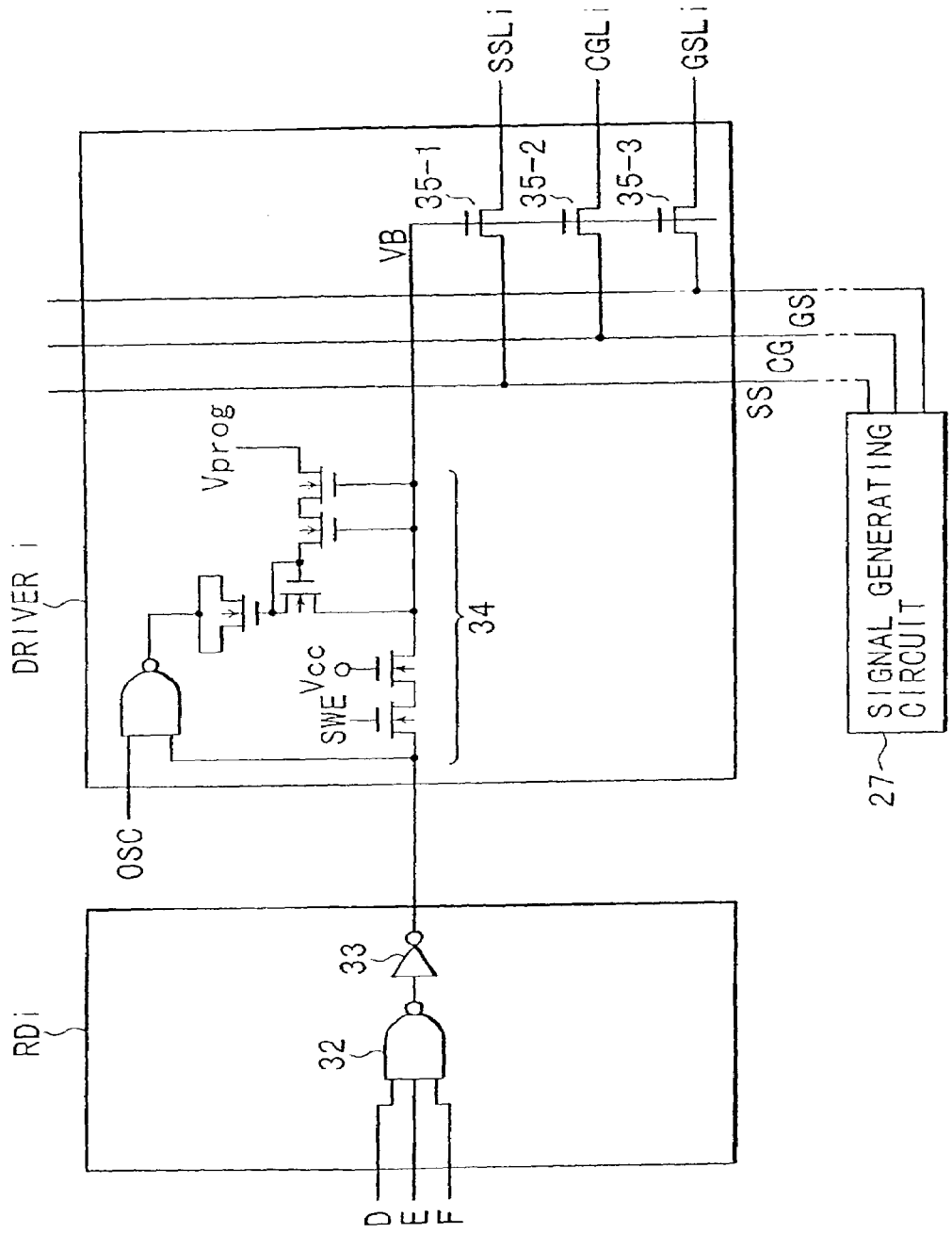
FIG. 30 is a circuit diagram showing examples of the row decoder and driver shown in FIG. 28.

FIG. 30 shows examples of a row decoder RDi and main control gate/select gate driver i.

The row decoder RDi is formed from a NAND circuit 32 and inverter 33. The output signals D, E, and F from the predecoder PDi are input to the NAND circuit.

The main control gate/select gate driver i has a booster 34 and NMOS transistors 35-1, 35-2, and 35-3 as drive circuits.

In the main control gate/select gate driver i belonging to the selected row, the power supply potential VCC or boosted potential is applied to the gates of the NMOS transistors 35-1, 35-2, and 35-3.

For example, when data is to be programmed, in the driver i belonging to the selected row, an output potential VB of the booster 34 is at the boosted potential Vprog to turn on the NMOS transistors 35-1, 35-2, and 35-3. The signal generating circuit 27 generates potentials SS (=VCC), CG (=Vprog), and GS (=0V). These potentials SS, CG, and GS are applied to a main control gate line CGLi and select gate lines SSLi and GSLi in the selected row via the NMOS transistors 35-1, 35-2, and 35-3, respectively.

When data is to be erased, in the driver i belonging to the selected row, the output potential VB of the booster 34 is at the power supply potential VCC to turn on the NMOS transistors 35-1, 35-2, and 35-3. The signal generating circuit 27 generates potentials SS (=VCC), CG (=0V), and GS (=VCC). These potentials SS, CG, and GS are applied to the main control gate line CGLi and select gate lines SSLi and GSLi in the selected row via the NMOS transistors 35-1, 35-2, and 35-3, respectively.

After this, the select gate lines SSLi and GSLi are set in the floating state. For this reason, when the erase potential Vera is applied to the P-well, the potentials of the select gate lines SSLi and GSLi increase to Vera+α due to the capacitive coupling between the P-well and select gate lines SSLi and GSLi.

When data is to be read, in the driver i belonging to the selected row, the output potential VB of the booster 34 is at the power supply potential VCC or VCC+α (α is a value equal to or larger than the threshold voltage value of the N-channel transistor) to turn on the NMOS transistors 35-1, 35-2, and 35-3. The signal generating circuit 27 generates potentials SS (=VCC), CG (=0V or VCC), and GS (=VCC). These potentials SS, CG, and GS are applied to the main control gate line CGLi and select gate lines SSLi and GSLi in the selected row via the NMOS transistors 35-1, 35-2, and 35-3, respectively.

In the main control gate/select gate driver i belonging to an unselected row, the ground potential is applied to the gates of the NMOS transistors 35-1, 35-2, and 35-3, so the NMOS transistors 35-1, 35-2, and 35-3 are turned off. Hence, the main control gate line CGLi and select gate lines SSLi and GSLi in the unselected row are in the floating state.

In the data read mode, the ground potential VSS (0V) may be applied to the select gate lines SSLi and GSLi in the unselected row. In this case, ground MOS transistors are connected to all the select gate lines SSLi and GSLi, respectively, and ON/OFF-controlled by the presence/absence of row (block) selection.

Figure 31:
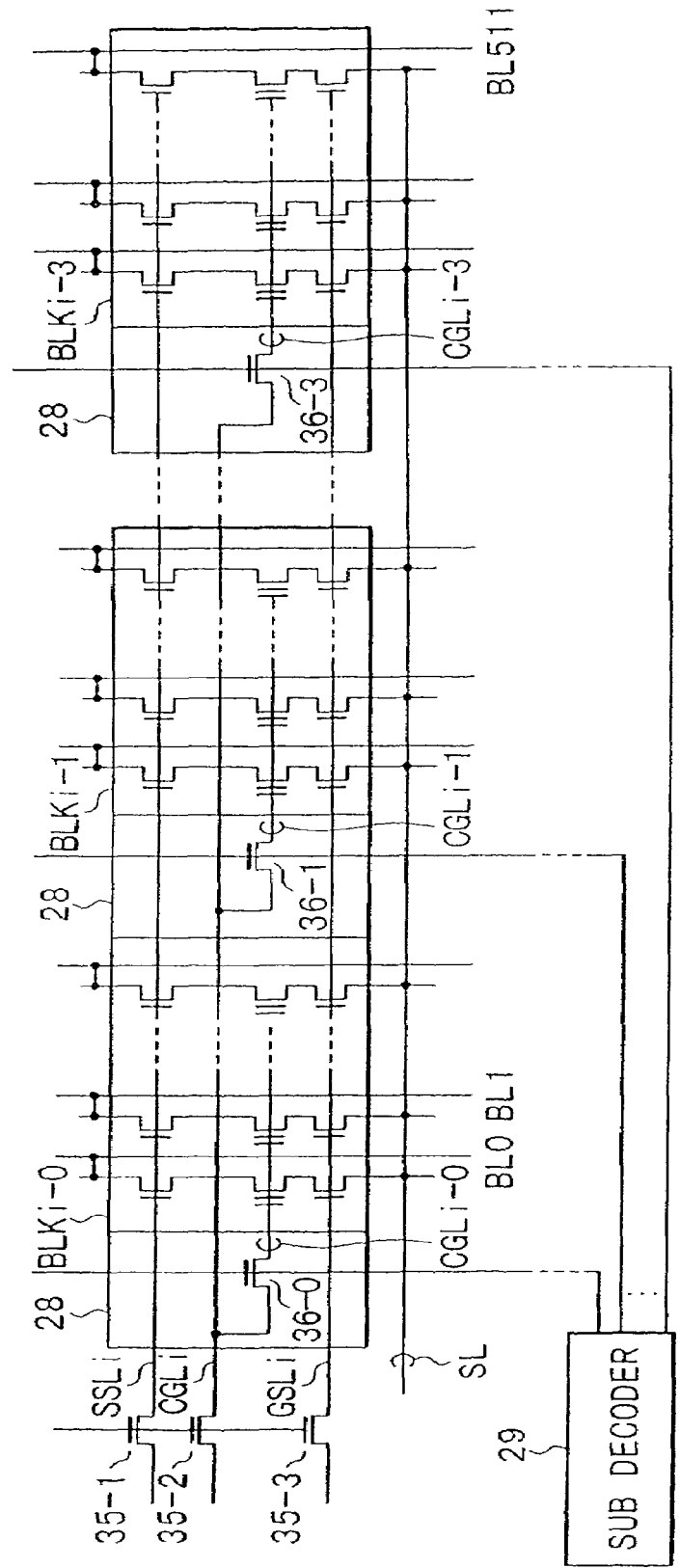
FIG. 31 is a view showing one row of the memory cell array shown in FIG. 28.

FIG. 31 shows an example of a plurality of blocks and sub control gate drivers arranged in one row.

In this example, four blocks BLKi-0, BLKi-1, BLKi-2, and BLKi-3 are arranged in one row in correspondence with the circuit block shown in FIG. 28.

The blocks BLKi-j (j=0, 1, 2, 3) have sub control gate lines CGLi-0, CGLi-1, CGLi-2, and CGLi-3, respectively. Each sub control gate line CGLi-j (j=0, 1, 2, 3) is connected to memory cells of an integer multiple of 1 byte (e.g., 16 bytes), which are arranged in the corresponding block BLKi-j.

The sub control gate line CGLi-j is connected to the main control gate line CGLi via an NMOS transistor 36-j serving as a drive circuit in the sub control gate driver 28.

The NMOS transistor 36-j is ON/OFF-controlled by the sub decoder 29. The sub decoder 29 has a function of selecting one NMOS transistor 36-j (one block).

The sub decoder 29 may have a function of selecting a plurality of or all NMOS transistors 36-j (a plurality of or all blocks).

When data is to be programmed, in the selected block BLKi-j in the selected row, the program voltage Vprog is applied to the gate of the NMOS transistor 36-j to turn on the NMOS transistor 36-j. Hence, the high program potential Vprog is applied from the main control gate line CGLi to the sub control gate line CGLi-j in the selected block BLKi-j.

When data is to be erased, in the selected block BLKi-j in the selected row, the power supply potential VCC is applied to the gate of the NMOS transistor 36-j to turn on the NMOS transistor 36-j. Hence, the ground potential is applied from the main control gate line CGLi to the sub control gate line CGLi-j in the selected block BLKi-j.

When data is to be read, in the selected block BLKi-j in the selected row, the power supply potential VCC is applied to the gate of the NMOS transistor 36-j to turn on the NMOS transistor 36-j. Hence, the ground potential or power supply potential VCC is applied from the main control gate line CGLi to the sub control gate line CGLi-j in the selected block BLKi-j (Tables 3 and 4).

On the other hand, in an unselected block BLKi-j in the selected row, the ground potential is applied to the gate of the NMOS transistor 36-j to turn off the NMOS transistor 36-j. That is, the sub control gate line CGLi-j in the unselected block BLKi-j is in the floating state.

In the selected row, the plurality of sub control gate lines CGLi-j are arranged immediately under the main control gate line CGLi. When a predetermined potential is applied to the main control gate line CGLi in the program, erase, or read mode, the potential of the sub control gate line CGLi-j in the unselected block BLKi-j may change due to the capacitive coupling.

However, the change in potential of the sub control gate line CGLi-j in the unselected block BLKi-j does not adversely affect the read, erase, or program operation.

The select gate lines SSLi and GSLi in the selected row are common to all the blocks BLKi-j in the selected row.

In the data program mode, the ground potential or power supply potential VCC is applied to the select gate lines SSLi and GSLi of all the blocks BLKi-j in the selected row via the NMOS transistors 35-1 and 35-3. In the data erase mode, the power supply potential VCC is applied to the select gate lines SSLi and GSLi of all the blocks BLKi-j in the selected row via the NMOS transistors 35-1 and 35-3. In the data read mode, the power supply potential VCC is applied to the select gate lines SSLi and GSLi of all the blocks BLKi-j in the selected row via the NMOS transistors 35-1 and 35-3 (Tables 3 and 4).

Figure 32:
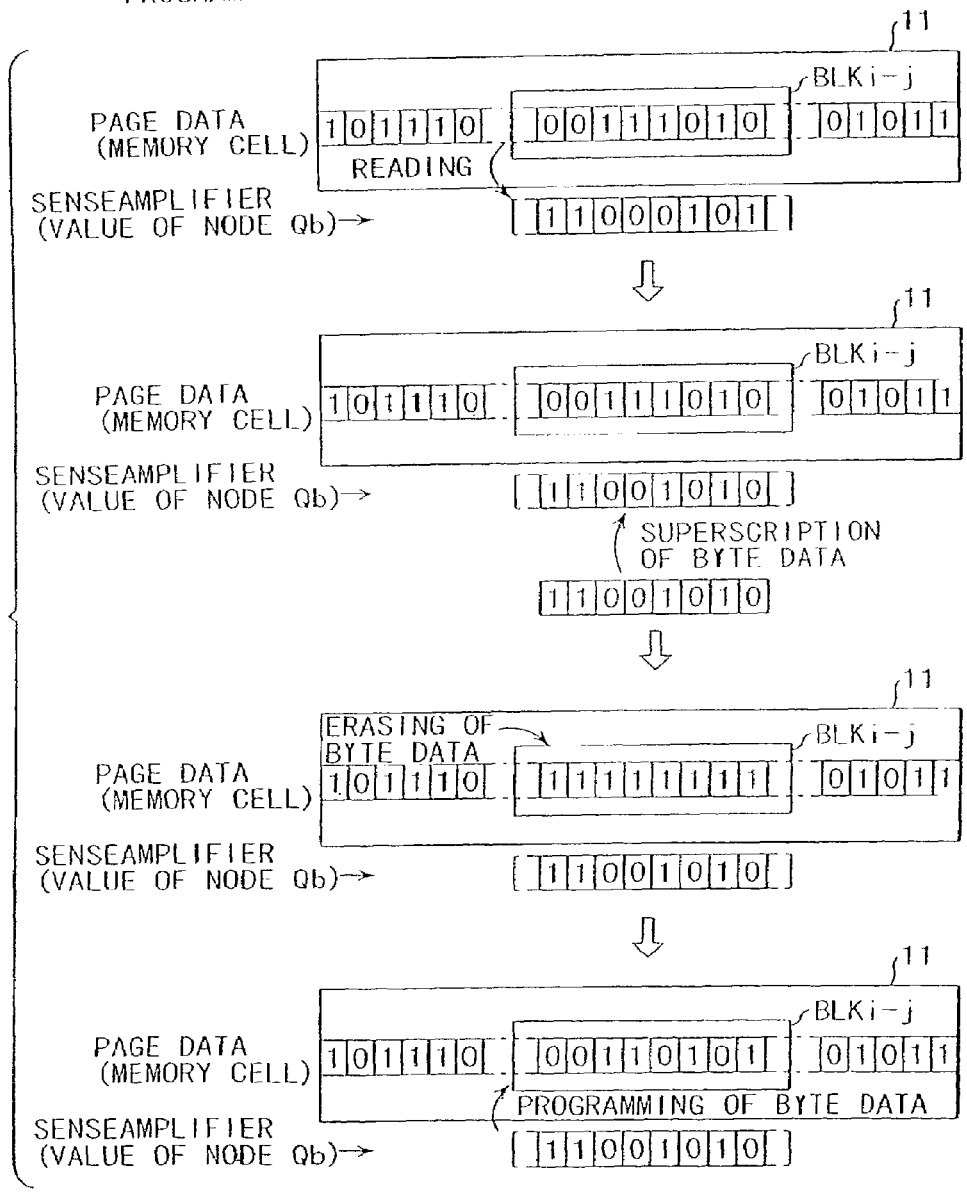
FIG. 32 is a view showing the data change operation for byte data of the present invention.

FIG. 32 shows the first example of the data change operation for byte data applied to the EEPROM shown in FIGS. 28 to 31.

The data change operation for byte data of this example has the following four main processes.

① Data are read out from memory cells in the selected block and held by the sense amplifiers having the latch function.

② Byte data is superscribed on the data held by the sense amplifiers having the latch function.

③ The data of the memory cells in the selected block are erased.

④ The data held by the sense amplifiers having the latch function are programmed in the memory cells in the selected block.

As a characteristic feature of the data change operation for byte data of this example, the data change operation for byte data is performed to read only data of the selected block BLKi-j (data of an integer multiple of 1 byte) in the selected row without reading data of one page in the selected row, as is apparent from comparison to the data change operation shown in FIG. 27. That is, since data of memory cells of unselected blocks in the selected row need not be read, the read, erase, and program operations for the memory cell whose data are not to be changed can be omitted.

In the data change operation of this example, the number of read, erase, and program operations can be made smaller than that of the data change operation shown in FIG. 27. The substantial program/erase endurance characteristics, i.e., the number of data change operations can be improved.

According to this example, although the nonvolatile semiconductor memory can be formed by the same process as that of a flash EEPROM and uses the same data change method as that of the flash EEPROM, the data change operation for byte data can be performed without degrading the program/erase endurance characteristics.

Figure 33:
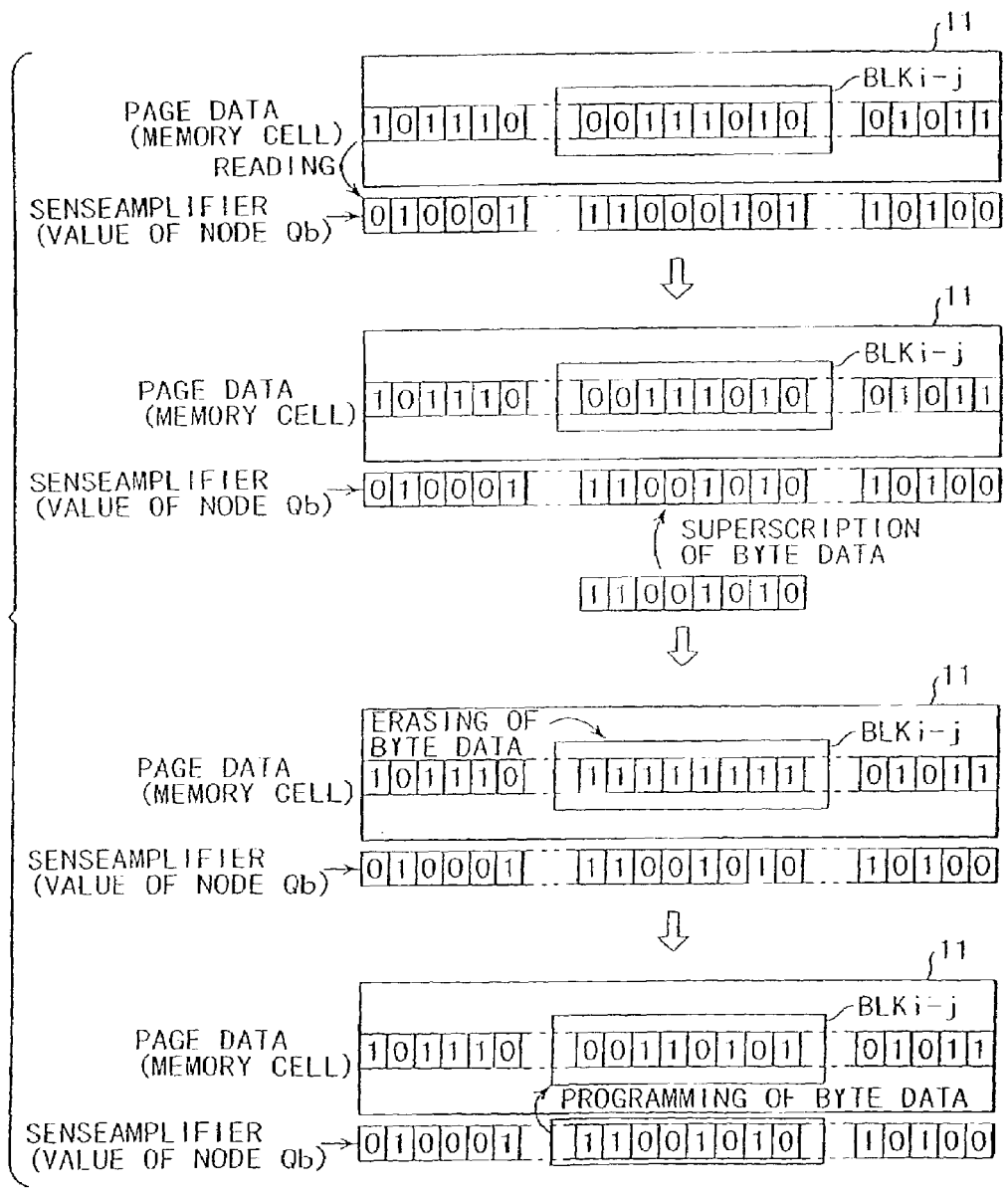
FIG. 33 is a view showing the data change operation for byte data of the present invention.

FIG. 33 shows the second example of the data change operation for byte data applied to the EEPROM shown in FIGS. 28 to 31.

The data change operation for byte data of this example has the following four main processes.

① Data are read out from memory cells of one page in the selected block and held by the sense amplifiers having the latch function.

② Byte data is superscribed on the data held by the sense amplifiers having the latch function.

③ The data of the memory cells in the selected block are erased.

④ The data held by the sense amplifiers having the latch function are programmed in the memory cells in the selected block.

As a characteristic feature of the data change operation for byte data of this example, data are read from memory cells of one page, unlike the data change operation shown in FIG. 32. That is, in this example, although data of memory cells of one page are read, the erase and program operations are performed for only the selected block in the selected row. For this reason, unnecessary erase and program operations for data of memory cells of unselected blocks in the selected row can be omitted.

In the read operation, to select all blocks BLKi-j in the selected row, all the blocks BLKi-j in the selected row are multiple-selected by the sub decoder.

In the data change operation of this example, the number of page erase and program operations can be made smaller than that of the data change operation shown in FIG. 27. The substantial program/erase endurance characteristics, i.e., the number of data change operations can be improved.

According to this example, although the nonvolatile semiconductor memory can be formed by the same process as that of a flash EEPROM and uses the same data change method as that of the flash EEPROM, the data change operation for byte data can be performed without degrading the program/erase endurance characteristics.

Figure 34:
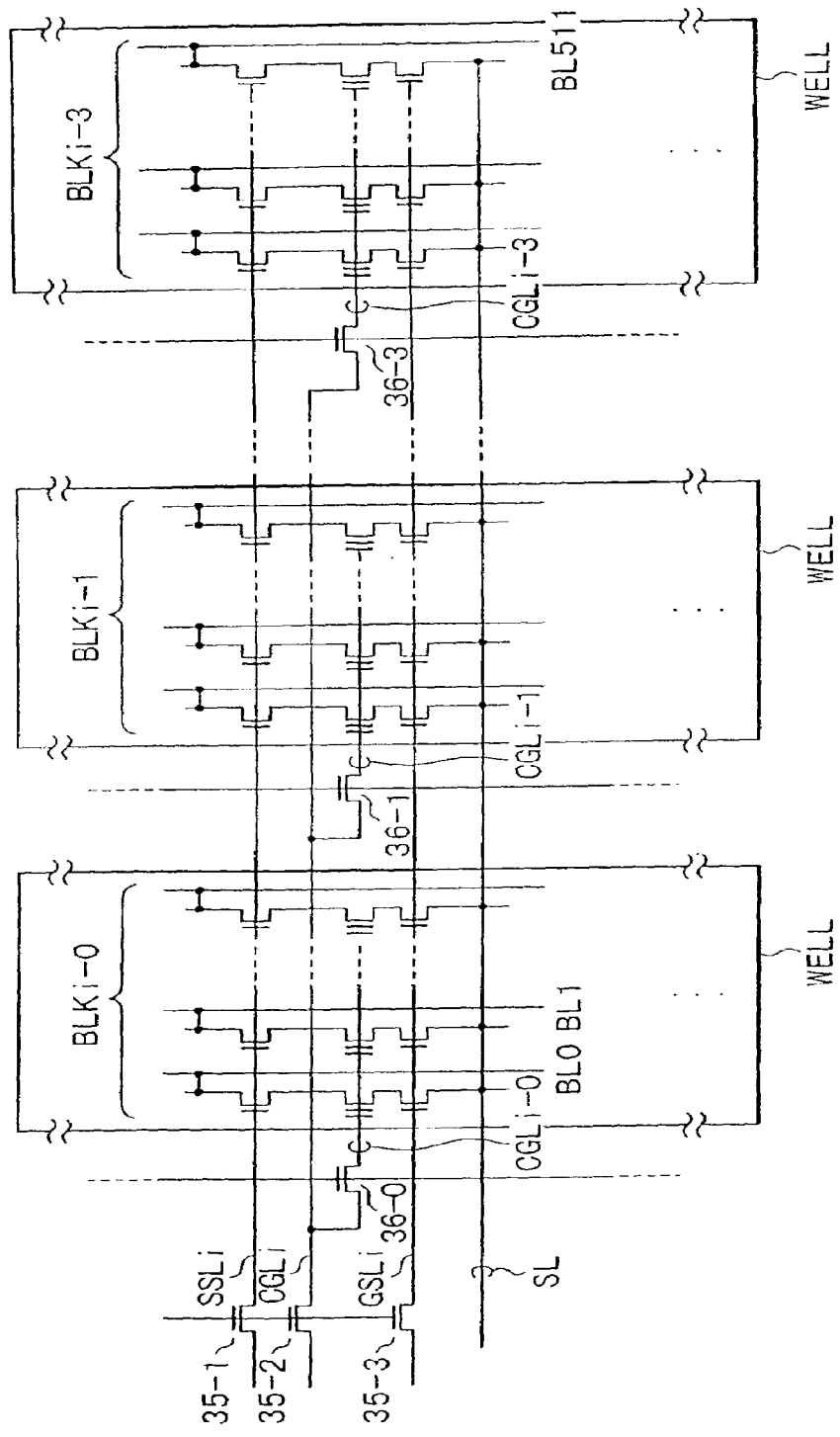
FIG. 34 is a view showing an example of the well layout in a memory cell array area.

FIG. 34 shows an example of the well layout in the memory cell array area.

In the flash EEPROM, normally, all memory cell units (memory cells and select transistors) are formed in one well (e.g., a twin well, i.e., a P-well in an N-well formed in a p-type substrate). In the present invention, however, sub control gate drivers are inserted between the memory cells. The sub control gate driver applies a high potential to the sub control gate. When this driver is formed in one well together with the memory cells, the threshold value may increase due to the back gate bias effect, or the operation becomes unstable due to the potential of the well.

In this example, the blocks BLKi-j in the column direction are formed in one well. The blocks BLKi-j in the row direction are arranged in different wells. In this case, the sub control gate drivers are formed outside the wells, i.e., on the p-type substrate, and the above problems can be solved.

When the potential to be applied to the well in the program and erase modes is appropriately adjusted, all memory cell units and sub control gate drivers can be arranged in one well.

In this case, however, the increase in threshold voltage due to the back gate bias effect cannot be avoided.

Figure 35:
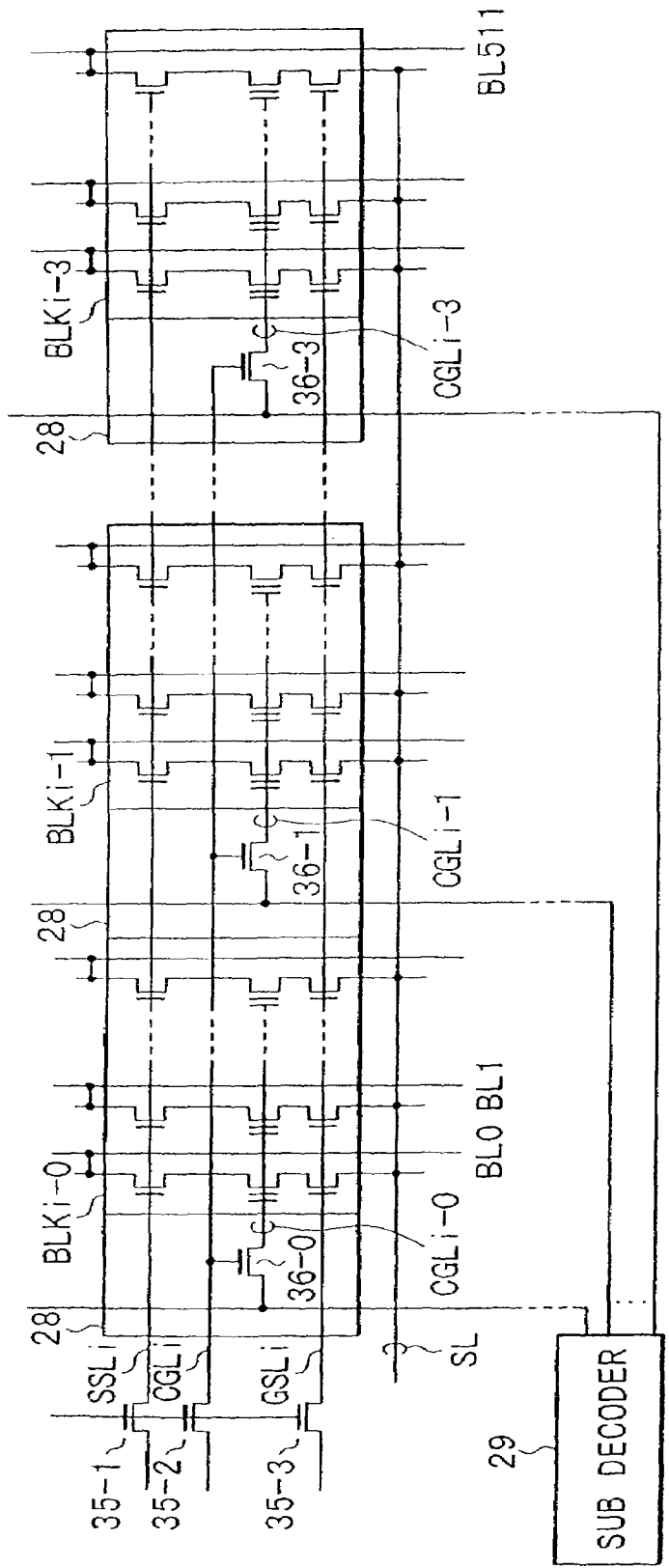
FIG. 35 is a view showing a modification of the memory cell array shown in FIG. 31.

FIG. 35 shows another example of a plurality of blocks and sub control gate drivers arranged in one row.

This example is a modification of the circuit shown in FIG. 31 and is characterized in connection of NMOS transistors 36-0, 36-1, 36-2, and 36-3.

The blocks BLKi-j (j=0, 1, 2, 3) have the sub control gate lines CGLi-0, CGLi-1, CGLi-2, and CGLi-3, respectively. Each sub control gate line CGLi-j (j=0, 1, 2, 3) is connected to memory cells of an integer multiple of 1 byte (e.g., 16 bytes), which are arranged in the corresponding block BLKi-j.

The sub control gate line CGLi-j is connected to the sub decoder 29 via the NMOS transistor 36-j as a drive circuit in the sub control gate driver 28.

The NMOS transistor 36-j is ON/OFF-controlled by the potential of the main control gate line CGLi. In the selected row, the boost potential Vprog or power supply potential VCC is applied to the main control gate line CGLi, and all the NMOS transistors 36-0, 36-1, 36-2, and 36-3 in the selected row are turned on.

In the data program mode, the high program potential Vprog is applied from the sub decoder 29 to the sub control gate line CGLi-j of the selected block BLKi-j. The ground potential is applied from the sub decoder 29 to the sub control gate line CGLi-j of an unselected block BLKi-j.

In the data erase mode, the ground potential is applied from the sub decoder 29 to the sub control gate line CGLi-j of the selected block BLKi-j. The power supply potential VCC is applied from the sub decoder 29 to the sub control gate line CGLi-j of the unselected block BLKi-j.

In the data read mode, the read potential (ground potential or power supply potential VCC) is applied from the sub decoder 29 to the sub control gate line CGLi-j of the selected block BLKi-j. The ground potential is applied from the sub decoder 29 to the sub control gate line CGLi-j of the unselected block BLKi-j (Tables 3 and 4).

In the block BLKi-j in an unselected row, the ground potential is applied to the gate of the NMOS transistor 36-j to turn off the NMOS transistor 36-j.

In the data program mode, the ground potential or power supply potential VCC is applied to the select gate lines SSLi and GSLi of all the blocks BLKi-j in the selected row via the NMOS transistors 35-1 and 35-3. In the data erase mode, the power supply potential VCC is applied to the select gate lines SSLi and GSLi of all the blocks BLKi-j in the selected row via the NMOS transistors 35-1 and 35-3. In the data read mode, the power supply potential VCC is applied to the select gate lines SSLi and GSLi of all the blocks BLKi-j in the selected row via the NMOS transistors 35-1 and 35-3 (Tables 3 and 4).

In this arrangement as well, the read, erase, or program operation can be performed in units of blocks. Hence, the data change operation for byte data shown in FIG. 32 or 33 can be applied.

For this reason, unnecessary read, erase, and program operations for memory cells whose data are not to be changed can be omitted, and the substantial program/erase endurance characteristics, i.e., the number of data change operations can be improved.

Figure 36:
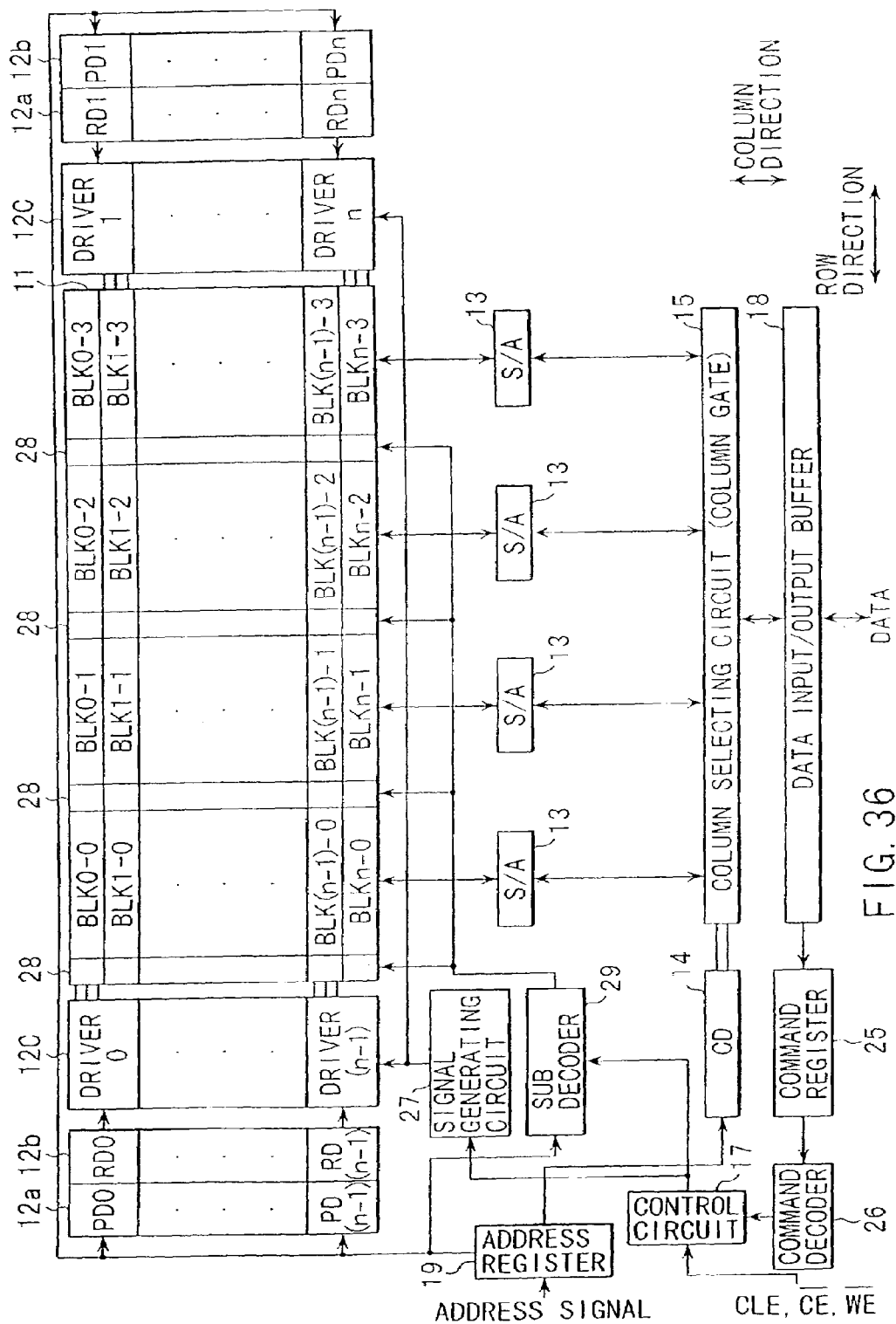
FIG. 36 is a block diagram showing a modification of the EEPROM shown in FIG. 28.
Figure 37:
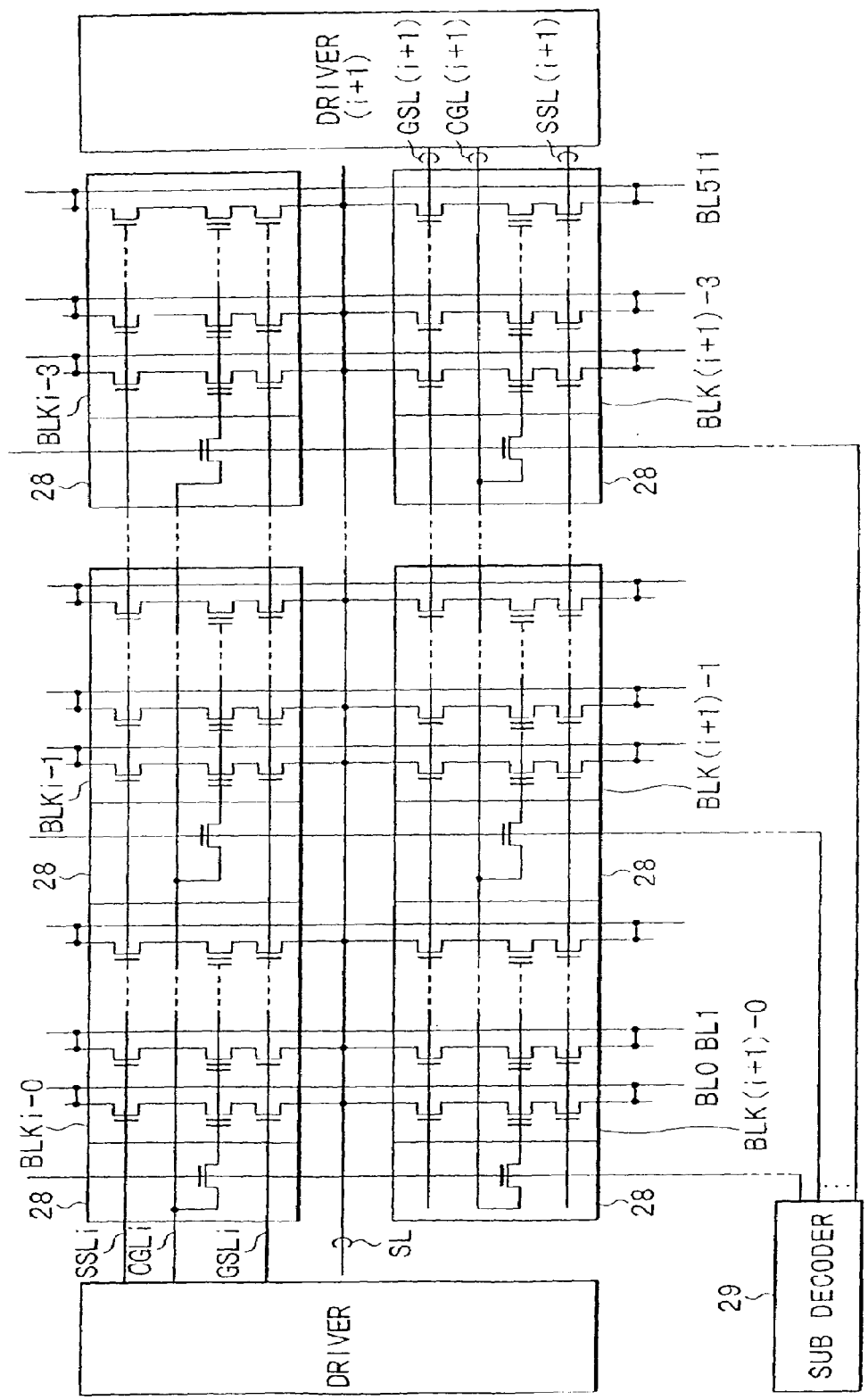
FIG. 37 is a view showing two rows adjacent to each other in the memory cell array shown in FIG. 36.

FIG. 36 shows an improved example of the byte EEPROM shown in FIG. 28. FIG. 37 shows only two rows adjacent each other in the memory cell array 11 shown in FIG. 36.

In the example shown in FIG. 28, all the predecoders 12a, row decoders 12b, and main control gate/select gate drivers 12c are arranged at one end of the memory cell array 11 in the row direction.

In this example, however, the predecoders 12a, row decoders 12b, and main control gate/select gate drivers 12c are arranged at one end and the other end of the memory cell array 11 in the row direction.

For example, predecoders PD0, PD2, . . . , and row decoders RD0, RD2, . . . , which select even-numbered rows, are arranged at one end of the memory cell array 11 in the row direction. Predecoders PD1, PD3, . . . , and row decoders RD1, RD3, . . . , which select odd-numbered rows, are arranged at the other end of the memory cell array 11 in the row direction. Main control gate/select gate drivers 0, 2, . . . for applying predetermined potentials to even-numbered rows are arranged at one end of the memory cell array 11 in the row direction. Main control gate/select gate drivers 1, 3, . . . for applying predetermined potentials to odd-numbered rows are arranged at the other end of the memory cell array 11 in the row direction.

In the circuit design process, the layout of the predecoders 12a, row decoders 12b, and the main control gate/select gate drivers 12c can be easily determined.

The main control gate/select gate driver 12c tends to have a large circuit size because it must generate a high program potential to be applied to the main control gate line CGLi. For this reason, when all the predecoders 12a, row decoders 12b, and main control gate/select gate drivers 12c are arranged at one end of the memory cell array 11 in the row direction, the layout of these circuits on the chip is very hard to determine.

As described above, when the predecoders 12a, row decoders 12b, and main control gate/select gate drivers 12c are arranged at one end and the other end of the memory cell array 11 in the row direction, the space on the chip can be effectively utilized, and the circuit blocks can be compactly formed on the chip.

As shown in FIG. 37, a drive circuit for driving the control gate line CGLi in one block BLKi-j and drive circuits for driving the select gate lines SSLi and GSLi are arranged as the driver i at one end or the other end of the memory cell array 11.

With this arrangement, the time lag between a signal supplied to the memory cell in the selected block BLKi-j and signals supplied to the select transistors can be eliminated. Since an operation error in the program and read modes can be prevented, the reliability increases.

In this example, the two select gate lines SSLi and GSLi and one control gate line CGLi are preferably simultaneously driven as one set. In addition, since the area of the transistor (driver) with a high breakdown voltage is large, the pattern on the chip can be made uniform by arranging the select gate lines SSLi and GSLi and the control gate line CGLi as one set with this arrangement, reduction in thickness of word lines due to the loading effect in a non-uniform pattern can be prevented.

Figure 38:
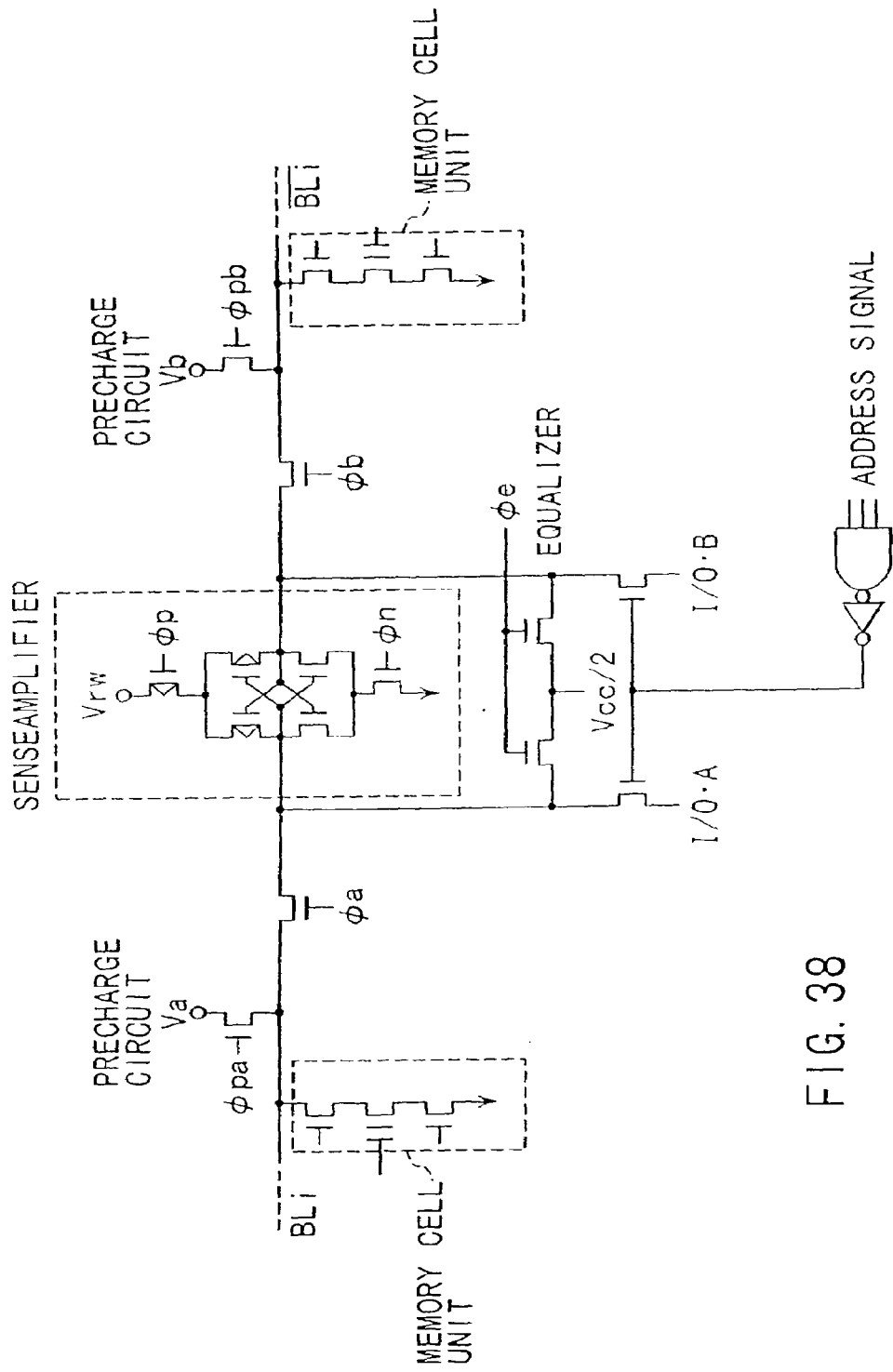
FIG. 38 is a circuit diagram showing a system using a differential sense amplifier.
Figure 39:
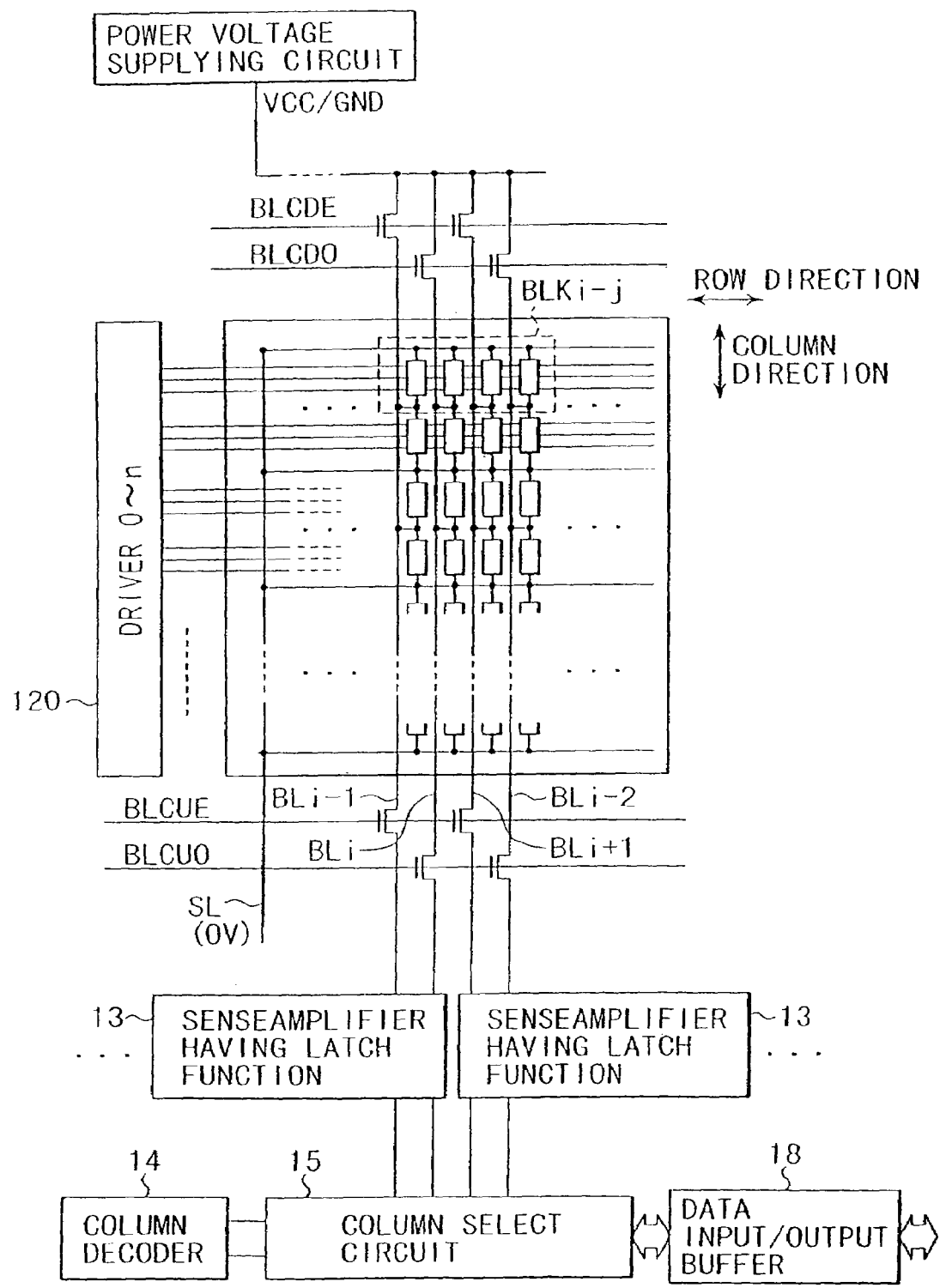
FIG. 39 is a block diagram showing a system having one sense amplifier for a plurality of bit lines.

FIGS. 38 and 39 show improved examples of the sense amplifier.

FIG. 38 shows an arrangement using a differential sense amplifier. In this case, 1-bit data may be stored in two memory cell units as complementary data. Data is read by detecting a small difference between signal amounts (potentials) output from the two memory cell units and amplifying this difference. This allows a high-speed read.

One-bit data is stored in a pair of memory cell units. For this reason, even when the program/erase endurance characteristics of one memory cell unit degrade due to the repeated data change operation, the reliability does not decrease as far as the other memory cell unit has satisfactory program/erase endurance characteristics.

FIG. 39 shows an example wherein a common sense amplifier is connected to a plurality of (e.g., two) bit lines. In this case, the data change operation for byte data in the block BLKi-j is divisionally performed twice. The first-time data change operation is performed for a memory cell unit connected to an even-numbered bit line, and the second-time data change operation is performed for a memory cell unit connected to an odd-numbered bit line.

When the sense amplifier of this example is used, and data is to be read to one bit line, the other bit line is set at a fixed potential (e.g., ground potential) (shield bit line read method). With this method, a problem such as a program error in an unselected cell in the read mode can be avoided. The EEPROM of this example can be applied to store multi-level data in one memory cell unit.

Figure 40:
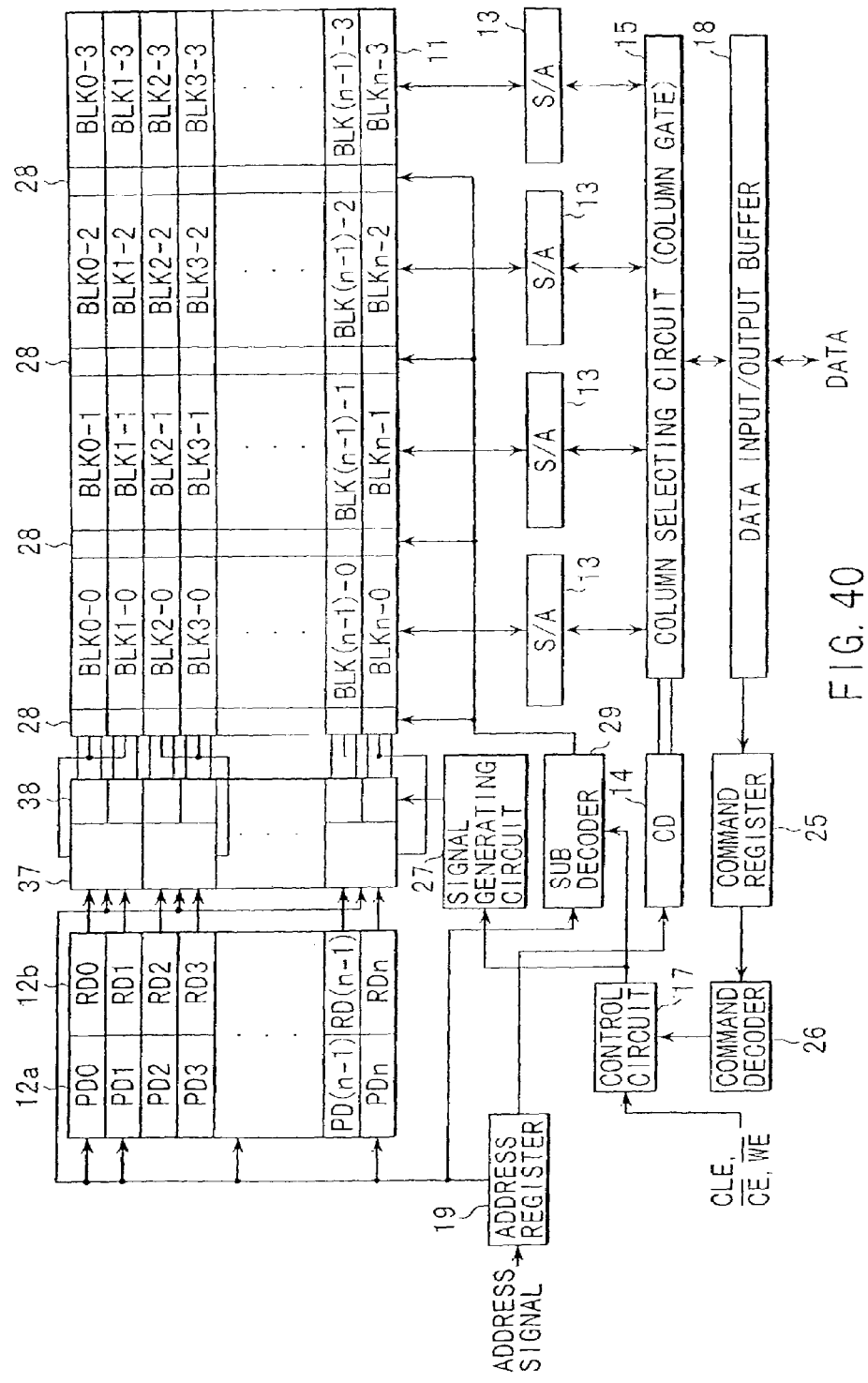
FIG. 40 is a block diagram showing another modification of the EEPROM shown in FIG. 28.

FIG. 40 shows an improved example of the byte EEPROM shown in FIG. 28.

In the example shown in FIG. 28, the memory cell array 11 is formed from the plurality of blocks BLKi-j (i=0, 1, . . . , n; j=0, 1, 2, 3) arranged in a matrix in the row and column directions. In this example, on the assumption of this, the number of main control gate drivers (including boosters) that occupy a large area on the chip is decreased to facilitate circuit block layout on the chip.

In this example, the number of blocks in the column direction is n (e.g., 1,024), and the number of blocks in the row direction is 4. One block has memory cells of 16 bytes, and one page has memory cells of 64 bytes.

In this example, a main control gate driver 37 is prepared in correspondence with two rows, i.e., two main control gate lines CGL (2 pages) adjacent to each other. That is, in this example, one main control gate driver 37 drives two main control gate lines CGL. Each main control gate driver includes a booster.

The sub control gate driver 28 is prepared in correspondence with each block BLKi-j.

A select gate driver 38 is prepared in correspondence with one row, i.e., one control gate line CGL (one page). The predecoder 12a and row decoder 12b are also prepared in correspondence with one row, i.e., one control gate line CGL.

The row address signal is input to the predecoder 12a and sub decoder 29 via the address register 19. The predecoder 12a and row decoder 12b select four blocks BLKi-j in one row. The sub decoder 29 selects one of the four selected blocks BLKi-j.

The sub decoder 29 may have a function of selecting a plurality of blocks in one selected row or all blocks (in this example, four blocks) in one selected row.

In this example, data can be read, erased, or programmed in units of blocks, as in the example shown in FIG. 28.

Hence, in the data change operation for byte data, data of one page need not be read to the sense amplifiers having the latch function, so the substantial program/erase endurance characteristics, i.e., the number of page data change operations can be improved.

In the present invention, when the block BLKi-j is selected, the main control gate driver 37 applies predetermined potentials corresponding to the operation mode to two main control gate lines CGLi and CGLi+1 of the row to which the selected block BLKi-j belongs and the row adjacent to this row. That is, since the two main control gate lines CGLi and CGLi+1 share one main control gate driver 37, the number of main control gate drivers 37 can be decreased, so the layout can be facilitated, and the load in circuit design can be reduced.

The select gate driver 38 applies predetermined potentials corresponding to the operation mode to the select gate lines SSL and GSL of the row to which the selected block BLKi-j belongs.

The sense amplifier 13 having the latch function latches read data or program data. Read data (output data) is externally output from the memory chip via the column selecting circuit 15 and data input/output buffer 18. Program data (input data) is latched by the sense amplifier 13 having the latch function via the data input/output buffer 18 and column selecting circuit 15.

The command signal is input to the command decoder 26 via the data input/output buffer 18 and command register 25. The output signal from the command decoder 26, command latch enable signal CLE, chip enable signal $\overline{CE}$, or write enable signal $\overline{WE}$ is input to the control circuit 17.

The signal generating circuit (booster) 27 generates potentials to be applied to the control gate line CGL and select gate lines SSL and GSL and supplies the potentials to the main control gate driver 37 and select gate driver 38 under the control of the control circuit 17.

Figure 41:
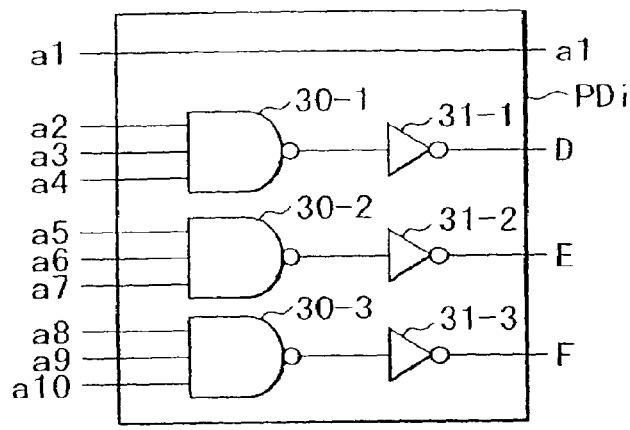
FIG. 41 is a circuit diagram showing an example of the predecoder shown in FIG. 40.

FIG. 41 shows another example of the predecoder PDi.

In this example, assume that the number of rows, i.e., the number of control gate lines CGL (the number of blocks) is 1,024 ($2^{10}$) In this case, one row can be selected by 10 row address signal bits a1, a2, . . . , a10.

The row address signal bits a2, a3, and a4 are input to the NAND circuit 30-1. The row address signal bits a5, a6, and a7 are input to the NAND circuit 30-2. The row address signal bits a8, a9, and a10 are input to the NAND circuit 30-3. The output signal from the NAND circuit 30-1 is output as the signal D via the inverter 31-1. The output signal from the NAND circuit 30-2 is output as the signal E via the inverter 31-2. The output signal from the NAND circuit 30-3 is output as the signal F via the inverter 31-3.

The predecoders PDi receive the different row address signal bits a1, a2, . . . , a10, respectively. Only the output signals D, E, and F from the predecoder PDi belonging to one selected row are at "1".

Figure 42:
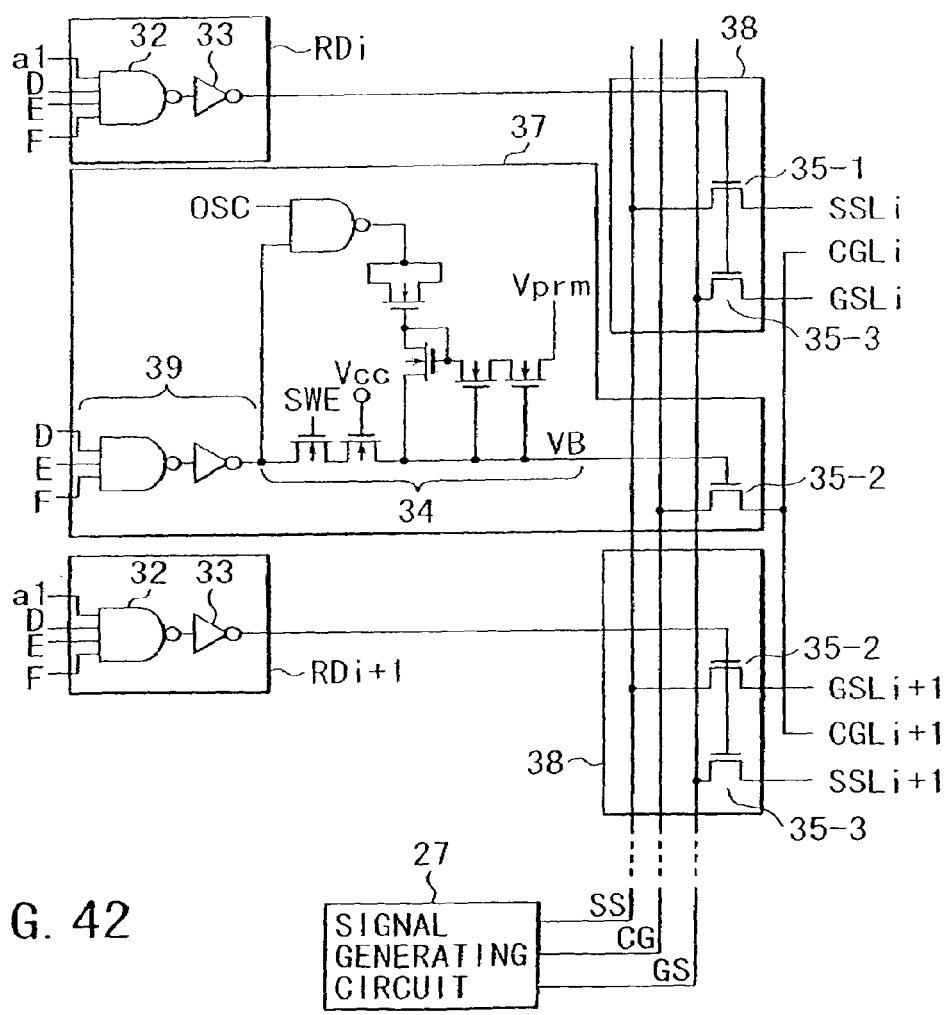
FIG. 42 is a circuit diagram showing examples of the row decoder and driver shown in FIG. 40.

FIG. 42 shows examples of the row decoder RDi, main control gate driver 37, and select gate driver 38.

The row decoder RDi is formed from the NAND circuit 32 and inverter 33. The output signals D, E, and F from the predecoder PDi are input to the NAND circuit.

The select gate driver 38 has the NMOS transistors 35-1 and 35-3 as drive circuits. In the selected row, the output signal from the row decoder RDi is at the power supply potential VCC to turn on the NMOS transistors 35-1 and 35-3. Hence, the signals SS and GS generated by the signal generating circuit 27 are supplied to the select gate lines SSLi and GSLi, respectively.

The main control gate driver 37 has a decoding circuit 39, the booster 34, and the NMOS transistor 35-2 as a drive circuit.

In the main control gate driver 37 common to the selected row and the row adjacent to the selected row, the output signal from the decoding circuit 39 is at the power supply potential VCC. The booster is set in the operative or inoperative state in correspondence with the operation mode, and the power supply potential VCC or boosted high potential is applied to the gate of the NMOS transistor 35-2.

For example, when data is to be programmed, in the main control gate driver 37 common to the selected row and the row adjacent to the selected row, the output potential VB of the booster 34 is at the boosted potential Vprog to turn on the NMOS transistor 35-2. The potential CG (=Vprog) generated by the signal generating circuit 27 is applied to the main control gate lines CGLi and CGLi+1 of the selected row and the row adjacent to the selected row via the NMOS transistor 35-2.

When data is to be erased, in the main control gate driver 37 common to the selected row and the row adjacent to the selected row, the output potential VB of the booster 34 is at the power supply potential VCC to turn on the NMOS transistor 35-2. The potential CG (=0V) generated by the signal generating circuit 27 is applied to the main control gate lines CGLi and CGLi+1 of the selected row and the row adjacent to the selected row via the NMOS transistor 35-2.

When data is to be read, in the main control gate driver 37 common to the selected row and the row adjacent to the selected row, the output potential VB of the booster 34 is at the power supply potential VCC to turn on the NMOS transistor 35-2. The potential CG (=0V or VCC) generated by the signal generating circuit 27 is applied to the main control gate lines CGLi and CGLi+1 of the selected row and the row adjacent to the selected row via the NMOS transistor 35-2.

In the main control gate driver 37 common to two unselected rows adjacent to each other, the output potential VB of the booster 34 is at the ground potential, and the ground potential is applied to the gate of the NMOS transistor 35-2. The NMOS transistor 35-2 is turned off.

Figure 43:
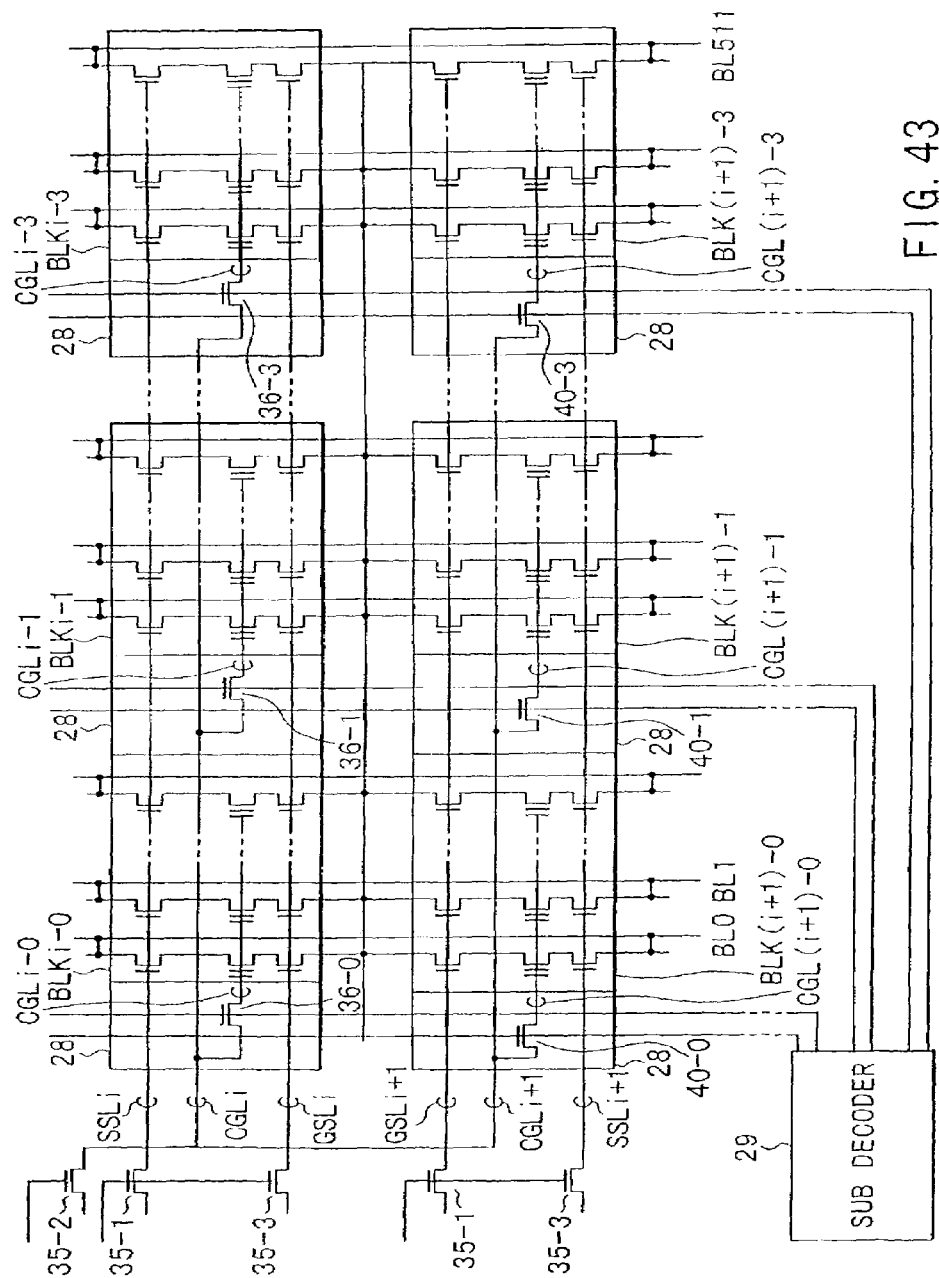
FIG. 43 is a view showing two rows adjacent to each other in the memory cell array shown in FIG. 40.

FIG. 43 shows still an example of a plurality of blocks and sub control gate drivers arranged in two rows adjacent to each other.

This example corresponds to the circuit block shown in FIG. 40, and four blocks are arranged in one row.

Blocks BLKi-j and BLK(i+1)-j have sub control gate lines CGLi-j and CGL(i+1)-j (j=0, 1, 2, 3), respectively. The sub control gate line CGLi-j is connected to memory cells of a positive integer multiple of 1 byte (e.g., 16 bytes) arranged in the block BLKi-j. The sub control gate line CGL(i+1)-j is connected to memory cells of a positive integer multiple of 1 byte (e.g., 16 bytes) arranged in the block BLK(i+1)-j.

The sub control gate line CGLi-j is connected to the main control gate line CGLi via the NMOS transistor 36-j serving as a drive circuit in the sub control gate driver 28. The sub control gate line CGL(i+1)-j is connected to the main control gate line CGLi+1 via an NMOS transistor 40-j serving as a drive circuit in the sub control gate driver 28.

The NMOS transistors 36-j and 40-j are ON/OFF-controlled by the sub decoder 29. The sub decoder 29 has a function of selecting one NMOS transistor 36-j (one block). To select the block BLKi-1, the NMOS transistor 36-1 is turned on. At this time, the main control gate line CGLi is electrically connected to the sub control gate line CGLi-1.

The sub decoder 29 may have a function of selecting a plurality of or all NMOS transistors.

In the EEPROM of this example as well, the memory cell array is formed from a plurality of blocks arranged in a matrix in the row and column direction, and the data read, erase, or program operation can be performed in units of blocks. Hence, in this example as well, the data change operation for byte data shown in FIGS. 32 or 33 can be applied. That is, the data change operation for byte data can be performed to read only data of the selected block (data of a positive integer multiple of 1 byte) in the selected row without reading data of one page in the selected row.

For this reason, unnecessary read, erase, and program operations for memory cells whose data are not to be changed can be omitted, and the substantial program/erase endurance characteristics, i.e., the number of page data change operations can be improved.

In the present invention, one main control gate driver (including a booster) is commonly used for a plurality of (e.g., two) rows adjacent to each other. Hence, the column-direction width of the main control gate driver having a large size can be made larger than the width of one row, and the main control gate driver can be easily laid out in circuit design.

In the program mode, the high potential Vprog is applied to the main control gate line of the selected row, and the power supply potential VCC is applied to the select gate lines. For this reason, only the main control gate driver which must output the high potential Vprog is commonly used for a plurality of rows. Select gate drivers are prepared in units of rows.

For example, in the program mode, the high potential Vprog is applied to two main control gate lines. This high potential Vprog is applied to only the sub control gate line in the block selected by the sub decoder and therefore does not pose any problem in operation.

Figure 44:
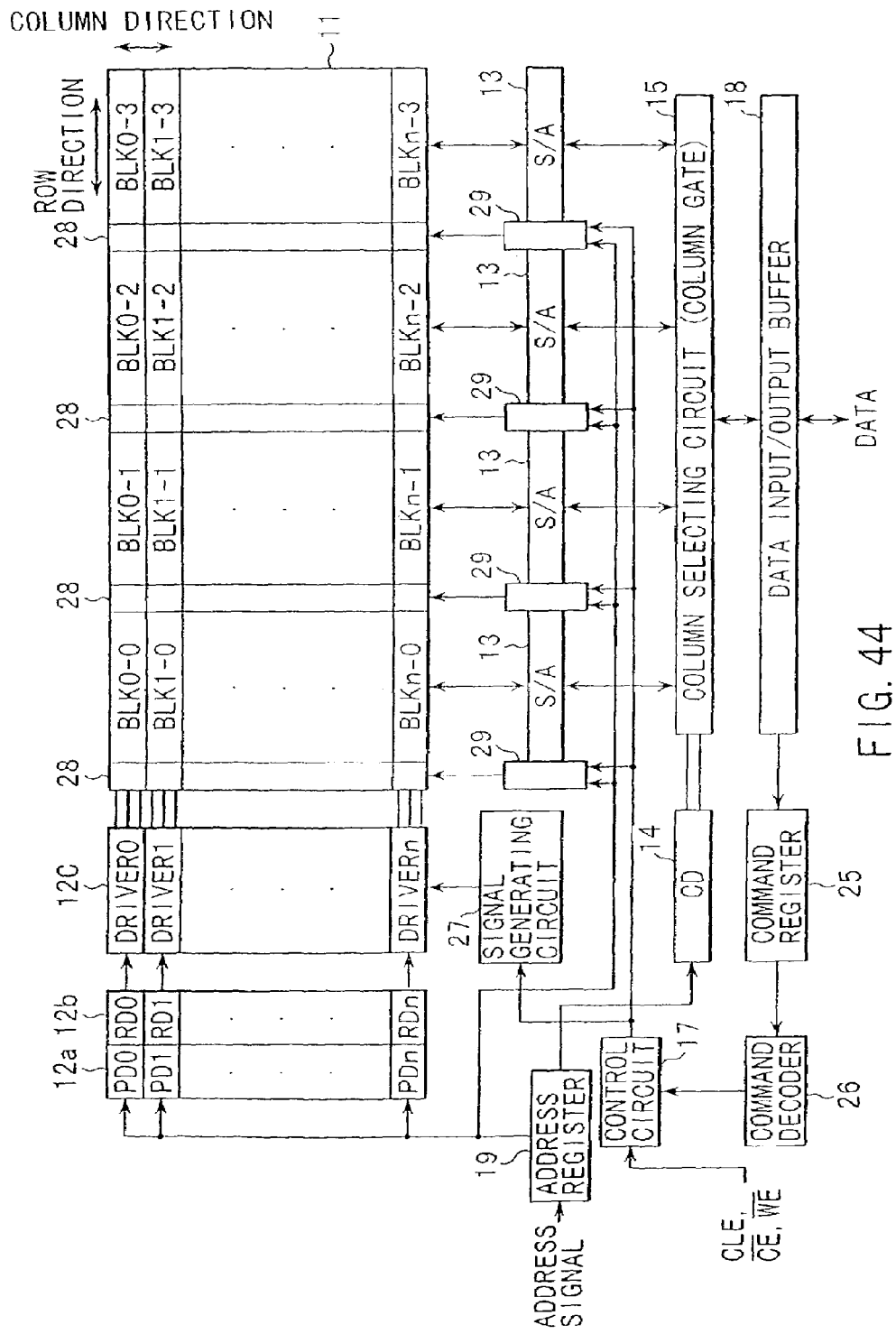
FIG. 44 is a block diagram showing a layout example of a sub decoder.

FIG. 44 shows a layout example of sub decoders.

In the present invention, memory cells of one page of the memory cell array 11 are divided into a plurality of blocks, and the plurality of blocks BLKi-j are arranged in the row direction. The sub control gate drivers 28 are arranged between the blocks BLKi-j in the row direction. The sense amplifiers 13 are arranged in correspondence with the blocks BLKi-j in the row direction.

Spaces are formed between the sense amplifiers 13 in correspondence with the sub control gate drivers 28. In this example, the sub decoders 29 are arranged in these spaces.

As in this example, when the sub decoders 29 are arranged at a plurality of positions in correspondence with the sub control gate drivers 28, the space on the chip can be effectively utilized, as compared to the case wherein the sub decoders 29 are arranged at one position. For this reason, the chip size can be reduced.

Figure 45:
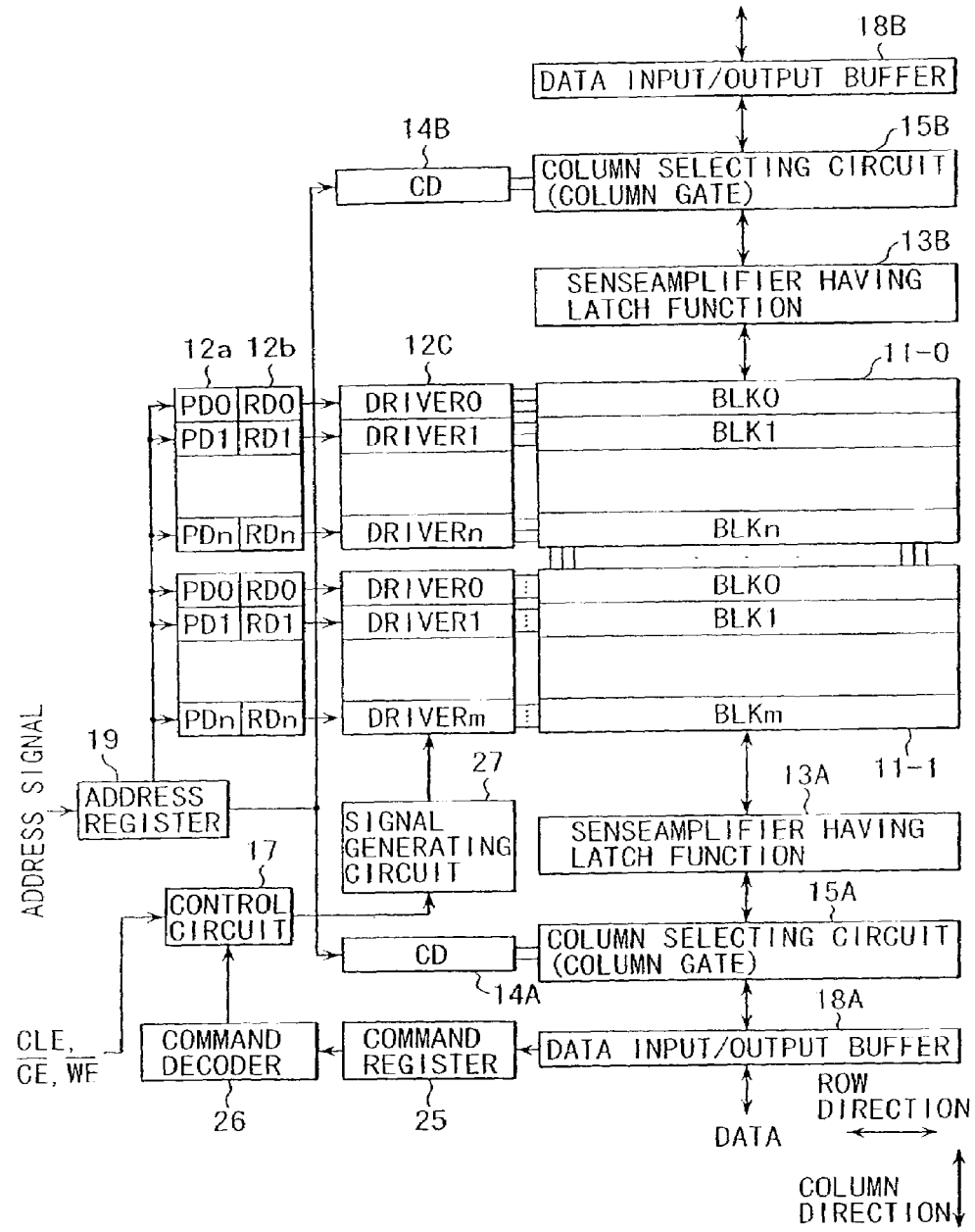
FIG. 45 is a block diagram showing an example of the EEPROM to which the present invention is applied.
Figure 47:
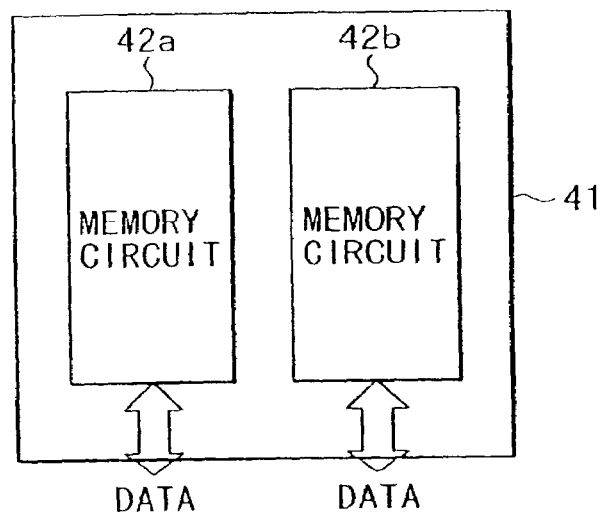
FIG. 47 is a block diagram showing still another example of the EEPROM to which the present invention is applied.

FIGS. 45 to 47 show EEPROMs to which the present invention can be applied.

In the example shown in FIG. 45, sense amplifiers 13A and 13B having the latch function, column selecting circuits 15A and 15B, and data input/output buffers 18A and 18B are arranged at two ends of the memory cell array in the column direction. In this example, the memory cell array has the 3-tr cell section (FIG. 26) 11-0 and NAND cell section 11-1. The memory cell array may have only the 3-tr cell section.

According to this example, since the circuit such as sense amplifiers for the read or program operation are arranged at the two ends of the memory cell array in the column direction, these circuits can be easily laid out, and the load in circuit design can be reduced.

In the example shown in FIG. 46, the memory cell array is formed from the 3-tr cell section 11-0 and NAND cell section 11-1. The 3-tr cell section 11-0 is arranged on the side of the sense amplifiers 13. The memory cells of the 3-tr cell section 11-0 are used as a cache memory.

According to this example, since data of the NAND cell section 11-1 can be temporarily stored in the 3-tr cell section (cache memory) in units of blocks, data can be read at a high speed.

In the example shown in FIG. 47, a plurality of memory circuits 42a and 42b are formed in one chip 41. The memory circuits 42a and 42b independently perform read, program, and erase operations. For example, while the memory circuit 42a is reading data, the memory circuit 42b can program data. The EEPROM of the present invention is used for at least one of the memory circuits 42a and 42b.

According to this example, since two different operations can be simultaneously performed, the data processing efficiency increases.

In the above description, the cell unit having one memory cell with a stacked gate structure and two select transistors respectively connected to the two ends of the memory cell is the main component.

According to this cell unit, various characteristic features including the data change operation for byte data (or page data) can be obtained, as described above.

However, when the cell unit is formed from three transistors (only one memory cell), the cell size per memory cell becomes larger than that in the conventional NAND flash EEPROM. This is not always advantageous for an increase in memory capacity by increasing the degree of integration of memory cells.

A new cell unit structure and data program method capable of reducing the cell size per memory cell while maintaining the function of changing data in units of bytes (or pages) will be described below.

The conventional NAND flash EEPROM will be examined.

In the conventional NAND flash EEPROM, for example, 16 series-connected memory cells are arranged in one memory cell unit. This structure is optimum to reduce the cell size per memory cell.

Although this structure can reduce the cell size, the data change operation for byte data (or page data) is impossible.

The reason why the data change operation for byte data (or page data) is impossible in the conventional NAND flash EEPROM will be described.

To understand the reason why data cannot be changed in units of bytes (or pages) in the NAND flash EEPROM, the data change operation of the NAND flash EEPROM must be understood first.

The data change operation of the NAND flash EEPROM is performed in units of blocks.

First, data are erased from all memory cells of the NAND cell unit in the selected block at once (operation of removing electrons from the floating gate to decrease the threshold value). After this, for example, data are sequentially programmed in units of pages starting from a source-side memory cell toward a drain-side memory cell of the NAND cell unit in the selected block.

Figure 48:
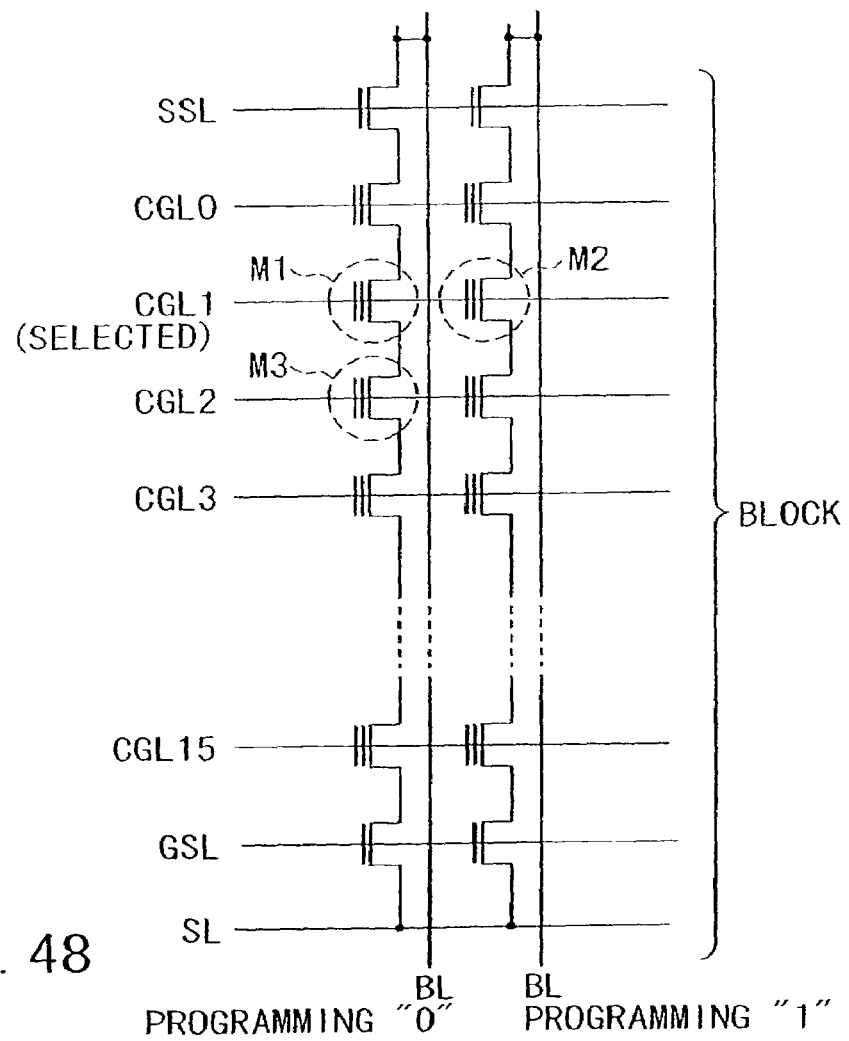
FIG. 48 is a view showing a disturbance in the NAND EEPROM in the program mode.
Figure 49:
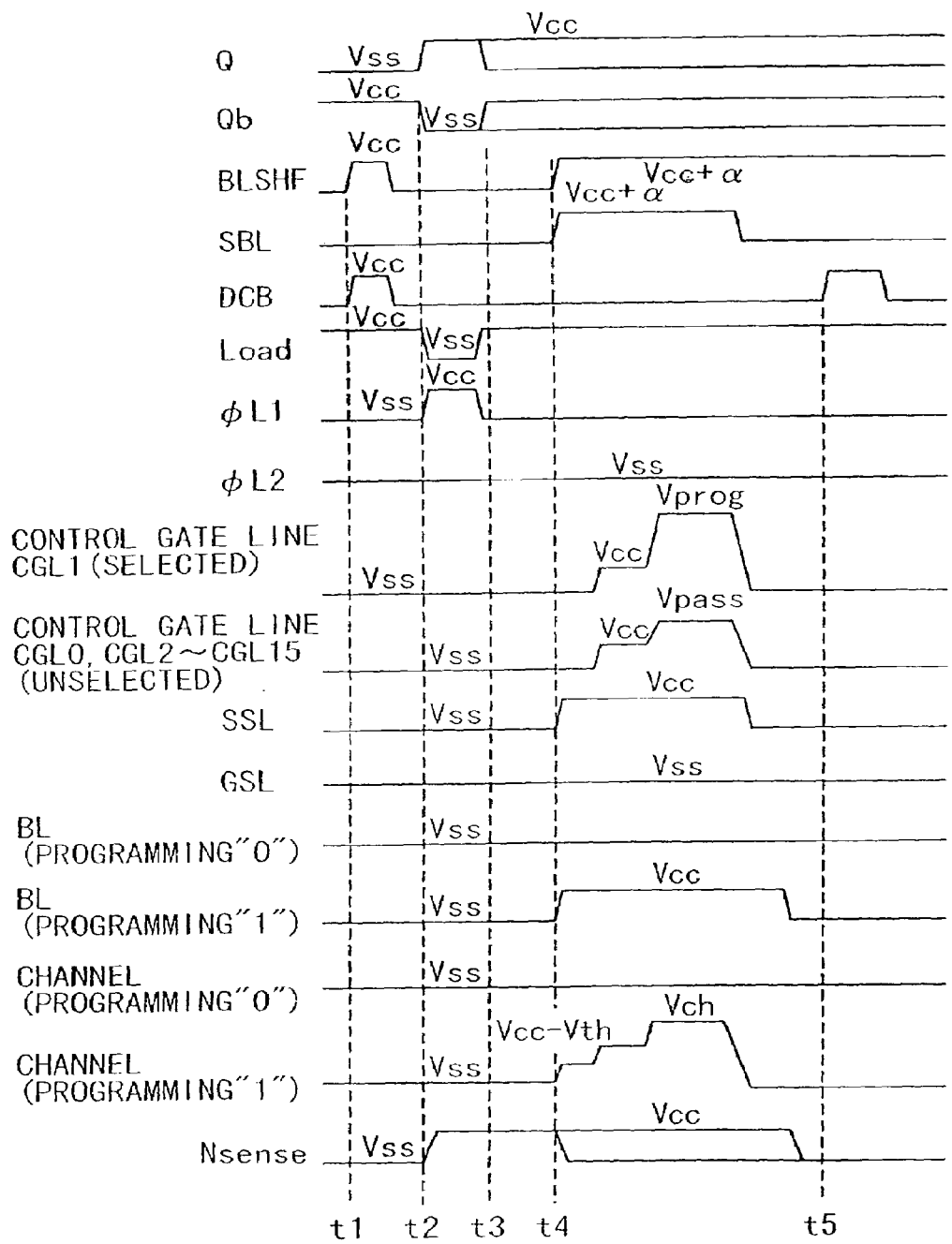
FIG. 49 is a timing chart showing the data program operation of the NAND EEPROM.

Details of the data program operation will be described with reference to FIGS. 48 and 49.

In this example, data are programmed in memory cells connected to a control gate line CGL1.

First, a potential of 0V is applied to the select gate line GSL on the source side (source line side) to cut off the select transistor on the source side. In addition, the power supply potential VCC is applied to the select gate line SSL on the drain side (bit line side) to turn on the select transistor on the drain side.

The potential of the bit line connected to a memory cell M1 for "0" programming (operation of injecting electrons into the floating gate to increase the threshold value) is set at 0V. The potential of the bit line connected to a memory cell M2 for "1" programming (operation of maintaining the erase state) is set at the power supply potential VCC.

At this time, the potentials of the channels of all memory cells in the NAND cell unit including the memory cell M1 for "0" programming are at 0V. The potentials of the channels of all memory cells in the NAND cell unit including the memory cell M2 for "1" programming are precharged to VCC-Vth (Vth is the threshold voltage of the select transistor) After this, the drain-side (bit-line-side) select transistor in the NAND cell unit including the memory cell for "1" programming is cut off.

The potential of the control gate line (selected) CGL1 increases from 0V to the power supply potential VCC (e.g., 3.3V) and then from the power supply potential VCC to the program potential Vprog (e.g., 18V) The potentials of control gate lines (unselected) CGL0, CGL2, . . . , CGL15 increase from 0V to the power supply potential VCC and then from the power supply potential VCC to a potential Vpass (VCC<Vpass (e.g., 9V)<Vprog).

In the memory cell M1 for "0" programming, the channel potential is 0V. A high voltage is applied to the tunnel insulating film between the floating gate and the channel to move electrons from the channel to the floating gate. On the other hand, in the memory cell M2 for "1" programming, the channel is floating. Capacitive coupling increases the channel potential to Vch. Hence, in the memory cell M1 for "1" programming, no high voltage is applied to the tunnel insulating film between the floating gate and the channel, and the erase state is maintained.

The potential Vpass applied to the unselected control gate lines CGL0, CGL2, . . . , CGL15 in the selected block will be examined.

In the data program mode, when election injection into the floating gate of the memory cell M2 is suppressed to maintain the erase state of the memory cell M2, "1" programming for the memory cell M2 is achieved. The memory cell M2 can maintain the erase state by, in the data program mode, sufficiently increasing the channel potential of each memory cell in the NAND cell unit including the memory cell M2 by capacitive coupling to relax the voltage to be applied to the tunnel insulating film between the floating gate and the channel of the memory cell M2.

The channel potential of each memory cell in the NAND cell unit including the memory cell M2 depends on the potential Vpass applied to the unselected control gate lines CGL0, CGL2, . . . , CGL15. The higher the potential Vpass is, the higher the channel potential of each memory cell in the NAND cell unit including the precharge PMOS transistor M2 becomes. This prevents any program error for the memory cell M2.

However, when the potential Vpass is increased, a program error readily occurs for an unselected memory cell M3 in the NAND cell unit including the memory cell M1 for "0" programming.

More specifically, the channel potential of each memory cell in the NAND cell unit including the memory cell M1 is maintained at 0V. For this reason, when the potential Vpass approaches the program potential Vprog, "0" programming is performed even for the unselected memory cell M3. To prevent any program error for an unselected memory cell in the NAND cell unit including the memory cell M1, the potential Vpass must be made as low as possible.

As described above, the potential Vpass to be applied to the unselected control gate lines CGL0, CGL2, . . . , CGL15 must not be too high or too low. The potential Vpass is set to have an optimum value for preventing "0" programming in the selected memory cell M2 for "1" programming or the unselected memory cell M3. For example, VCC<Vpass (e.g., 9V)<Vprog.

The data change operation of the NAND flash EEPROM has been described above in detail. The reason why the data change operation of the NAND flash EEPROM is not performed in units of bytes (or pages) will be described below.

Assume that the data change operation is performed in units of bytes (or pages) in the NAND flash EEPROM.

In this case, one control gate line, e.g., the control gate line CGL1 may be repeatedly selected many times, and only memory cells connected to the control gate line CGL1 may be repeatedly subjected to data change many times. Under this circumstance, the operation of erasing the data of the memory cells connected to the control gate line CGL1 and the operation of programming data in the memory cells connected to the control gate line CGL1 are repeatedly performed.

At this time, in the data program mode, the potential Vpass is repeatedly applied to the control gates of unselected memory cells in the selected block many times.

When the data change operation for byte data is repeatedly performed in the NAND flash EEPROM many times, the threshold value of the unselected memory cell in the selected block may be gradually increased by the potential Vpass (electrons are gradually injected into the floating gate) to generate a program error.

To avoid this, the potential Vpass is decreased, or the data change operation is performed in units of blocks.

However, as described above, the potential Vpass is set at the optimum value for preventing "0" programming (program error) in the selected memory cell for "1" programming or an unselected memory cell in the same cell unit as that of the memory cell for "0" programming in the data program operation of one cycle. For this reason, the potential Vpass cannot be made lower.

As a consequence, in the NAND flash EEPROM, the data change operation for byte data (or page data) is impossible, and the data change operation in units of blocks is performed.

A new cell unit structure and data program method which can reduce the cell size per memory cell, as in the NAND flash EEPROM, and also achieve the data change operation for byte data (or page data) by decreasing the potential Vpass will be described below.

Figure 50:
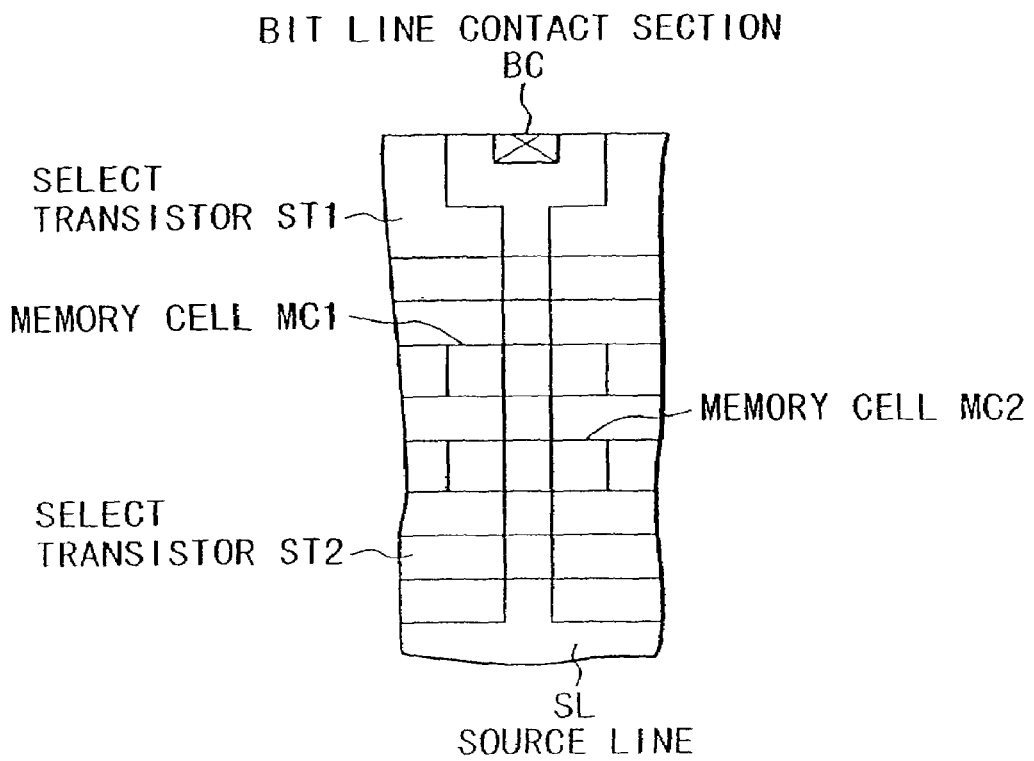
FIG. 50 is a view showing a memory cell unit of the byte EEPROM of the present invention.
Figure 51:
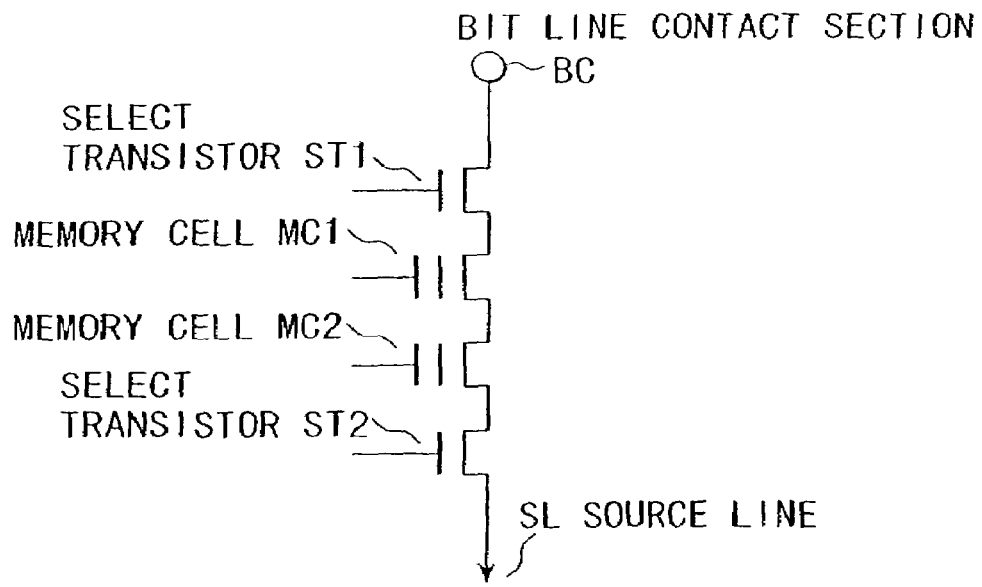
FIG. 51 is a view showing the equivalent circuit of the structure shown in FIG. 50.

FIG. 50 shows a memory cell unit of the byte EEPROM of the present invention. FIG. 51 shows the equivalent circuit of the memory cell shown in FIG. 50.

Each of memory cells MC1 and MC2 has a control gate and a floating gate, i.e., the same structure as that of a memory cell of a flash EEPROM. The memory cells MC1 and MC2 are connected in series and have, at the two ends of the structure, the select transistors ST1 and ST2, respectively. The select transistor ST1 is connected to a bit line via the bit line contact section BC. The select transistor ST2 is connected to the source line SL.

The memory cells MC1 and MC2 and select transistors ST1 and ST2 form one memory cell unit. Arraying a plurality of memory cell units forms a memory cell array.

The memory cell unit of the present invention can be regarded as the NAND cell unit of a NAND flash EEPROM, which has two memory cells (two NAND cells) in one NAND unit.

However, in the present invention, the number of memory cells in one memory cell unit is not limited to two. As long as conditions to be described later are satisfied, a plurality of (e.g., 3, 4, or 5) memory cells can be set. The number of memory cells in the memory cell unit may be 16, i.e., equal to that in the conventional NAND flash EEPROM, as needed.

The structural advantages of the byte EEPROM of the present invention will be described.

The memory cell section of the byte EEPROM of the present invention has the same structure as that in the NAND flash EEPROM. However, usually, the number of memory cells in the cell unit of the byte EEPROM of the present invention is smaller that (e.g., 16) in the NAND flash EEPROM.

Since the process of the NAND flash EEPROM can be directly employed, the byte EEPROM of the present invention can increase the memory capacity and reduce the production cost while the erase operation can be performed in units of bytes (to be described later).

A case wherein two memory cells are formed in the cell unit in the present invention will be described examined.

In the present invention, when the design rule is 0.4 µm, the short-side length a of two memory cells is 1.2 µm and the long-side length b is 3.96 µm. The area ([short-side length a×long-side length] b/2) per memory cell is 2.376 µm². In the NAND flash EEPROM with cell units each having 16 memory cells, when the design rule is 0.4 µm, the area per memory cell is 1.095 µm².

That is, when the memory cell unit (2-NAND cell) of the present invention is employed, the area per memory cell is as small as about twice the area per memory cell of the 16-NAND cell.

In the conventional byte EEPROM as shown in FIGS. 65 and 66, when the design rule is 0.4 µm, the area per memory cell is 36 µm². In a cell unit having one memory cell sandwiched by two select transistors (3-tr cell or 1-NAND cell), when the design rule is 0.4 µm, the area per memory cell is 3.84 µm².

That is, in the memory cell unit of the present invention (2-NAND cell), the area per memory cell can be made smaller than that in the conventional byte EEPROM or 1-NAND cell.

Table 5 shows comparison of the areas per memory cell in accordance with the memory cell unit structures.

TABLE 5

| 16-NAND CELL | 2-NAND CELL | 1-NAND CELL (3-tr cell) | NOR Type |
|---|---|---|---|
| Design Rule: 0.4 µm | | | |
| 1.095 µm² (1) | 2.376 µm² (2.17) | 3.84 µm² (3.51) | 1.82 µm² (1.66) |
| Design Rule: 0.25 µm | | | |
| 0.293 µm² (1) | 0.712 µm² (2.43) | 1.189 µm² (4.06) | 0.54 µm² (1.84) |

As is apparent from Table 5, the area per memory cell of the memory cell unit (2-NAND cell) of the present invention is larger than that in the NAND flash EEPROM (16-NAND cell) but is as small as about 60% that of the 1-NAND cell (3-tr cell).

According to the cell unit structure of the present invention, reduction of the memory cell area can contribute to an increase in memory capacity of the byte EEPROM, reduction of the chip area, and reduction of the manufacturing cost.

In addition, the byte EEPROM of the present invention can be manufactured by the same process as that of the NAND flash EEPROM and can easily be applied to a nonvolatile memory embedded LSI.

The memory cell of the byte EEPROM of the present invention has the same structure as that in the NAND flash EEPROM. Hence, for one memory cell, the data change method of the flash EEPROM, i.e., data change method using the F-N tunneling phenomenon can be directly applied. For this reason, not only the manufacturing cost but also the developing cost can be reduced.

In the cell unit structure of the present invention, a plurality of (e.g., 2, 3, . . . ) memory cells are connected between two select transistors. For this reason, as in the NAND flash EEPROM, when data change operation for byte data (or page data) is repeatedly performed, a program error may occur for an unselected memory cell in the selected block, where the potential Vpass is applied to the control gate.

This problem is solved by the following means.

In the NAND flash EEPROM, the potential Vpass is set at the optimum value under the condition that in the program operation of one cycle, "0" programming does not occur for a memory cell for executing "1" programming (maintaining the erase state), or an unselected memory cell in the same cell unit as that of the memory cell for "0" programming.

This optimum value is determined independently of the power supply potential VCC or a potential Vread to be applied to the control gate of an unselected memory cell in the read mode. Usually, VCC (e.g., 3.3V)<Vpass (e.g., 9V)<Vprog (e.g., 18V).

In the present invention, the potential Vpass is set at the power supply potential VCC (e.g., 3.3V) or the potential Vread (e.g., 4.5V) to be applied to the control gate of an unselected memory cell in the read mode.

The potentials VCC and Vread are lower than the potential Vpass (e.g., 9V) used in the NAND flash EEPROM.

In the present invention, by setting the potential Vpass at the power supply potential VCC or the potential Vread to be applied to the control gate of an unselected memory cell in the read mode, i.e., by making the potential Vpass lower than that used in the NAND flash EEPROM, the problem of the program error for the unselected memory cell in the selected block in repeating the data change operation for byte data (or page data) is prevented.

In the present invention, the potential Vpass is set at the potential VCC or Vread, and therefore, the circuit for generating the potential Vpass need not be prepared. For this reason, the structure of the control gate driver is simplified. This allows size reduction of the control gate driver, easy layout, and a decrease in the design or developing period.

In the present invention, the potential Vpass is set at the power supply potential VCC or the potential Vread to be applied to the control gate of an unselected memory cell in the read mode. For this reason, in the data program operation of one cycle, an increase in the channel potential of the memory cell for executing "1" programming (maintaining the erase state) may be insufficient.

In the present invention, the number of memory cell in the cell unit, the initial potential of the channel of the memory cell for "1" programming, and the coupling ratio between the control gate and channel of the memory cell are set such that the channel potential of the memory cell for "1" programming sufficiently increases.

For example, assume that the initial potential of the channel of the memory cell for "1" programming and the coupling ratio between the control gate and channel of the memory cell are equal to those in the NAND flash EEPROM. In this case, as shown in FIGS. 50 and 51, when two memory cells are connected in the cell unit, the channel potential of the memory cell for "1" programming can be increased to almost the same level as in the NAND flash EEPROM (this will be described later in detail in association with the data program operation).

As the first advantage of the present invention, since the cell unit structure is the same as in the NAND flash EEPROM, the cell size can be reduced, the memory capacity can be increased, and cost can be reduced.

As the second advantage, the potential Vpass to be applied to the unselected control gate line in the selected block in the data program mode is set at the power supply potential VCC or the potential Vread to be applied to the unselected control gate line in the read mode. For this reason, the problem of the program error for an unselected memory cell in the selected block can be prevented, and the data change operation for byte data (or page data) becomes possible.

As the third advantage, the number of memory cells in the cell unit, the initial potential of the channel of the memory cell for "1" programming, and the coupling ratio between the control gate and channel of the memory cell are set to appropriate values such that the channel potential of the memory cell for "1" programming sufficiently increases even when the potential Vpass is set at the potential VCC or Vread. The program error for the memory cell for "1" programming can also be prevented.

The erase, program, and read operations of the byte EEPROM of the present invention will be sequentially described below.

●Erase Operation

Figure 52:
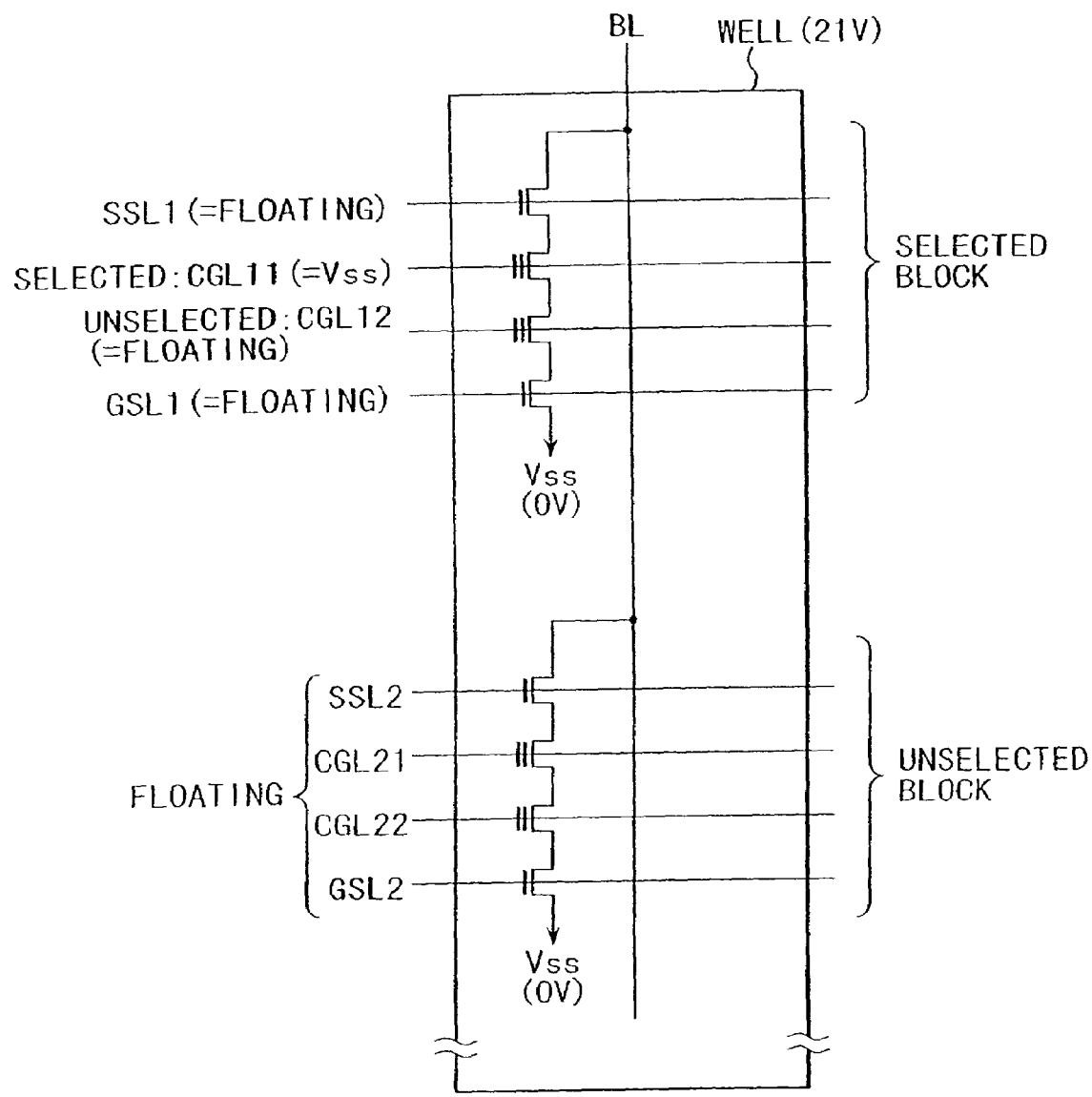
FIG. 52 is a view showing a potential applied to the memory cell unit in the erase operation.

As shown in FIG. 52, the ground potential VSS is applied to a selected control gate line (word line) CGL11 in the selected block. An unselected control gate line (word line) CGL12 in the selected block is set in the floating state. Select gate lines SSL1 and GSL1 in the selected block, and control gate lines (word lines) CGL21 and CGL22 and select gate lines SSL2 and GSL2 in the unselected block are also set in the floating state.

After this, an erase pulse of, e.g., 21V and 3 ms is applied to the bulk (cell P-well). At this time, in the memory cell connected to the selected control gate line CGL11 in the selected block, an erase voltage (21V) is applied between the bulk and control gate line. Electrons in the floating gate move to the bulk due to the F-N (Fowler-Nordheim) tunneling phenomenon.

As a result, the threshold voltage of the memory cell connected to the selected control gate line CGL11 in the selected block is about −3V. In the selected memory cell, data is erased by the erase pulse of one cycle such that the threshold voltage becomes about −3V.

On the other hand, the unselected control gate line CGL12 in the selected block and the control gate lines CGL21 and CGL22 in the unselected block are set in the floating state.

When the erase pulse of, e.g., 21V and 3 ms is applied to the bulk (cell P-well), the potentials of the control gate lines CGL12, CGL21, and CGL22 also increase due to capacitive coupling between the bulk and the control gate lines in the floating state.

The coupling ratio between the control gate lines CGL12, CGL21, and CGL22 and the bulk will be examined. The control gate lines CGL12, CGL21, and CGL22 are connected to drive circuits (the sources of MOS transistors), metal interconnections for connecting the drive circuits and control gate lines (polysilicon layers), and silicide layers forming the control gate lines.

The coupling ratio depends on the parasitic capacitances of the control gate lines CGL12, CGL21, and CGL22 in the floating state. This capacitance contains the source junction capacitance of the MOS transistor as a drive circuit, the overlap capacitance between the source and gate, the capacitances of the polysilicon layer and metal interconnection in the field region, and the capacitances of the control gate line and bulk (cell P-well).

However, most of the parasitic capacitances of the control gate lines CGL12, CGL21, and CGL22 are the capacitances of the control gate lines and bulk (cell P-well).

That is, the coupling ratio between the control gate lines CGL12, CGL21, and CGL22 and the bulk has a large value of, e.g., 0.9. When the potential of the bulk rises, the potentials of the control gate lines CGL12, CGL21, and CGL22 also increase.

For this reason, in memory cells connected to the unselected control gate line CGL12 in the selected block and memory cells connected to the control gate lines CGL21 and CGL22 in the unselected block, the F-N tunneling phenomenon can be prevented.

With the above process, the erase operation is ended.

After the erase operation, the erase verify operation is performed to verify whether the threshold voltages of all memory cells connected to the selected control gate line CGL11 in the selected block fall within −1V.

●Program Operation

Figure 53:
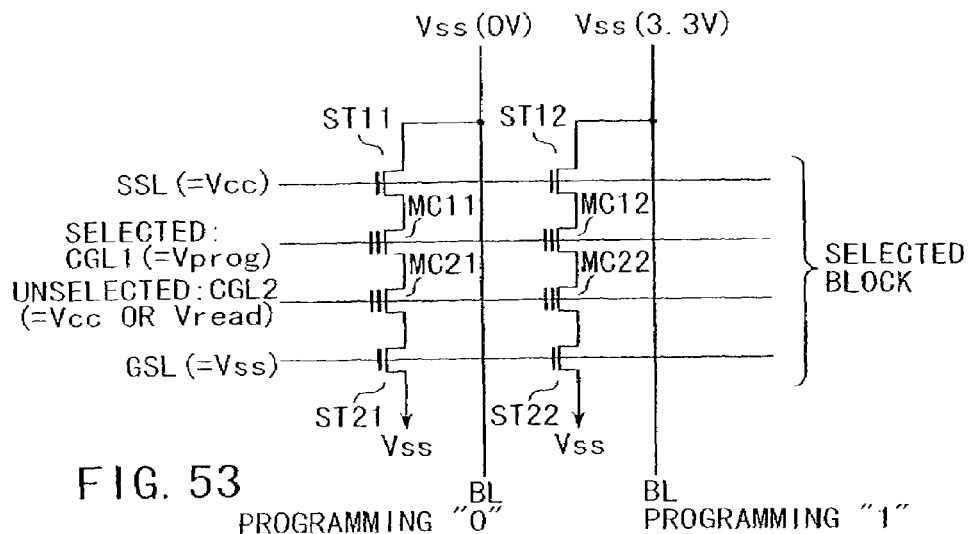
FIG. 53 is a view showing a potential applied to the memory cell unit in the program operation.

A case wherein the program operation is executed for memory cells connected to the control gate line CGL1, as shown in FIG. 53, will be described. All the memory cells to be programmed are in the erase state.

The source-side select gate line GSL in the selected block is set at the ground potential VSS. The select gate line SSL on the drain side is set at the power supply potential VCC. As a result, select transistors ST21 and ST22 on the source side are cut off, and select transistors ST11 and ST12 on the drain side are turned on.

A bit line BL to which a memory cell MC11 for "0" programming is connected is set at the ground potential VSS. The bit line BL to which a memory cell (program inhibit cell) MC12 for "1" programming is connected is set at the power supply potential VCC. The control gate lines CGL1 and CGL2 are set at the ground potential VSS. At this time, the channel potentials of the memory cells MC11 and MC21 are at the ground potential VSS, and the channels of the memory cells MC12 and MC22 are precharged to VCC−Vth (Vth is the threshold voltage of the select transistor ST12).

After this, the control gate lines CGL1 and CGL2 are set at the power supply potential VCC (e.g., 3.3V) or the potential Vread (e.g., 4.5V) to be applied to unselected control gate lines in the read mode. The potential of the selected control gate line CGL1 increases from VCC or Vread to the program potential Vprog (e.g., 18V).

At this time, in the selected memory cell MC11, a large potential difference is generated between the channel (=VSS) and the control gate line CGL1 (=Vprog), and electrons are injected from the channel to the floating gate due to the F-N tunneling phenomenon. With this operation, "0" programming in the selected memory cell MC11 is ended.

Before the high potential is applied to the control gate line, i.e., before the channel potential is boosted, the initial channel potential of the selected memory cell MC12 is at VCC−Vth in the floating state. For this reason, when the selected control gate line CGL1 is set at the program potential Vprog and the unselected control gate line CGL2 is set at the power supply potential VCC or potential Vread, the channel potential of the selected memory cell MC12 also automatically increases due to capacitive coupling.

More specifically, in the selected memory cell MC12, the potential difference between the channel (=Vch) and the control gate line CGL1 (=Vprog) becomes small, and electron injection into the floating gate due to the F-N tunneling phenomenon is suppressed. With this operation, "1" programming in the selected memory cell MC12 is ended.

To execute "1" programming in the selected memory cell (program inhibit cell) MC12, the channel potential (program inhibit potential) Vch of the selected memory cell MC12 must be sufficiently increased to prevent any program error ("0" programming).

The channel potential Vch of the memory cell MC12 after boosting is determined mainly depending on the initial channel potential of the memory cell MC12 before boosting, the coupling ratios between the control gates and channels of the memory cells MC12 and MC22, and the number of (in this example, two) memory cells in the cell unit.

For example, when the number of memory cells in the cell unit is fixed, the channel potential Vch of the memory cell MC12 can be sufficiently increased by increasing the initial channel potential of the memory cell MC12 and the coupling ratios between the control gates and channels of the memory cells MC12 and MC22.

A coupling ratio B between the control gate and channel of a memory cell is calculated by $$B=Cox/(Cox+Cj)$$

where Cox is the sum of gate capacitances of the control gate and channel of the memory cell, and Cj is the sum of junction capacitances of the source and drain regions of the memory cell.

The channel capacitance of the memory cell can be approximately represented by the sum of the capacitances Cox and Cj. Although the channel capacitance of the memory cell includes, in addition to the capacitances Cox and Cj, the overlap capacitance between the control gate and source region, the capacitance between the bit line and source region, and the capacitance between the bit line and drain region, these capacitances are much smaller than the capacitance Cox or Cj and can be neglected.

For the byte EEPROM of the present invention and the conventional NAND flash EEPROM, the value of the channel potential (program inhibit potential) of a memory cell for "1" programming will be examined next in detail.

Assume that the byte EEPROM of the present invention has, e.g., the structure with two memory cells in one cell unit, as shown in FIGS. 50 and 51.

In this case, the channel potential Vch is given by $$Vch=Vini+(Vprog-VCC) \times B+(Vpass-VCC) \times B$$

$$B=Cox/(2 \times Cox+3 \times Cj)$$

(when the number of memory cells is 2, the number of diffusion layers (sources/drains) is 3)

When Cox=Cj=1, the coupling ratio B is 0.2. In the present invention, Vpass=VCC. When the power supply potential VCC is 3V, an initial potential Vini of the channel is 2V, and the program potential Vprog is 16V, the channel potential Vch is $$Vch=2+(16-3) \times 0.2=4.6[V]$$

On the other hand, the channel potential Vch of the NAND flash EEPROM is given by $$Vch=Vini+(15/16) \times (Vpass-VCC) \times B+(1/16) \times (Vprog-VCC) \times B$$

$$B=16 \times Cox/(16 \times Cox+17 \times Cj)$$

(when the number of memory cells is 16, the number of diffusion layers (sources/drains) is 17)

The cell unit of the NAND flash EEPROM has 16 memory cells connected in series. The program potential Vprog is applied to one memory cell, and the potential Vpass is applied to the 15 remaining memory cells.

When Cox=Cj=1, the coupling ratio B is 0.48. When the power supply potential VCC is 3V, an initial potential Vini of the channel is 2V, the program potential Vprog is 16V, and the potential Vpass is 8V, the channel potential Vch is $$Vch = 2 + (15/16) \times (8-3) \times 0.48 + (1/16) \times (16-3) \times 0.48$$

$$= 4.64 \quad [V]$$

As described above, in the byte EEPROM of the present invention, even when the potential Vpass equals the power supply potential VCC (or the potential Vread), the same program inhibit potential (channel potential for the "1" programming cell) as in the NAND flash EEPROM can be obtained by setting the number of memory cells in the cell unit to 2.

In the present invention, when the potential Vpass is set at the power supply potential VCC (or the potential Vread), the voltage between the control gate and channel of the unselected memory cell connected to the unselected control gate line can be relaxed. For this reason, the data change operation for byte data (or page data) can be repeatedly performed without any program error in the unselected memory cell.

In the present invention, even when the potential Vpass is set at the power supply potential VCC (or the potential Vread), the same program inhibit potential (channel potential for the "1" programming cell) as in the NAND flash EEPROM can be obtained. For this reason, any program error in the program inhibit cell ("1" programming cell) connected to the selected control gate line can also be prevented.

Figure 55:
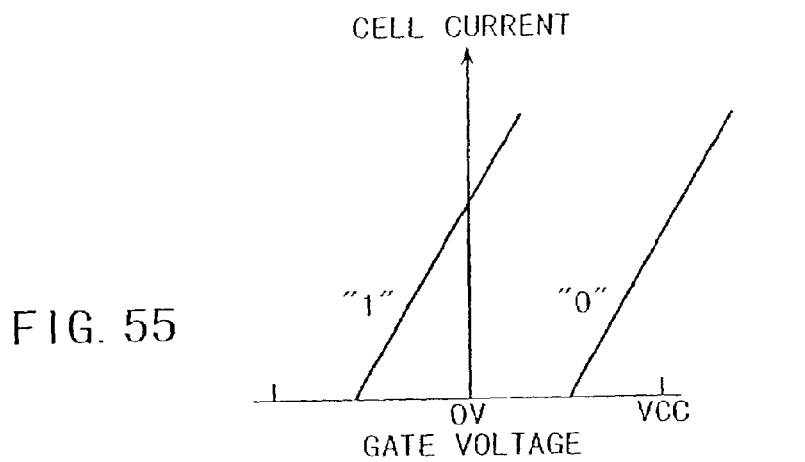
FIG. 55 is a graph showing the relationship between a gate voltage and a cell current corresponding to the data of a memory cell.

As shown in FIG. 55, when "1" data is programmed in the selected memory cell, i.e., the selected memory cell M is in the erase state, the threshold voltage of the selected memory cell is in the negative depletion mode. For this reason, a cell current flows to the selected memory cell to decrease the potential of the bit line BL.

Conversely, when "0" data is programmed in the selected memory cell, the threshold voltage of the selected memory cell is in the positive enhancement mode. For this reason, no cell current flows to the selected memory cell, and the bit line BL is maintained at the precharge potential.

In this way, data "0" or "1" is determined on the basis of whether a cell current flows from the bit line to the source line. A change in the potential of the bit line is amplified (detected) by the sense amplifier.

Data "0" and "1" are discriminated by, e.g., determining whether negative charges are stored in the floating gate of the memory cell.

More specifically, when negative charges are stored in the floating gate, the threshold voltage of the memory cell is high, and the memory cell is of the enhancement type. When no negative charges are stored in the floating gate, the threshold voltage of the memory cell is lower than 0V, and the memory cell is of the depletion type.

Table 6 shows the potentials of the select gate lines SSL and GSL, control gate line (word line) CGL, bit line BLi, cell source line SL, and cell P-well in the above-described erase, program, and read operations.

TABLE 6

|  |  | Erase | Program | Read |
|---|---|---|---|---|
| Selected Block | Select Gate Line SSL on Bit Line Side | VeraxB | VCC | VCC or Vread |
|  | Control Gate Line CGL (Unselected) | VeraxB | VCC or Vread (Vpass in NAND type flash EEPROM) | VCC or Vread |
|  | Control Gate Line CGL (Selected) | 0V | Vprog | 0V |
|  | Select Gate Line GSL on Source Line Side | VeraxB | 0V | VCC or Vread |
| Unselected Block | Select Gate Line SSL on Bit Line Side | VeraxB | 0V | 0V |
|  | Control Gate Line CGL | VeraxB | 0V | 0V |
|  | Select Gate Line GSL on Source Line Side | VeraxB | 0V | 0V |
| Bit Line | "1" Data | Vera-Vb | VCC | VBL → 0V |
|  | "0" Data | Vera-Vb | 0V | VBL |
| Cell Source Line |  | Vera-Vb | VCC | 0V |
| Cell P-well |  | Vera | 0V | 0V |

●Read Operation

Figure 54:
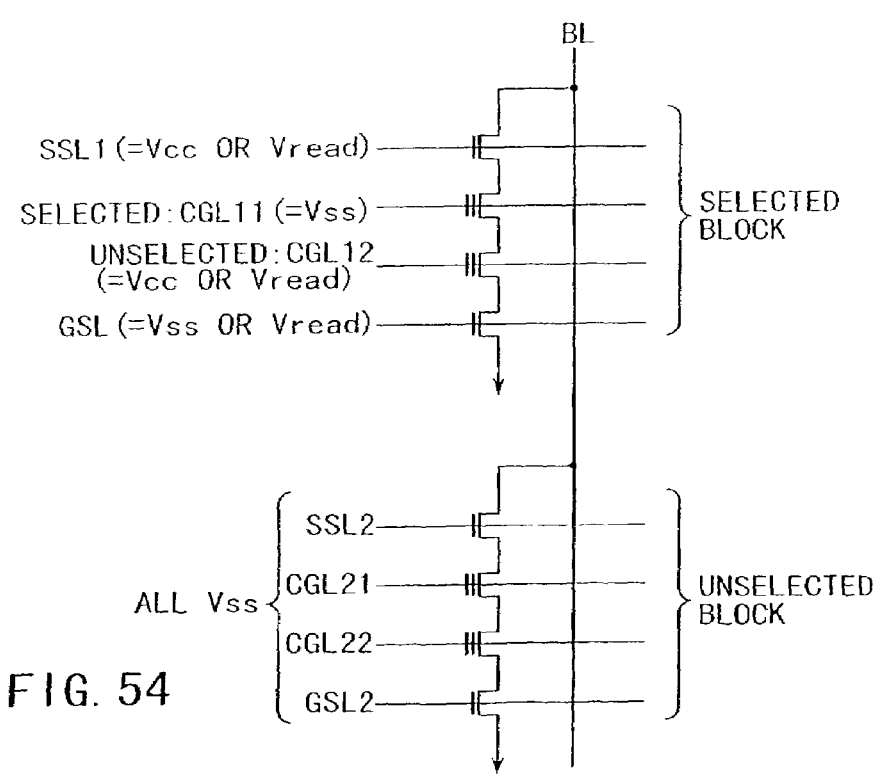
FIG. 54 is a view showing a potential applied to the memory cell unit in the read operation.

As shown in FIG. 54, after the bit line BL is charged to the precharge potential, a potential of 0V is applied to the selected control gate line CGL11 in the selected block, and the power supply potential VCC (e.g., 3.3V) or the read potential Vread (e.g., 4.5V) is applied to the selected control gate line CGL12 and the select gate lines SSL1 and GSL1 in the selected block.

A potential of 0V is applied to the control gate lines CGL21 and CGL 22 and the select gate lines SSL2 and GSL2 in the unselected block.

At this time, the select transistors in the selected block are turned on, and the select transistors in the unselected block are turned off. Unselected memory cells in the selected block are ON independently of the data value (the threshold voltage distribution of the memory cell is shown in FIG. 6).

The selected memory cell in the selected block is ON or OFF in accordance with the data value.

In the erase operation, the selected control gate line CGL in the selected block is set at 0V. The unselected control gate line CGL in the selected block, the control gate lines CGL in the unselected block, and all the select gate lines SSL and GSL are set in the floating state.

In this state, when the erase potential Vera of, e.g., 21V is applied to the cell P-well, the potentials of all the select gate lines SSL and GSL and unselected control gate line CGL, which are in the floating state, increase to Vera×β each (β is the coupling ratio) due to the capacitive coupling with the cell P-well.

When β=0.8, the potentials of all the select gate lines SSL and GSL and unselected control gate line CGL, which are in the floating state, increase to 16.8V.

In the erase operation, a p-n junction formed from the N⁺-type diffusion layer and cell P-well, which are connected to the bit line BLi and cell source line SL, is forward-biased.

For this reason, the bit line BLi and cell source line SL are charged to Vera-Vb. Vb is the built-in potential of the p-n junction.

In the program operation, the bit line BLi connected to the selected memory cell in which "1" data is to be programmed, i.e., the bit line BLi connected to the selected memory cell maintaining the erase state is set at the power supply potential VCC (e.g., 3.3V). The bit line BLi connected to a selected memory cell in which "0" data is to be programmed is set at 0V.

The select gate line SSL in the selected block on the bit line side is set at the power supply potential VCC. The select gate line GSL on the cell source line side is set at 0V. The unselected control gate line CGL is set at the power supply potential VCC or the potential Vread (e.g., 4.5V). The selected control gate line CGL is set at the program voltage Vprog (e.g., 18V).

The select gate lines SSL and GSL, control gate line CGL, and cell P-well in the unselected block are set at 0V.

The cell source line is set at 0V. However, if the channel potential of a memory cell in the selected block, in which "1" data is to be programmed, is boosted by capacitive coupling with the control gate line CGL, and the leakage current of the cell source line poses a problem due to punch-through, the potential of the cell source line is preferably set at the power supply potential VCC.

In the read operation, the select gate lines SSL and GSL and the unselected control gate line CGL in the selected block are set at the power supply potential VCC (e.g., 3.3V) or the read potential Vread (e.g., 4.5V). The selected control gate line CGL is set at 0V. When the bit line is to be precharged before the data read, the bit line BLi is set at the precharge potential (e.g., 1.2V) VBL.

The selected memory cell storing "1" data is turned on, and the cell current flows to this selected memory cell. The bit line BLi is discharged to 0V. On the other hand, the selected memory cell storing "0" data is turned off, and no cell current flows to this selected memory cell. The bit line BLi holds the precharge potential VBL.

Figure 56:
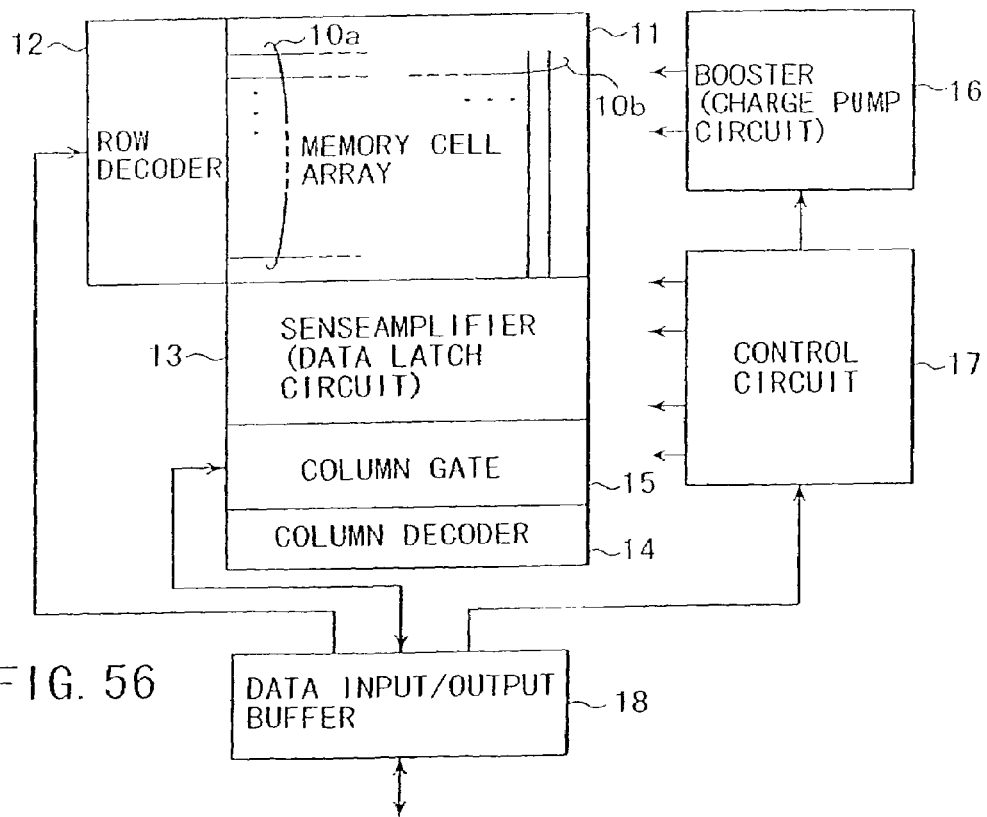
FIG. 56 is a block diagram showing the main portion of the byte EEPROM of the present invention.

FIG. 56 shows the main part of the circuit block of the byte EEPROM of the present invention.

This EEPROM has the memory cell array 11 in which memory cell units each having four elements, i.e., two memory cells and two select transistors sandwiching the memory cells, are arranged in a matrix, the plurality of control gate lines 10a extending in the row direction on the memory cell array 11, and the plurality of bit lines 10b extending in the column direction on the memory cell array 11.

The row decoder 12 selects a row, i.e., one of the control gate lines 10a. Data of memory cells connected to the selected control gate line 10a are input to sense amplifiers 13 each formed from a sense amplifier having a data latch function and arranged in units of columns. A column decoder 14 selects a column, i.e., the bit line BLi.

Data of the sense amplifier of the selected column is externally output from the memory chip via the data input/output buffer 18. Data input to the memory chip is latched by the sense amplifier of the selected column, which has the latch function, via the data input/output buffer 18.

The booster 16 generates a high voltage necessary for the program operation or erase operation. The control circuit 17 controls the operation of each circuit in the memory chip and also serves as an interface between the internal and external circuits of the memory chip. The control circuit 17 includes a sequence means (e.g., a programmable logic array) for controlling the erase, program, and read operations for a memory cell.

Figure 57:
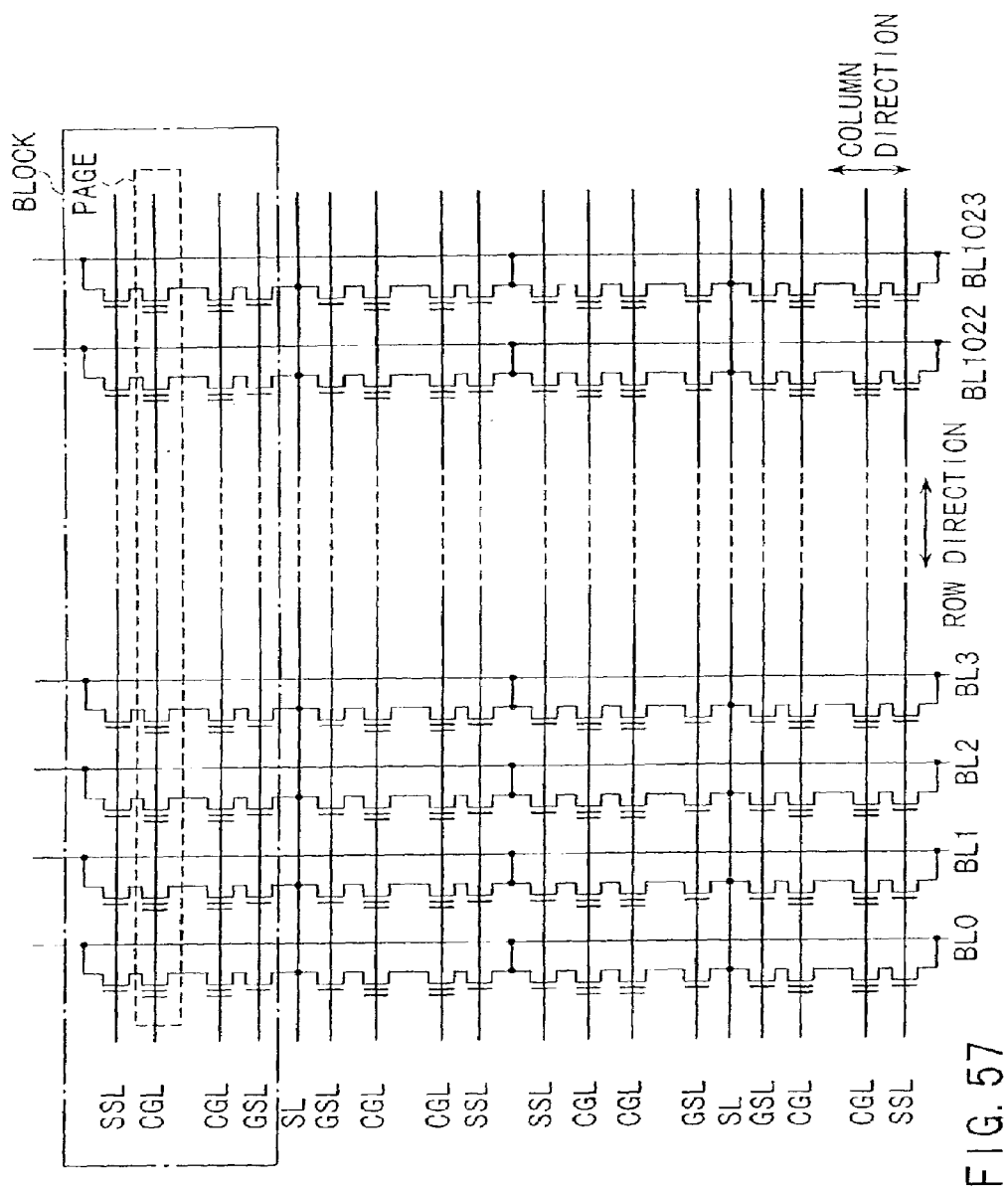
FIG. 57 is a view showing the circuit arrangement of the memory cell array shown in FIG. 56.

FIG. 57 shows the arrangement of the memory cell array 11 shown in FIG. 56.

In this example, a memory cell unit is formed from a NAND cell having two memory cells connected in series and two select transistors respectively connected to the two ends of the NAND cell. The memory cell is formed from a MOSFET having a so-called stacked structure in which the floating gate and control gate are stacked.

A plurality of memory cells in the row direction form one block. A plurality of memory cells connected to one control gate line CGL form one page.

In the present invention, the erase, program, and read operations can be performed in units of pages. In the present invention, when the data change scheme to be described later is employed, the data change operation for byte data can also be performed.

Figure 58:
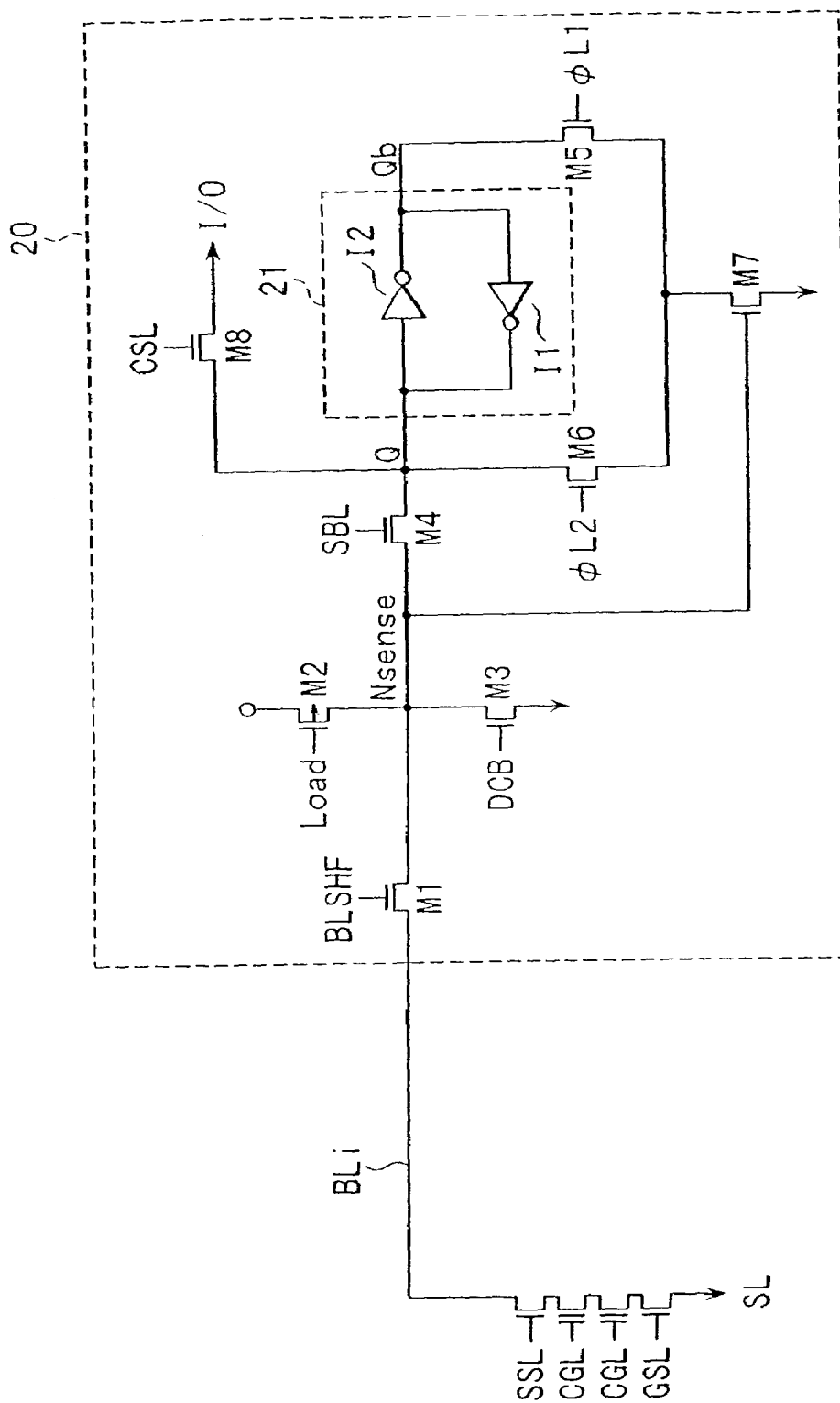
FIG. 58 is a circuit diagram showing an example of the sense amplifier shown in FIG. 56.

FIG. 58 shows one of the sense amplifiers 13 shown in FIG. 56, which has the latch function and is connected to one bit line BLi.

The sense amplifier is mainly constructed by the latch circuit 21 having the two CMOS inverters I1 and I2. The output of one inverter is input to the other inverter. The latch node Q of the latch circuit 21 is connected to the I/O line via the column selection NMOS transistor M8. The latch node Q is also connected to the bit line BLi via the sense amplifier disconnection NMOS transistor M4 and bit line potential clamp NMOS transistor M1.

The connection node between the NMOS transistors M1 and M4 is the sense node Nsense. The sense node Nsense is connected to the precharge PMOS transistor M2 and discharge NMOS transistor M3. The precharge PMOS transistor M2 charges the sense node Nsense in a predetermined period on the basis of the precharge control signal Load. The discharge NMOS transistor M3 discharges the sense node Nsense on the basis of the discharge control signal DCB.

The latch node Qb of the latch circuit 21 is connected to the reset NMOS transistor M5 for forcibly grounding the latch node Qb on the basis of the control signal φL1. The latch node Q of the latch circuit 21 is connected to the reset NMOS transistor M6 for forcibly grounding the latch node Q on the basis of the control signal φL2.

The common source of the reset NMOS transistors M5 and M6 is connected to ground via the sense NMOS transistor M7 controlled by the potential of the sense node Nsense. The sense NMOS transistor M7 is also used to reset the latch circuit 21 together with the NMOS transistors M5 and M6.

Figure 59:
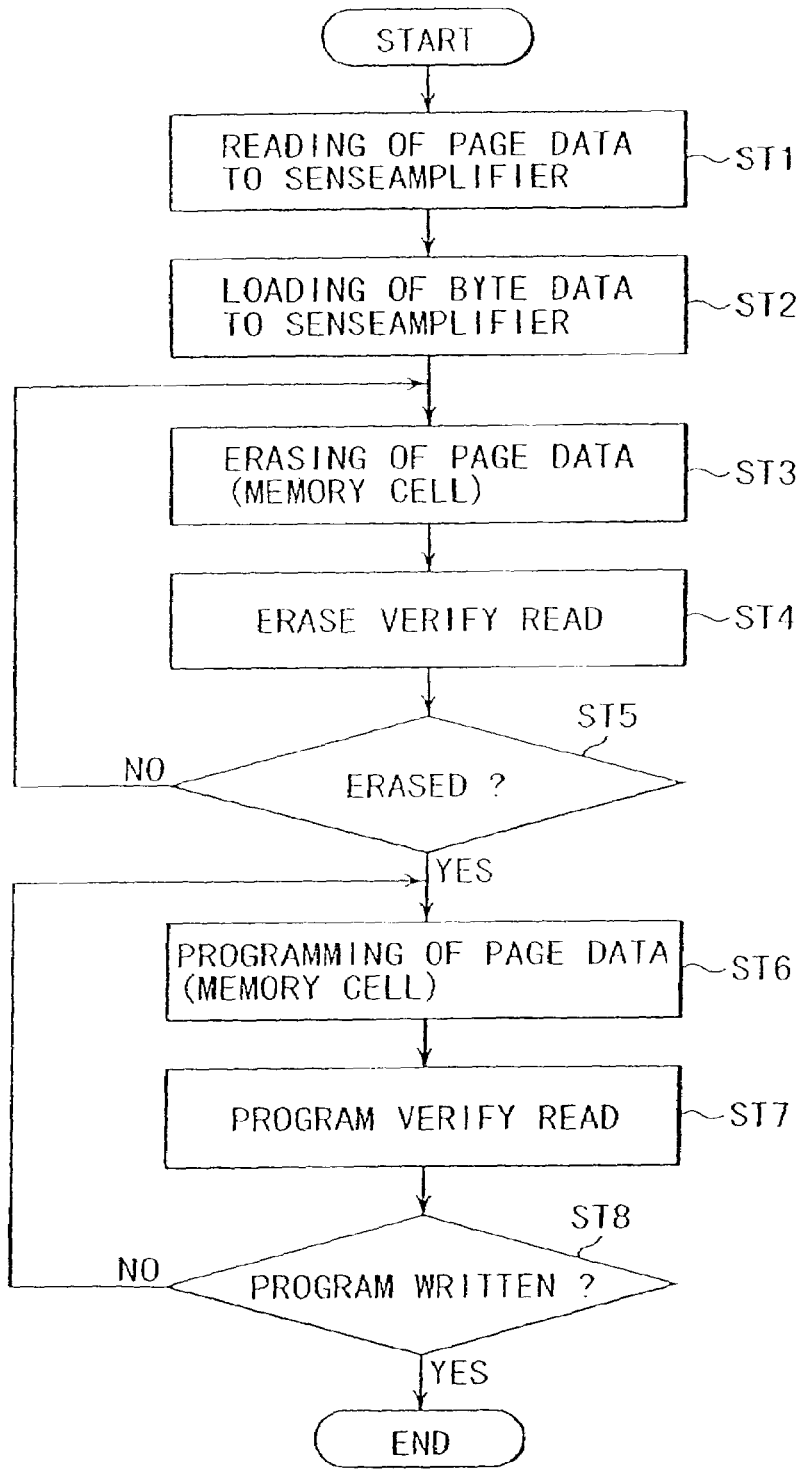
FIG. 59 is a flow chart showing the data change operation for byte data of the present invention.

FIG. 59 is a flow chart schematically showing sequence control of the data change operation for byte data of the byte EEPROM of the present invention.

This sequence control is performed by, e.g., the control circuit 17 shown in FIG. 56. The data change operation for byte data will be briefly described with reference to this flow chart.

In the byte data change mode, data of one page of memory cells connected to a selected control gate line (word line) are read out to the sense amplifiers (page read). The sense amplifiers latch the data of one page (step ST1).

Byte data corresponding to columns designated by addresses is loaded. The loaded byte data is superscribed on byte data in the data of one page latched by the sense amplifiers, which is subjected to data change (step ST2).

The data of one page of the memory cells connected to the selected control gate line are simultaneously erased (page erase) (step ST3). After the erase, an erase verify is performed to verify whether all the memory cells connected to the selected control gate line are completely erased or over-erased (steps ST4 and ST5).

The page erase and erase verify are repeated until the threshold values of all the memory cells of the page fall within a predetermined range. When the threshold values of all the memory cells of the page fall within the predetermined range (completion of erase), the flow advances to the next operation (steps ST3 to ST5).

When only one sense amplifier having the latch function is connected to one bit line (only one page is present), the data in the sense amplifier may be destroyed depending on the result of the erase verify. In this case, the erase is performed only once without an erase verify.

After this, data of one page latched by the sense amplifiers are simultaneously programmed in the memory cells connected to the selected control gate line (step ST6). After programming, a program verify is performed to verify whether the data are completely programmed or over-programmed in the memory cells connected to the selected control gate line (steps ST7 and ST8).

The page program and program verify are repeated until the threshold values of all the memory cells of the page fall within a predetermined range. When the threshold values of all the memory cells of the page fall within the predetermined range (completion of programming), the data change operation for byte data is ended.

When data are to be programmed only once using a high program potential in accordance with one program pulse, the program verify may be omitted.

Figure 60:
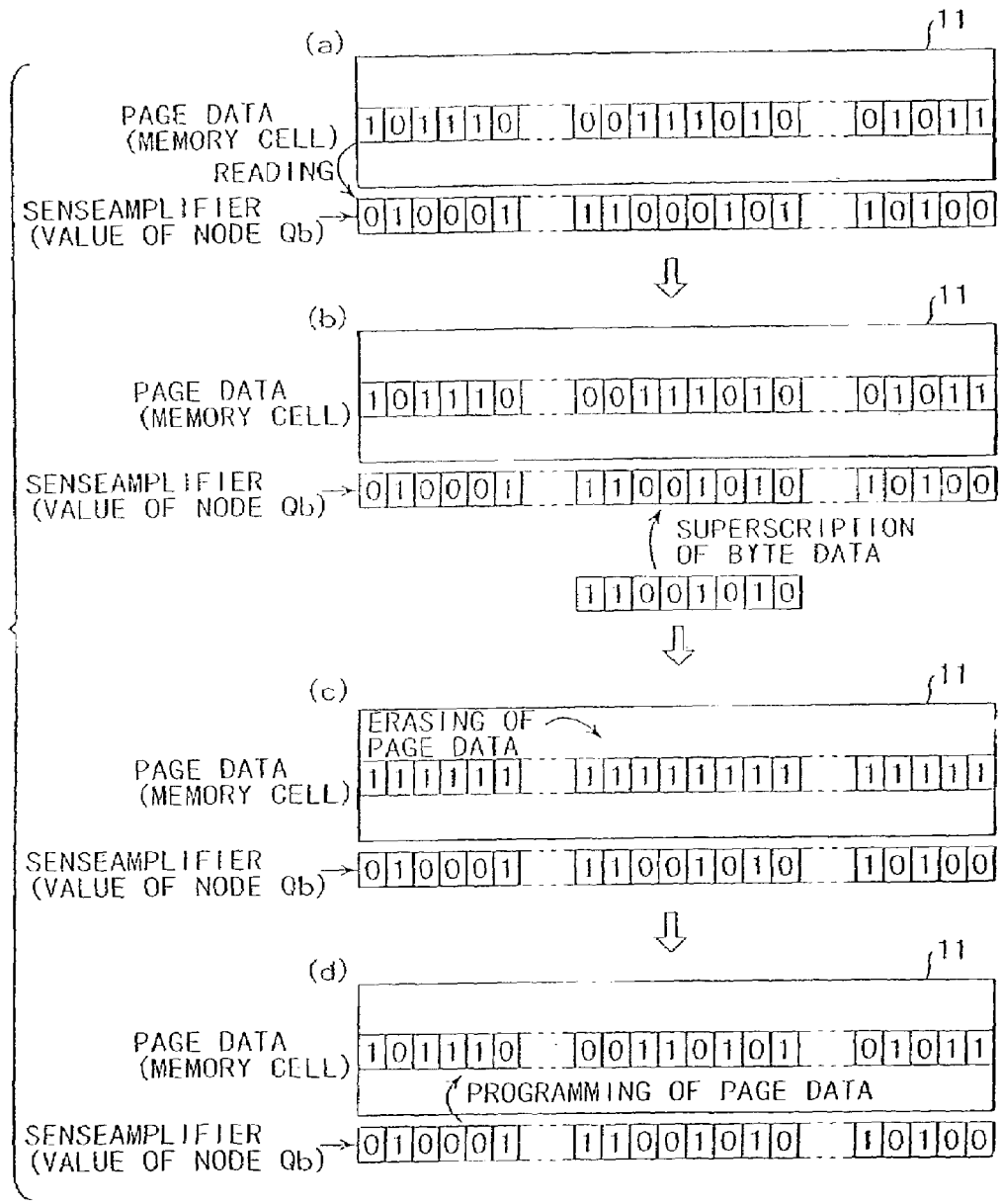
FIG. 60 is a view showing the states of a node Qb of the sense amplifier.

FIG. 60 shows the data of the selected memory cells and the states of the node Qb (FIG. 58) in the main processes in FIG. 59.

Shown at (a) in FIG. 60, a state wherein data of one page of the memory cells connected to the selected control gate line (word line) are read to the sense amplifiers (corresponding to step ST1).

When the data of a memory cell is at "0" (the threshold voltage is positive), the bit line BLi is not discharged and maintains the precharge potential. The sense node Nsense shown in FIG. 58 has the power supply potential VCC. When the control signal $\phi$L2 is at the power supply potential VCC, the node Q is at the ground potential VSS, i.e., "0".

When the data of a memory cell is at "1" (the threshold voltage is negative), the bit line BLi is discharged. The sense node Nsense shown in FIG. 58 has the ground potential VSS. When the control signal $\phi$L2 is at the power supply potential VCC, the node Q is at the power supply potential VCC, i.e., "1".

Shown at (b) in FIG. 60, a state wherein data is superscribed on byte data (8-bit data) designated by addresses in the data of one page latched by the sense amplifiers (corresponding to step ST2).

Shown at (c) in FIG. 60, a state wherein the data of the memory cells connected to the selected control gate line (word line) are erased (page erase) (corresponding to step ST3). The data of the memory cells connected to the selected control gate line are set at "1" by the page erase.

Shown at (d) in FIG. 60, a state wherein the data of one page latched by the sense amplifiers are programmed in the memory cells connected to the selected control gate line (word line) (corresponding to step ST6).

In the memory cell array 11, the data change operation for page data is performed. In fact, the data change operation for byte data is performed.

The read operation for the page program and program verify will be described next in detail with reference to the timing charts in FIGS. 61 to 63 with emphasis on the operation of the sense amplifier shown in FIG. 59.

Figure 61:
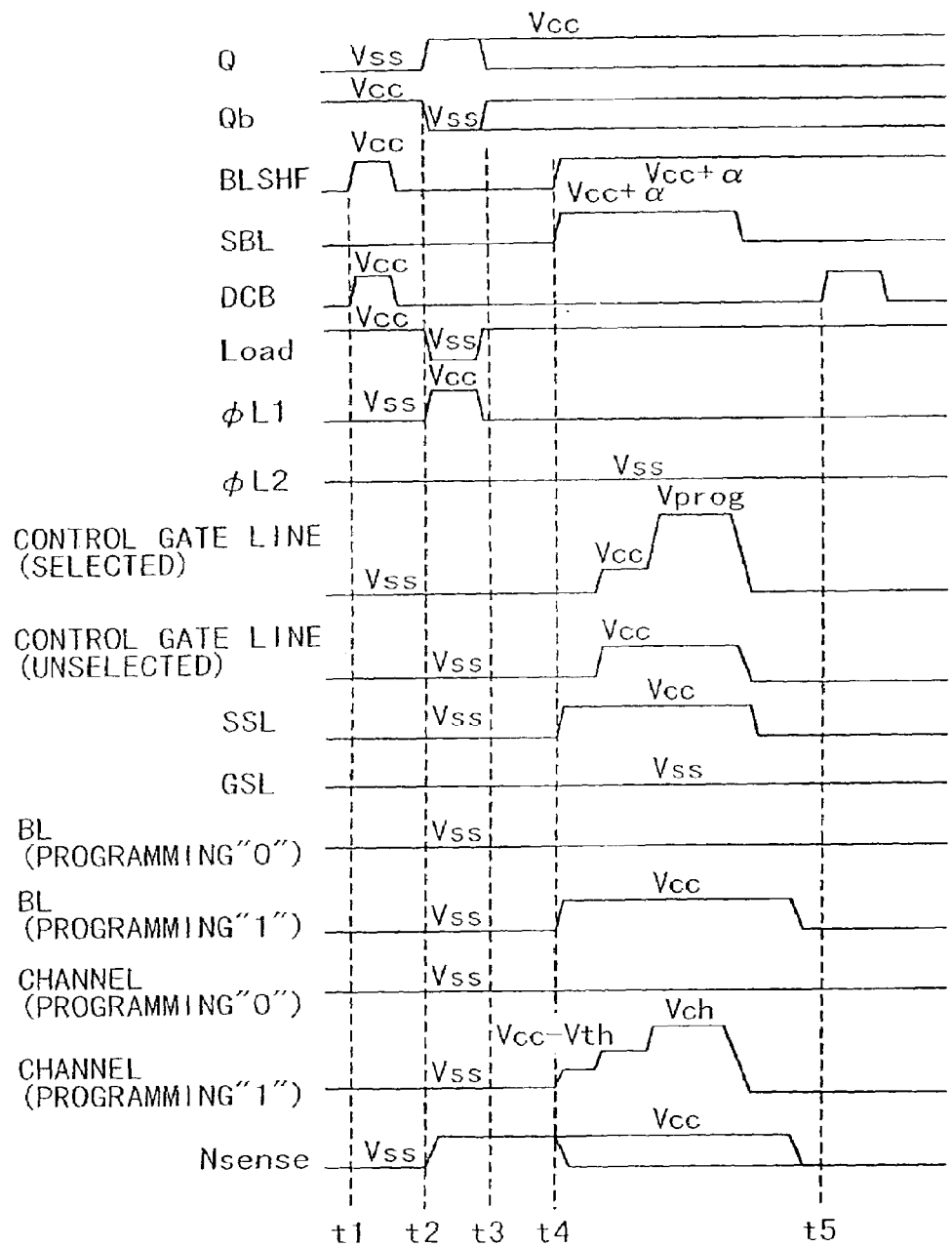
FIG. 61 is a timing chart showing the data change operation for page data of the present invention.
Figure 62:
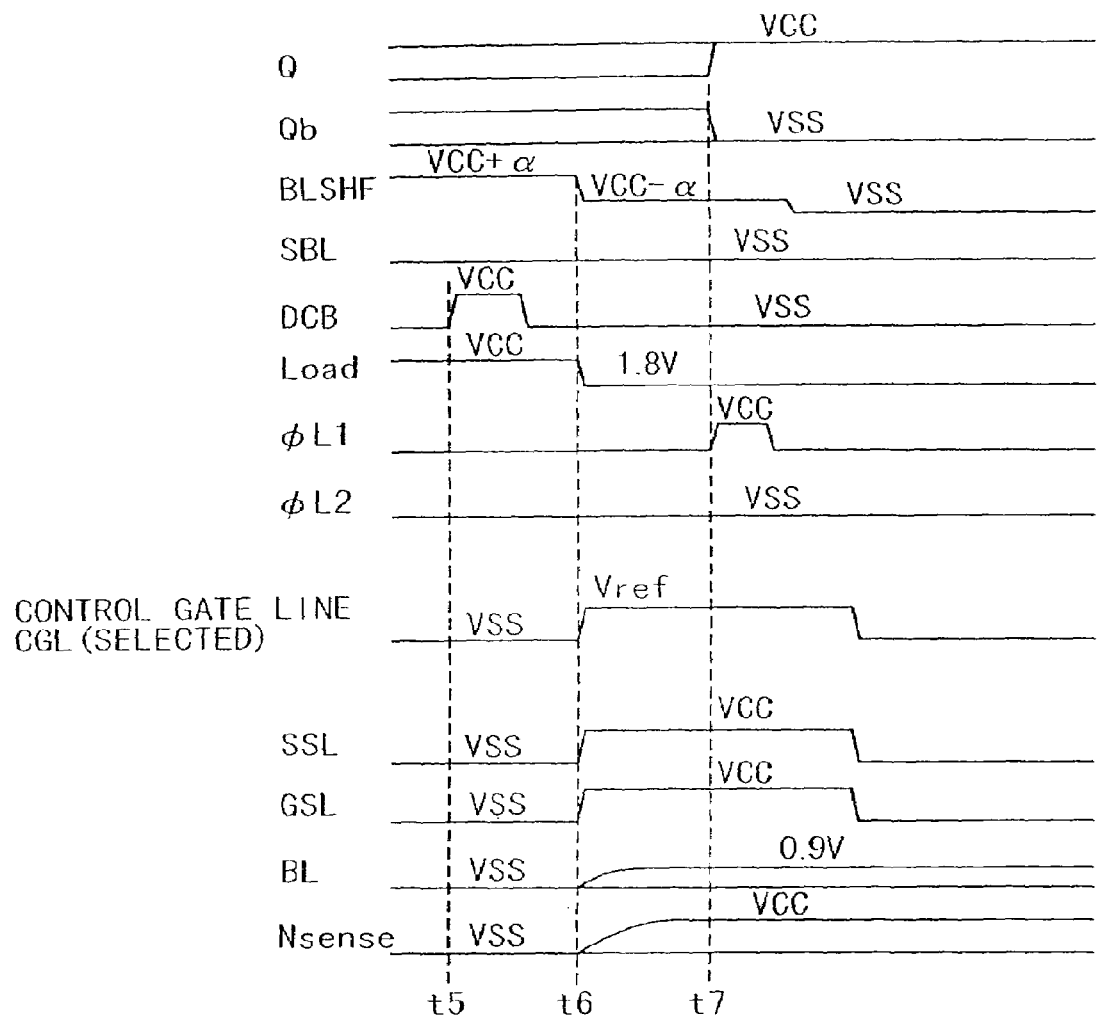
FIG. 62 is a timing chart showing the data change operation for page data of the present invention.
Figure 63:
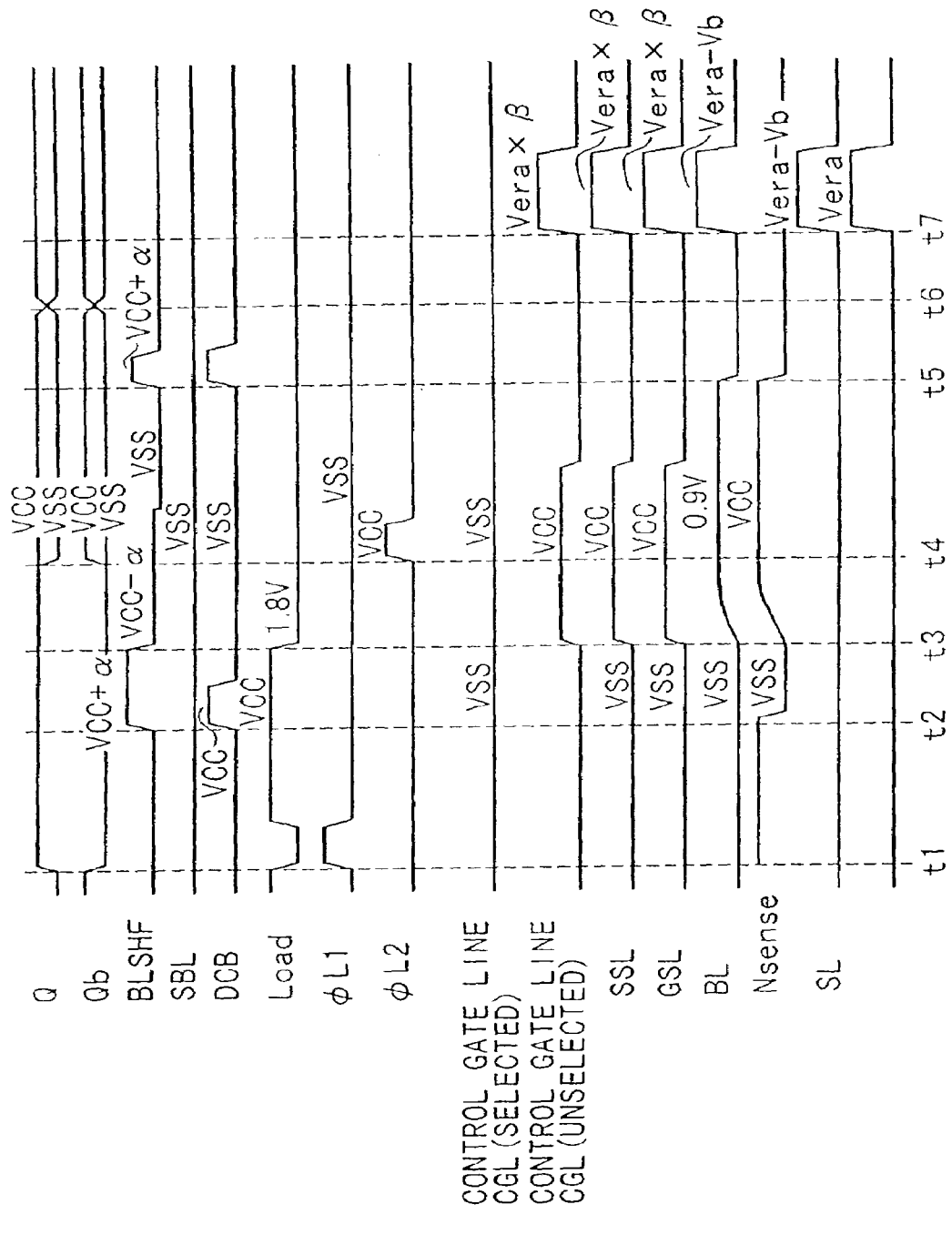
FIG. 63 is a timing chart showing the data change operation for byte data of the present invention.

FIGS. 61 to 63 show a plurality of divisions of one timing chart.

When a command for instructing programming is input from an external circuit to an internal circuit of the chip, the program operation is started.

To reset the sense node Nsense, the control signal DCB is set at the power supply potential VCC. The MOS transistor M3 is turned on to ground the sense node Nsense (t1).

The control signal BLSHF is also set at the power supply potential VCC together with the control signal DCB. The MOS transistor M1 is turned on to ground the bit line BLi.

Before program data are loaded to the sense amplifiers, the data latch control signal $\phi$L1 is set at the power supply potential VCC, and the precharge control signal Load is set at the ground potential VSS. The MOS transistors M5 and M7 are turned on to forcibly ground the latch node Qb of the latch circuit 21 and reset data. More specifically, in each of all sense amplifiers 20, the latch node Q of the latch circuit 21 is set at the power supply potential VCC, and the latch node Qb is set at the ground potential VSS (t2).

The program data are loaded from the I/O line and latched by the latch circuits 21 of the sense amplifiers 20. The nodes Q and Qb are set at "H" or "L" level in accordance with the loaded data (t3).

More specifically, in the latch circuit 21 of a sense amplifier corresponding to a memory cell for "0" programming, "L" level (=VSS) is applied to the latch node Q. In the latch circuit 21 of a sense amplifier corresponding to a memory cell for "1" programming (program inhibit), "H" level (=VCC) is applied to the latch node Q.

When the control signals BLSHF and SBL are at "H" level, charge of each bit line is started on the basis of the data latched by the latch circuit 21 of a corresponding sense amplifier 20 (t4).

More specifically, the bit line BLi connected to a memory cell for "0" programming is set at the ground potential VSS. The bit line connected to a memory cell for "1" programming (program inhibit) is charged to the power supply potential VCC. The selected control gate line (word line) is set at the program voltage Vprog (about 20V). At this time, the unselected control gate line (word line) is set not at the potential Vpass (e.g., 8V) but at the power supply potential VCC (e.g., 3.3V) or the read potential Vread (e.g., 4.5V) to be applied to the unselected memory cell in the read.

With this operation, the memory cells of one page are programmed.

After the data program is ended, the program verify is started to verify whether the data program is completely performed.

The program verify read is performed. This verify read operation is the same as the normal read operation.

When the control signal DCB is set at the power supply potential VCC, the MOS transistor M3 is turned on to forcibly ground the sense node Nsense (t5).

The reference potential Vref (about 0.5V) is applied to the selected control gate line CGL. The read potential Vread (e.g., 4.5V) for keeping a memory cell on regardless of the data stored in the memory cell is applied to the unselected control gate line CGL. The power supply potential VCC is applied to the select gate lines SSL and GSL. The verify read is started (t6).

For the read, bit line precharge sensing scheme or current detection sensing scheme can be used. In the bit line precharge sensing scheme, the bit line BLi is precharged and floated, and then, the potential of the bit line is maintained or dropped in accordance with data of a memory cell. The current detection sensing scheme will be described below in detail.

At time t6, the control signal BLSHF is clamped from the boosted potential VCC+$\alpha$ to the potential VCC−$\alpha$. Data is read on the basis of the balance between the memory cell current flowing to the MOS transistor Ml and the current of the MOS transistor M2 for charging the sense node Nsense. When the potential of the bit line BLi increases to, e.g., 0.9V, the MOS transistor M1 is cut off, and the sense node Nsense is set at the power supply potential VCC.

After the sense node Nsense is at "H" level (=VCC), the latch control signal $\phi$L1 is set at the power supply potential VCC to turn on the MOS transistor M5 (t7). When the sense node Nsense is at the power supply potential VCC (in a sense amplifier connected to a memory cell having a threshold voltage higher than the verify potential Vref), the MOS transistor M7 is turned on to set the latch node Qb at the ground potential VSS and the latch node Q at the power supply potential VCC.

When the ground potential VSS is loaded to the latch node Q, and programming is properly performed, the latch data of the latch circuit 21 is inverted. If programming in the memory cell is insufficient, the sense node Nsense remains "L" level (=VSS) in the verify read. For this reason, the data of the latch circuit 21 is not inverted, and the latch node Q keeps the ground potential VSS. In a sense amplifier connected to a program inhibit memory cell, the latch node Q is at the power supply potential VCC, and no data inversion occurs.

When a memory cell is insufficiently programmed, i.e., when data of the latch circuit 21 of a sense amplifier is not inverted, programming and verify read are repeated. When the potentials of the latch nodes Q of all sense amplifiers of one page are set at the power supply potential VCC, programming is ended.

The data change operation for byte data will be described next in detail with reference to the timing chart shown in FIG. 63 with emphasis on the operation of the sense amplifier shown in FIG. 58.

When a command for instructing the byte data change mode is input from an external circuit to an internal circuit of the chip, the data change operation for byte data starts.

A read of data already programmed in memory cells of one page, which are connected to the selected control gate line (word line), is started.

The read operation is the same as the read operation.

The data latch control signal φL1 is set at the power supply potential VCC, and the precharge control signal Load is set at the ground potential VSS. The MOS transistors M5 and M7 are turned on to forcibly ground the latch node Qb of each latch circuit 21 and reset the data. More specifically, in each of the sense amplifiers, the latch node Q of the latch circuit 21 is set at the power supply potential VCC, and the latch node Qb is set at the ground potential VSS (t1).

The control signal DCB is set at the power supply potential VCC. The MOS transistor M3 is turned on to forcibly ground the sense node Nsense (t2). When the ground potential VSS (=0V) is applied to the selected control gate line CGL, and the power supply potential VCC is applied to the select gate lines SSL and GSL, the read is performed (t3).

After the sense node Nsense is at "H" level (=VCC), the latch control signal φL2 is set at the power supply potential VCC to turn on the MOS transistor M6 (t4). When the sense node Nsense is at the power supply potential VCC (i.e., in a sense amplifier connected to a memory cell having data "0" and a threshold voltage higher than the ground potential VSS), the MOS transistor M7 is turned on to set the latch node Q at the ground potential VSS and the latch node Qb at the power supply potential VCC.

Next, the control signal DCB is set at the power supply potential VCC, and the control signal BLSHF is set at the power supply potential VCC or the potential VCC +α to reset the bit line BLi and sense node Nsense (t5).

After this, byte data is loaded to the latch circuit 21 of the sense amplifier 20 designated by a column address. The nodes Q and Qb are set at "H" or "L" level in accordance with the byte data (t6).

The byte data input from the external circuit of the chip is superscribed on predetermined data of page data programmed in the latch circuit 21.

After this, the page erase operation is performed for the memory cells connected to the selected control gate line.

The control gate line of the selected block is set at the ground potential VSS. The control gate lines of unselected blocks and all select gate lines are set in the floating state. When the erase voltage Vera is applied to the cell P-well, the select gate lines and the control gate lines of the unselected blocks, which are in the floating state, are boosted to Vera×β (β is the coupling ratio) by the capacitive coupling with the cell P-well.

The bit line BLi and cell source line SL are connected to the N$^+$-type layer in the cell P-well. When the p-n junction between the N$^+$-type layer and cell P-well is forward-biased, the bit line BLi and cell source line SL are charged to Vera-Vb (t7). Vb is the built-in potential of the p-n junction.

After this, the erase verify is performed to confirm that all the memory cells of the selected page are in the erase state, i.e., the threshold voltage of each memory cell becomes negative. On the basis of the data stored in the latch circuit 21, the program operation and program verify operation are performed for each memory cell of the selected page.

The operation after the erase verify is not illustrated in FIG. 63.

Figure 64:
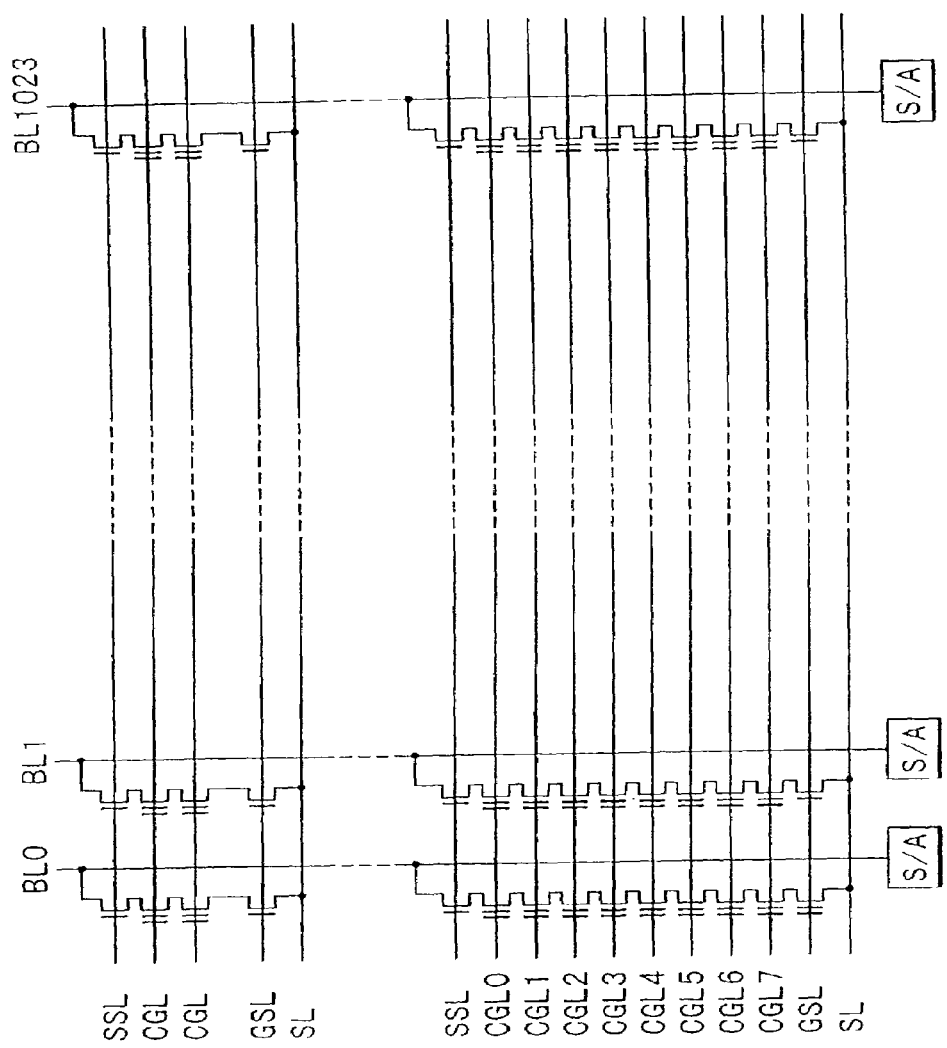
FIG. 64 is a view showing a modification of the memory cell array of the byte EEPROM of the present invention.

FIG. 64 shows an example in which a NAND flash EEPROM partially has the memory cell array of the byte EEPROM of the present invention.

The byte EEPROM of the present invention can be regarded as a NAND flash EEPROM whose memory cell array has two memory cells between two select transistors. Hence, the EEPROM of this example can be easily realized.

In the EEPROM of this example, memory cell units of two types with different structures are connected to one bit line BLi. More specifically, the first memory cell unit has a plurality of (e.g., 8, 16, or 32) memory cells connected between two select transistors. The second memory cell unit has two memory cells connected between two select transistors.

To select a control gate line (word line), a drive circuit may be prepared for each of the first and second memory cell unit regions. If possible, the two regions may share one drive circuit.

This arrangement allows the data change operation for byte data in part of the memory cell array.

The memory cell array of an AND flash EEPROM or DINOR flash EEPROM may be employed in place of the memory cell array of the NAND flash EEPROM shown in FIG. 64.

As has been described above, according to the byte EEPROM of the present invention, (1) since the memory cell unit is formed from one stacked-type memory cell sandwiched by two select transistor, the memory can be formed by the same process as that of the flash EEPROM, use the same data change method as that of the flash EEPROM, and perform the data change operation for byte data.

In addition, (2) when not the potential Vpass but the power supply potential VCC or potential Vread is applied to the control gate of an unselected memory cell in the program mode, and the memory cell unit is formed from a plurality of (e.g., two) stacked memory cells sandwiched by two select transistors, an effect for reducing the size per memory cell can be obtained in addition to the above-described effects.

Table 7 shows comparison between the effects of the conventional NAND flash EEPROM and those of the byte EEPROM of the present invention.

TABLE 7

| Cell Unit Structure | Prior Art | Present Invention | |
|---|---|---|---|
| | NAND Type | 3-tr Type | 4-tr Type |
| Batch Programming (no verify is required) | X | ○ | X |
| Data Change Operation for Page Data (byte data) | X | ○ | ○ |
| Read Current | X | ○ | Δ |
| Read Retention (data holding characteristics) | X | ○ | X |
| Number of Data Change Operations (endurance characteristics) | ○ | ○*1 | ○*1 |
| Disturbance in Program Mode (programming error) | X*2 | ○ | ○*3 |
| Cell Size | ○ (1) | X*4 (3.5) | Δ (2.2) |

○: Good or excellent
X: Fair
Δ: Failure or bad
*1 When sub control gate driver is used
*2 Vprog is applied to unselected word line in selected block
*3 VCC or Vread is applied to unselected word line in selected block
*4 ○ relative to conventional byte EEPROM Furthermore, according to the byte EEPROM of the present invention, (3) since the memory cell array is formed from a plurality of blocks arranged in a matrix, and the read, erase, and program operations are performed in units of blocks, the substantial program/erase endurance characteristics are not degraded even in the data change operation for byte data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A nonvolatile semiconductor memory comprising:
a memory cell unit having a memory cell and first and second select transistors sandwiching the memory cell, wherein the memory cell and the first and second select transistors are connected in series and the memory cell has a stacked gate structure having a floating gate and a control gate;
a bit line connected to the first select transistor;
a cell source line connected to a source of the second select transistor;
a select gate line connected to a gate of the second select transistor; and
a control circuit which controls a program operation, wherein when the program operation is executed on the memory cell, the cell source line is set to have a first potential and the select gate line is set to have a second potential less than the first potential.

2. The nonvolatile semiconductor memory according to claim 1,
wherein the first potential is a power supply potential and the second potential is 0 V.

3. The nonvolatile semiconductor memory according to claim 1,
wherein each of the first and second select transistors has the same structure as the memory cell.

4. The nonvolatile semiconductor memory according to claim 1,
wherein one of byte data, page data and NAND block data is written to the memory cell array when the program operation is executed.

* * * * *